United States Patent
Ray

(10) Patent No.: US 11,061,126 B2
(45) Date of Patent: Jul. 13, 2021

(54) COOPERATIVE FREQUENCY-MODULATED CONTINUOUS-WAVEFORM RADAR SYSTEMS

(71) Applicant: The Boeing Company, Chicago, IL (US)

(72) Inventor: Gary A. Ray, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 366 days.

(21) Appl. No.: 16/364,868

(22) Filed: Mar. 26, 2019

(65) Prior Publication Data
US 2020/0309933 A1 Oct. 1, 2020

(51) Int. Cl.
*G01S 13/28* (2006.01)
*G01S 13/24* (2006.01)
(Continued)

(52) U.S. Cl.
CPC .......... *G01S 13/282* (2013.01); *G01S 13/24* (2013.01); *H03D 3/007* (2013.01); *H03D 7/166* (2013.01);
(Continued)

(58) Field of Classification Search
CPC ...... H04B 1/16; H04B 1/1018; H04B 1/1036; H04B 1/18; H04B 2001/1063; H04B 1/10; H04B 1/1081; H04B 1/12; H04B 1/14; H04B 1/38; H04B 2001/6912; H04B 17/27; H04B 1/1027; H04B 17/104; H04B 1/04; H04B 1/715; H04B 10/5563; H04B 17/345; H04B 1/0053; H04B 1/0475; H04B 1/109; H04B 1/7097; H04B 1/713; H04B 2001/6904; H04W 4/029; H04W 64/00; H04W 4/02; H04W 4/024; H04W 64/006;
(Continued)

(56) References Cited

U.S. PATENT DOCUMENTS 6,191,649 B1    2/2001 Sugita et al.
6,310,513 B1    10/2001 Iemura
(Continued)

FOREIGN PATENT DOCUMENTS

WO    WO-2019215734 A1 * 11/2019 ............... G01S 7/35

OTHER PUBLICATIONS

S. Y. Nusenu, "OFDM Chirp Radar Target Detection and Adaptive Design in Clutter Environment," 2018, IEEE 7th International Conference on Adaptive Science & Technology, doi: 10.1109/ICASTECH.2018.8506724, pp. 1-7. (Year: 2018).*
(Continued)

*Primary Examiner* — Lana N Le
(74) *Attorney, Agent, or Firm* — Ostrager Chong Flaherty & Broitman P.C.

(57) ABSTRACT

A system and a method that enable two or more dispersed platforms to simultaneously use respective frequency-modulated continuous-wave radar systems in a typical radar application such as synthetic-aperture radar for terrain mapping, moving-target indicator radar to track targets on the ground and air-to-air tracking of other aircraft. The systems use the same RF spectrum in their operation and also communicate through their respective radar systems while simultaneously reducing their interplatform interference through the use of both filters and coded waveforms.

20 Claims, 28 Drawing Sheets

(51) Int. Cl.
*H04L 27/38* (2006.01)
*H04B 1/10* (2006.01)
*H04B 1/16* (2006.01)
*H03D 3/00* (2006.01)
*H04L 27/227* (2006.01)
*H03D 7/16* (2006.01)
*H04L 27/00* (2006.01)

(52) U.S. Cl.
CPC .............. *H04B 1/10* (2013.01); *H04B 1/16* (2013.01); *H04L 27/2273* (2013.01); *H04L 27/3863* (2013.01); *H04L 2027/0067* (2013.01)

(58) Field of Classification Search
CPC .............. H04W 4/023; H04W 64/003; H04W 56/0065; G01S 5/02955; G01S 5/02528; G01S 5/0295; G01S 5/0269; G01S 5/01; G01S 13/282; G01S 13/24; G01S 13/345; G01S 13/86; G01S 7/006; G01S 13/34; G01S 5/0215; G01S 5/0284; G01S 2013/0245; G01S 7/2955; G01S 7/4811; G01S 7/4815; G01S 7/4911; G01S 7/52077; G01S 7/54; H04L 27/2273; H04L 27/3863; H04L 2027/0067; H03D 3/007; H03D 7/166
See application file for complete search history.

(56) References Cited

U.S. PATENT DOCUMENTS

| | | | |
|---|---|---|---|
| 6,459,742 B1 | 10/2002 | Marque-Pucheu et al. | |
| 6,573,982 B1* | 6/2003 | Pruitt | G01S 17/26 356/5.01 |
| 6,965,341 B1 | 11/2005 | Cho et al. | |
| 7,068,704 B1* | 6/2006 | Orr | H04W 64/00 455/456.6 |
| 7,224,716 B2* | 5/2007 | Roman | H04B 1/69 455/552.1 |
| 7,376,688 B1 | 5/2008 | von der Embse | |
| 7,379,013 B2 | 5/2008 | Dean et al. | |
| 7,978,123 B2 | 7/2011 | Lam et al. | |
| 8,786,489 B2 | 7/2014 | Patrick | |
| 9,325,545 B2 | 4/2016 | Ray | |
| 9,645,228 B1* | 5/2017 | Doerry | G01S 7/282 |
| 9,778,355 B2 | 10/2017 | Li et al. | |
| 10,634,763 B2* | 4/2020 | Guy | H04B 1/713 |
| 2006/0140249 A1* | 6/2006 | Kohno | H04B 1/7172 455/63.1 |
| 2009/0180518 A1* | 7/2009 | Ishii | H04B 1/7172 455/296 |
| 2011/0122014 A1* | 5/2011 | Szajnowski | G01S 13/26 342/109 |
| 2013/0009806 A1* | 1/2013 | Newman | G01S 13/282 342/25 A |
| 2015/0276929 A1* | 10/2015 | Li | G01S 13/347 342/112 |
| 2017/0310758 A1 | 10/2017 | Davis et al. | |
| 2018/0045819 A1* | 2/2018 | Cornic | G01S 13/36 |
| 2018/0095161 A1* | 4/2018 | Kellum | H04B 7/086 |
| 2019/0086531 A1* | 3/2019 | Rick | H04B 1/69 |
| 2019/0285722 A1* | 9/2019 | Markhovsky | H04W 64/006 455/456.6 |
| 2019/0377075 A1* | 12/2019 | Tsfati | H04B 17/27 |
| 2020/0033442 A1* | 1/2020 | Gulati | H04B 2001/6912 455/296 |
| 2021/0011156 A1* | 1/2021 | Mody | H04B 1/69 455/296 |
| 2021/0055734 A1* | 2/2021 | Yokev | H04B 1/16 455/313 |

OTHER PUBLICATIONS

G. N. Saddik, R. S. Singh and E. R. Brown, "Ultra-Wideband Multifunctional Communications/Radar System", Jul. 2007, IEEE Transactions on Microwave Theory and Techniques, vol. 55, No. 7, doi: 10.1109/TMTT.2007.900343, pp. 1431-1437. (Year: 2007).*

Rohling and Meinecke, "Waveform Design Principles for Automotive Radar Systems", in: 2001 CIE Int'l Conf. on Radar, 2001.

Rohling and Moller, "Radar Waveform for Automotive Radar Systems and Applications", in: 2008 IEEE Radar Conf., May 26-30, 2008.

Djuric and Kay, "Parameter Estimation of Chirp Signals", IEEE Trans. on Acoustics, Speech and Signal Processing, vol. 38, No. 12, Dec. 1990, pp. 2118-2126.

Wu and Linnartz, "Detection Performance Improvement of FMCW Radar Using Frequency Shift", Symposium on Information Theory and Signal Processing in the Benelux, Brussels, Belgium, May 10-11, 2011.

Peacock and Santhanam, "Multicomponent Subspace Chirp Parameter Estimation Using Discrete Fractional Fourier Analysis", Proc. of the IASTED Int'l Conf., Dec. 14-16, 2011, Dallas, USA.

Parrish, An Overview of FMCW Systems in MATLAB, EE 383V Radar Principles Term Project, Texas Instruments Inc.

Sit et al., "The OFDM Joint Radar-Communication System: An Overview", Spacomm 2011, The Third Int'l Conf. on Adv. in Satellite and Space Communications.

Bancroft, "An Algebraic Solution to the GPS Equations", IEEE Trans. Aero. and Elect. Systems, vol. AES-21, No. 7, Jan. 1985, pp. 56-59.

Krause, "A Direct Solution to GPS-Type Navigation Equations", IEEE Trans. Aero. and Elect. Systems, vol. AES-23, No. 2, Jan. 1987, pp. 225-232.

Dutta et al., "Towards Radar-Enabled Sensor Networks," Proc. Fifth Int'l Conf. Information Processing in Sensor Networks, pp. 467-474, Apr. 2006.

Liang et al., "Design and Analysis of Distributed Radar Sensor Networks", IEEE Trans. on Parallel and Distributed Systems, vol. 22, No. 11, Nov. 2011, pp. 1926-1933.

* cited by examiner

COOPERATIVE FREQUENCY-MODULATED CONTINUOUS-WAVEFORM RADAR SYSTEMS

BACKGROUND

The technology disclosed herein generally relates to systems and methods for performing combined radar and communications functions. The technology disclosed herein also relates to systems and methods for positioning, navigation and timing and to distributive collaborative radar systems.

The Global Positioning System (GPS) is a satellite-based radionavigation system that provides geolocation and time information to a GPS receiver anywhere on or near the Earth where there is an unobstructed line of sight to four or more GPS satellites. Many sectors of the U.S. economy (such as telecommunications, energy, finance and transportation) rely on GPS for positioning, navigation and timing. However, GPS can fail, which failure can have detrimental consequences. Concern for the country's reliance on GPS has been growing among industry and government workers for many years, especially as the dependency on GPS has grown across industries. This has led to a number of industries (commercial and military) being highly vulnerable to any GPS failure.

Three approaches are typically used to mitigate GPS failure. The first is to interoperate with other global navigation satellite systems. However, these are also subject to the same failure mechanisms as GPS (such as space weather) and are controlled by other governments. The second approach is for everyone to use better clocks. For example, chip-scale atomic clocks the size of a penny are a promising new technology that can hold time for about a day, but are currently too expensive to deploy widely. Also, long-term synchronization is often still required. The third approach is to use ground-based timing and position signals such as the eLORAN system, but this system is only available in limited locations.

It would be desirable to provide a system and a method that solves the problem of determining time and position information in a radionavigation system without the use of a satellite-based positioning system. Previous solutions required separate time transfer and position determination hardware for operation during GPS outages on all platforms. These solutions also must use separate signaling frequencies and/or times for such operation. In particular, it would be desirable to enable time transfer and position determination services during operation of a combined radar and communications system (hereinafter "combined radar/communications system").

Distributive collaborative radar systems use cooperating platforms or nodes that operate together to solve a much more complex problem than individual radar systems could accomplish operating independently. For example, current weather radar systems are fundamentally constrained in sensitivity, resolution, and lower atmosphere coverage and lack the capability to trace and track the storm cells in an adaptive and dynamic manner, especially for small-scale, high-impact events such as tornadoes. By using distributed collaborative adaptive sensing networks, these constraints can be overcome. In particular, a large number of small radar systems can address these limitations, provided that the individual radar systems are able to collaborate in their sensing of weather events.

For another example, current distributed radar systems, including statistical multi-input multi-output (MIMO) and passive radar systems, have potential capabilities to enhance detection, target characterization and area coverage. (MIMO radar systems transmit mutually orthogonal signals from multiple transmit antennas, and these waveforms are extracted from each of multiple receive antennas by a set of matched filters.) In one canonical example, networks of multiple distributed radar sensors can be utilized to survey a large area and observe targets from a number of different angles. In addition to spatial diversity, other problems such as fluctuating targets and blind speed problems can also be addressed.

The above-described performance advantages come with attendant issues—such as hardware cost, resource management and algorithm design—that need to be resolved in order to make such distributed radar systems practical. Moreover, if standard waveforms were used for simultaneous dispersed multiplatform FMCW radar, the interference between platforms would be unacceptably high. Existing solutions require operating on different radiofrequency (RF) bands if the platforms are within range of each other's sidelobe transmissions or ground bounce returns. Also, previous solutions do not allow simultaneous dispersed multiplatform FMCW radar operation as well as simultaneous radar and communications using the same waveform.

SUMMARY

The subject matter disclosed in detail below is directed to a system and a method that enable time transfer and position determination services during operation of a combined radar/communications system. In the combined radar/communications system, a single waveform is used to achieve both efficient radar and efficient communications functions. This waveform will be referred to in this disclosure as a combined radar/communications waveform (CRCW) and is based on a frequency-modulated continuous waveform (FMCW). This CRCW is part of a combined radar/communications function that can be implemented using a common antenna, common power and common location on a ground vehicle, an aircraft, a satellite, a submarine or other mobile platform to provide both types of functions.

The technology proposed herein allows the broadcasting of a CRCW signal that any system receiving it can use to synchronize system clocks to the set of master clocks among a selected subset of transmitting platforms. This broadcast signal can occur during both radar and communications operations. In addition, with three or more mobile or fixed platforms broadcasting the signal, any one receiving the signal can also derive position information without the use of standard satellite positioning systems. The system includes hardware configured to perform both radar and communications functions, which enables usage of common antennas, common power and common space on size-, weight- and power-constrained platforms such as ground vehicles, aircraft, satellites, submarines and other mobile platforms.

The system includes transmitting platforms of the above-described type which further include means for providing time transfer and position determination service to every receiver in the network. The time transfer and position determination service can operate at the same time as operation of both radar and communications functions. The broadcast information is derived from internal time and position information as determined by the individual transmitting platforms. These transmitting platforms are equipped with high-quality clocks and navigation systems and serve as the source for correct time and position for all other platforms within their communications area. In particular, the time and position information is added to a communications signal during simultaneous radar and communications operations to support any operational arena when the system is enabled. This will allow a small set of such enabled platforms to transfer both accurate time and accurate position to all other platforms within radiofrequency (RF) range. Note that adding timing and position information applies to combined radar and communications systems with either fixed or steerable antennas. (For example, the antennas may be phased-array antennas which are steerable electronically using beamforming.) The time transfer and position determination service disclosed herein can operate at much lower signal-to-noise levels (i.e., at much greater ranges) than the communications functions. Platforms can easily join or leave the timing and position network due to operation on different frequencies. Further improvements in signal coverage can be achieved by an addition to the basic system which applies angle jitter to the beams in order to increase the range of the timing and position broadcasts (referred to hereinafter as "intentional beam jitter").

Although various embodiments of systems and methods for enabling time transfer and position determination in a combined radar/communications system will be described in some detail below, one or more of those embodiments may be characterized by one or more of the following aspects.

One aspect of the subject matter disclosed in some detail below is a combined radar/communications system comprising a common radar/communications transmitter having a transmission antenna and a combined radar and communications receiver having a common reception antenna, wherein the common radar/communications transmitter is configured to transmit frequency-modulated continuous-wave signals representing packets of data, the data in each packet including payload sections made up of multiple symbols and timing header/position prediction slots made up of multiple supersymbols, wherein the payload sections and timing header/position prediction slots alternate in sequence within the packet, and each timing header/position prediction slot includes a respective timing header and a respective position prediction section which is contiguous with the respective timing header. Each symbol consists of an up chirp and a down chirp, and each supersymbol consists of a concatenation of pairs of up chirps and down chirps of equal chirp lengths, the up chirps of the concatenation having the same up phase and the down chirps of the concatenation having the same down phase. The supersymbols in timing headers of the timing header/position prediction slots are phase encoded with time information indicating a duration of time for which a prediction of the position of the combined radar/communications system was valid; and the supersymbols in position prediction sections of the timing header/position prediction slots are phase encoded with position information indicating the prediction of the position of the combined radar/communications system.

In accordance with one embodiment of the combined radar/communications system described in the immediately preceding paragraph, the up and down phases of the supersymbols in each position prediction section in a packet are varied from one position prediction section to a next position prediction section to represent respective position predictions for the combined radar/communications system which were valid for respective durations of the respective contiguous timing headers. The up and down phases of the supersymbols in each timing header in a packet are varied from one timing header to a next timing header to represent the respective durations of time for which the respective position predictions were valid. A position prediction is associated with a timing header in each timing header/position prediction slot, the combined information providing a predicted position of the combined radar/communications system which was valid for the duration of the timing header transmission.

In accordance with some embodiments, the combined radar/communications system further comprises: a beam steering controller configured to control a direction in which the transmission antenna transmits signals in response to receipt of a command representing a steering angle; and a beam jitter system configured to generate the command by summing a signal representing a jitter angle to a signal representing a commanded steering angle. The beam jitter system is further configured to generate successive commands by summing respective signals representing respective jitter angles of a jitter angle sequence to the signal representing the commanded steering angle.

In accordance with some embodiments, the combined radar/communications system further comprises: a timing correlation module which is configured to extract timing information from respective timing headers in packets received from at least three transmitting platforms using correlation; a position demodulation module which is configured to extract position information from respective position predictions in the packets received from the at least three transmitting platforms using demodulation; and a time and position calculation module which is configured to compute the local position and time offset of the combined radar/communications system using the timing and position information received from the at least three transmitting platforms. The local position data is included in the packet of data transmitted by the common radar/communications transmitter. The time offset is used to adjust a local clock.

Another aspect of the subject matter disclosed in some detail below is a method for determining a position of a mobile platform, comprising: receiving timing and position information from at least three transmitting platforms by way of a reception antenna onboard the mobile platform; and computing a local position and a time offset of the mobile platform using the timing and position information received from the at least three transmitting platforms, wherein the timing and position information is extracted from packets of data carried by frequency-modulated continuous-wave signals received from the at least three transmitting platforms, the data in each packet including payload sections made up of multiple symbols and timing header/position prediction slots made up of multiple supersymbols, wherein the payload sections and timing header/position prediction slots alternate in sequence within the packet, and each timing header/position prediction slot includes a respective timing header and a respective position prediction section which is contiguous with the respective timing header. This method may further comprise: computing a time offset of the mobile platform using the timing and position information received from the at least three transmitting platforms; and adjusting a local clock onboard the mobile platform using the time offset.

A further aspect of the subject matter disclosed in some detail below is a system for determining a position of a mobile platform, comprising a mobile platform and at least three transmitting platforms, wherein each of the at least three transmitting platforms comprises a common radar/communications transmitter having a transmission antenna configured to transmit combined radar/communications waveform-modulated signals representing packets of data, the data in each packet including payload sections made up of multiple symbols and timing header/position prediction slots made up of multiple supersymbols, wherein the payload sections and timing header/position prediction slots alternate in sequence within the packet, and each timing header/position prediction slot includes a respective timing header and a respective position prediction section which is contiguous with the respective timing header, and wherein the mobile platform comprises a combined radar and communications receiver having a common reception antenna, wherein the common radar/communications receiver is configured to: receive timing and position information from the at least three transmitting platforms by way of a reception antenna onboard the mobile platform and compute a local position of the mobile platform using the timing and position information received from the at least three transmitting platforms, wherein the timing and position information is extracted from packets of data carried by the frequency-modulated continuous-wave signals received from the at least three transmitting platforms. Each symbol consists of an up chirp and a down chirp, and each supersymbol consists of a concatenation of pairs of up chirps and down chirps of equal chirp lengths, the up chirps of the concatenation having the same up phase and the down chirps of the concatenation having the same down phase. The supersymbols in timing headers of the timing header/position prediction slots are phase encoded with time information indicating a duration of time for which a prediction of the position of the transmitting platform that transmitted the timing header/position prediction slot was valid; and the supersymbols in position prediction sections of the timing header/position prediction slots are phase encoded with position information indicating the prediction of the position of the transmitting platform that transmitted the timing header/position prediction slot.

Other aspects of systems and methods for enabling time transfer and position determination in a combined radar/communications system are disclosed below.

In addition, this disclosure addresses aspects of the algorithm design of a distributive collaborative radar system. More specifically, the subject matter disclosed in detail below is directed to a system and a method that enable two or more dispersed platforms to simultaneously use respective FMCW radar systems in a typical radar application such as synthetic-aperture radar for terrain mapping, moving-target indicator radar to track targets on the ground and air-to-air tracking of other aircraft. The systems disclosed herein use the same RF spectrum in their operation and also communicate through their respective radar systems while simultaneously reducing their interplatform interference through the use of time and frequency synchronization.

The distributive collaborative radar system disclosed herein solves the important problem of simultaneous FMCW radar operation across multiple dispersed platforms with enhanced sensitivity while using the same RF spectrum. Thus the radar systems do not have to occupy different RF bands in order to not interfere with each other. And the radar systems do not have to restrict their performance to a subset of their operational bandwidth, since they can all use the same full bandwidth. It also allows simultaneous communications across this network of radar platforms using the same transmitted signal.

Although various embodiments of systems and methods for enabling two or more dispersed platforms to simultaneously operate their respective FMCW radar systems using the same RF spectrum will be described in some detail below, one or more of those embodiments may be characterized by one or more of the following aspects.

One aspect of the subject matter disclosed in some detail below is a distributive collaborative radar network comprising first and second radar systems having synchronized respective clocks, wherein each of the first and second radar systems comprises a respective common radar/communications transmitter comprising a transmission antenna and a combined radar and communications receiver comprising a common reception antenna, a radar receiver connected to the common reception antenna and a communications receiver connected to the common reception antenna. The common radar/communications transmitters of the first and second radar systems are each configured to convert respective periodic time and position information into respective timing headers representing successive times and respective position prediction sections representing successive positions which are valid for those respective times in a respective packet of data and then transmit frequency-modulated continuous-wave signals representing the respective packet of data. The communications receivers of the first and second radar systems are each configured to extract timing and position information from received frequency-modulated continuous-wave signals and compute a respective local position and respective time offset using the timing and position information. The common radar/communications transmitter of the first radar system is further configured to transmit frequency-modulated continuous-wave signals having a first chirp slope and the common radar/communications transmitter of the second radar system is further configured to transmit frequency-modulated continuous-wave signals having a second chirp slope. The radar receiver of the first radar system is further configured to demodulate received frequency-modulated continuous-wave signals to form return signals and then filter out return signals having the second chirp slope when the second chirp slope is different than the first chirp slope. The radar receiver of the second radar system is further configured to demodulate received frequency-modulated continuous-wave signals to form return signals and then filter out return signals having the first chirp slope when the second chirp slope is different than the first chirp slope. In accordance with some embodiments, the radar receiver of the first radar system is further configured to filter out return signals derived from frequency-modulated continuous-wave signals received from beyond a maximum return distance; and the common radar/communications transmitter of the second radar system is further configured to transmit frequency-modulated continuous-wave signals having the second chirp slope with a start time delay equal to at least a time for the frequency-modulated continuous-wave signals having the second chirp slope to travel the maximum return distance of the radar receiver of the first radar system.

Another aspect of the subject matter disclosed in some detail below is a distributive collaborative radar network comprising first and second radar systems having synchronized respective clocks, wherein each of the first and second radar systems comprises a respective common radar/communications transmitter comprising a transmission antenna and a combined radar and communications receiver comprising a common reception antenna, a radar receiver connected to the common reception antenna and a communications receiver connected to the common reception antenna. The common radar/communications transmitters of the first and second radar systems are each configured to convert respective periodic time and position information into respective timing headers representing successive times and respective position prediction sections representing successive positions which are valid for those respective times in a respective packet of data and then transmit frequency-modulated continuous-wave signals representing the respective packet of data. The communications receiver of the first and second radar systems are each configured to extract timing and position information from received frequency-modulated continuous-wave signals and compute a respective local position and respective time offset using the timing and position information. The common radar/communications transmitter of the first radar system is further configured to transmit frequency-modulated continuous-wave signals having a first chirp slope. The radar receiver of the first radar system is further configured to filter out return signals derived from frequency-modulated continuous-wave signals received from beyond a maximum return distance. The common radar/communications transmitter of the second radar system is further configured to transmit frequency-modulated continuous-wave signals having a second chirp slope with a start time delay equal to at least a time for the frequency-modulated continuous-wave signals having the second chirp slope to travel the maximum return distance of the radar receiver of the first radar system. In accordance with some embodiments, the radar receiver of the first radar system is further configured to filter out return signals having the second chirp slope and the radar receiver of the second radar system is further configured to filter out return signals having the first chirp slope when the second chirp slope is different than the first chirp slope.

Yet another aspect is a method for reducing interference between radar systems of a distributive collaborative radar network, comprising: synchronizing first and second radar systems of a distributive collaborative radar network in time and frequency of transmission; transmitting frequency-modulated continuous-wave signals comprising symbols and supersymbols comprising respective position information from the first and second radar systems, wherein the first radar system transmits frequency-modulated continuous-wave signals having a first chirp slope and the second radar system transmits frequency-modulated continuous-wave signals having a second chirp slope; receiving at the first radar system frequency-modulated continuous-wave signals; mixing frequency-modulated continuous-wave signals received by the first radar system with frequency-modulated continuous-wave signals transmitted by the first radar system and outputting return signals; using a first demod/remod filter in the first radar system to filter out return signals having the second chirp slope when the second chirp slope is different than the first chirp slope and not filter out return signals having the second chirp slope when the second chirp slope is the same as the first chirp slope; and estimating a range and a velocity of a target object relative to the first radar system based on beat frequencies derived from the return signals not filtered out by the first demod/remod filter.

In accordance with some embodiments of the method described in the immediately preceding paragraph, the method further comprises: receiving at the second radar system frequency-modulated continuous-wave signals; mixing frequency-modulated continuous-wave signals received by the second radar system with frequency-modulated continuous-wave signals transmitted by the second radar system and outputting return signals; using a second demod/remod filter in the second radar system to filter out return signals having the first chirp slope when the second chirp slope is different than the first chirp slope and not filter out return signals having the first chirp slope when the second chirp slope is the same as the first chirp slope; and estimating a range and a velocity of a target object relative to the second radar system based on beat frequencies derived from the return signals not filtered out by the second demod/remod filter. In accordance with other embodiments, the method further comprises using high and low pass filters in the first radar system to filter out return signals derived from frequency-modulated continuous-wave signals received from beyond a maximum return distance, wherein the frequency-modulated continuous-wave signals transmitted by the second radar system have a start time delay equal to at least a time for the frequency-modulated continuous-wave signals having the second chirp slope to travel the maximum return distance of the radar receiver of the first radar system.

Other aspects of systems and methods for enabling two or more dispersed platforms to simultaneously operate their respective FMCW radar systems using the same RF spectrum are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects.

Reference will hereinafter be made to the drawings in which similar elements in different drawings bear the same reference numerals.

DETAILED DESCRIPTION

Figure 1:
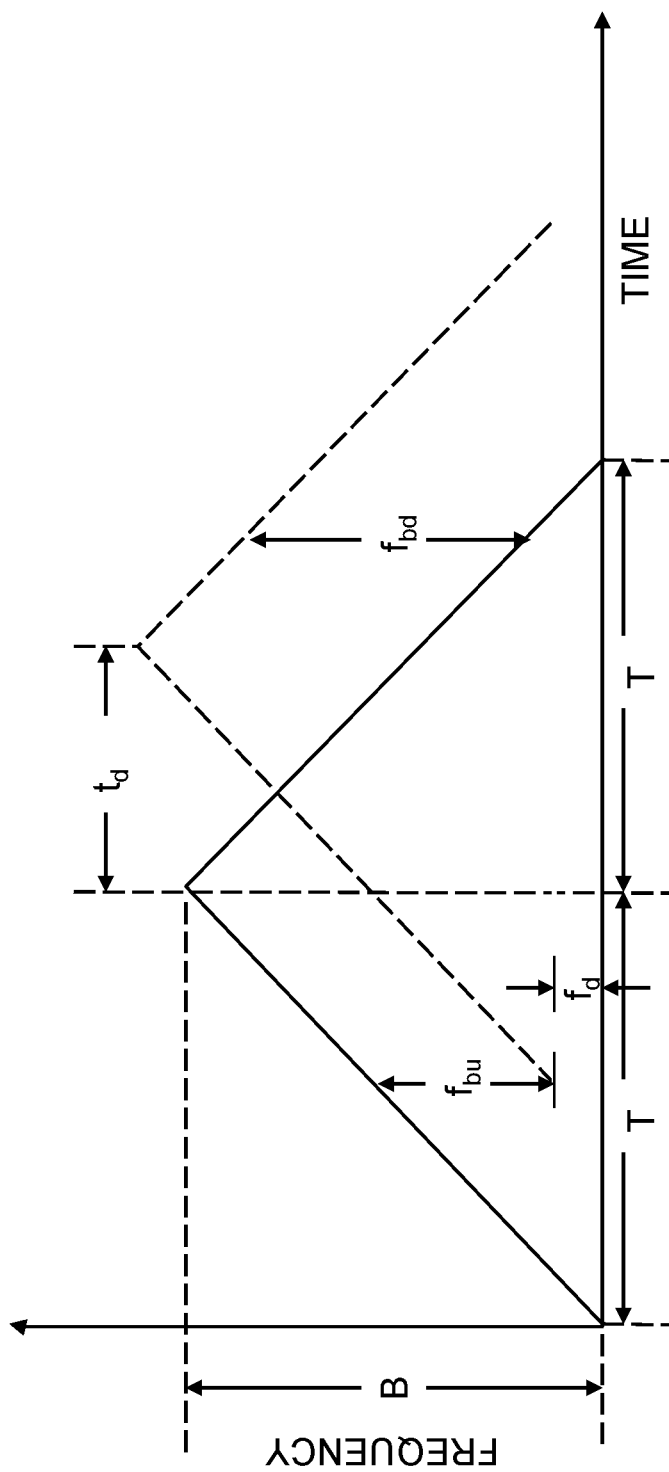
FIG. 1 is a graph representing received and transmitted frequencies of a triangular chirp waveform in which the up and down ramps have equal time durations. The solid lines represent the transmitted signal; the dashed lines represent the reflected and received signal.

Illustrative embodiments of systems and methods for enabling time transfer and position determination in a combined radar/communications system and for enabling two or more dispersed platforms to simultaneously operate their respective FMCW radar systems using the same RF spectrum are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Radar signals typically fall into two categories: pulsed signals and continuous signals. Pulsed signals are on for a short period of time and then turn off and wait for a returned echo. In contrast, FMCW radar typically uses a frequency-modulated continuous signal that bounces off the targets continuously and returns to the receiver. In particular, a linear frequency sweep is usually applied and the returned signal can be mixed with the transmitted signal to produce a single expected tone for each target return. This linear frequency sweep is also called a linear chirp or linear frequency-modulated signal. There are a number of advantages to using FMCW radar in comparison to pulsed radar.

The innovative technology disclosed herein enables time transfer and position determination services during operation of a combined radar/communications system. For example, the combined radar/communications system disclosed in U.S. patent application Ser. No. 15/988,112 uses a common set of programmable hardware and software to implement both radar and communications functions in a flexible manner so that one system can provide both of the required radar and communications performances.

The communications function disclosed herein uses digital modulation, in which changes in phase, magnitude and frequency are used to represent digital information. In a digital modulation scheme, each transmitted bit (or groups of bits) is mapped to a particular state of the carrier wave. As used herein, the term "symbol" means the state of the carrier, which is defined as having a specific phase, magnitude and frequency. The rate at which the carrier changes state from one symbol to the next is called the symbol rate.

Radar and communications system requirements force design choices with respect to the amount of signal power. The respective optimum signal strengths are described briefly below, emphasizing the differences. For a combined system, both signal strength criteria should be met.

A radar's principle of operation is based on the properties of electromagnetic waves and their characteristic reflection by different materials. First, a radio signal of frequency f and wavelength $\lambda=c/f$ is transmitted. Based on the reflected and received signal response, measurements regarding direction, distance, and relative velocity of the reflecting target can be made. The received signal strength of the target can be calculated from the radar equation:

$$P_r = \frac{P_t G_t A_r \sigma_S}{(4\pi)^2 R^4} \text{ with } A_r = \frac{G_r \lambda^2}{4\pi}$$

In the above expression, $P_r$ denotes the received signal strength, while $P_t$ represents the transmitted signal power. The antenna is characterized by its transmit and receive antenna gains $G_t$ and $G_r$ respectively as well as the corresponding effective aperture $A_r$ of the receiving antenna. $\sigma_s$ is the scattering cross section of the reflecting target which is located at the distance R. The received signal strength degrades with the fourth power of range. This is in contrast to general communication systems which only degrade with the second power of range. Thus, for the communications case, the power $P_c$ received by the communications receiver (at a range R from the transmitter, instead of co-located) has no reflection and only an $R^2$ loss, and may be expressed as $$P_c = \frac{P_t G_t A_c}{4\pi R^2} \text{ with } A_c = \frac{G_c \lambda^2}{4\pi}$$

where $A_c$ is the aperture of the receiving communications antenna with its associated gain $G_c$. Therefore, the radar receiver has to provide a higher sensitivity and dynamic range in order to cover a wide range of target distances. What this means is that with a common radar/communications signal and hence a common antenna and transmit power, the maximum return range (also referred to herein as "maximum return distance") of the radar signal $R_{max}$ is typically much less than the range of the communications signal $R_{comm}$, i.e., $R_{max} < R_{comm}$.

The transmitted linear frequency-modulated signal of an FMCW radar system can be modeled as a linear chirp:

$$s_T(t) = \cos(2\pi f_c t + 2\pi \int_0^T f_T(\tau) d\tau)$$

where $f_T(\tau) = (B/T)\tau$ is the transmit frequency as a linear function of time $\tau$ (for an up ramp; a down ramp would be negative), $f_c$ is the carrier frequency, B is the bandwidth, the amplitude is normalized to unity, and T is the time duration. Considering a reflected and received signal with a time delay $t_d = 2(R_0 + vt)/v_c$ and a Doppler shift $f_D = -2 \cdot f_c v/v_c$, where $v_c$ is the velocity of light (for RF signals), the received frequency after mixing the transmitted signal with the received signal can be expressed as $$f_R(t) = \frac{B}{T}(t - t_d) + f_D$$

where $R_0$ is the range at time $t=0$ and v is the target velocity (or range rate). Thus the received up ramp signal can be described as $$s_R(t) = \cos\left(2\pi\left(f_c(t - t_d) + \frac{B}{T}\left(\frac{t^2}{2} - t_d t\right) + f_D t\right)\right)$$

Here the received signal amplitude is normalized to unity. In fact, the received signal amplitude depends on antenna gains, transmitted power, the target's distance and radar cross section (RCS). To obtain information about the Doppler frequency and beat frequency, the transmitted signal $s_T(t)$ and the received signal $s_R(t)$ are mixed by multiplication in the time domain and passed to a low-pass filter (LPF) with a bandwidth B. The intermediate frequency (IF) signal $s_{IF}(t)$ of the LPF output is then obtained for an up ramp as $$s_{IF}(t) = \frac{1}{2}\cos\left(2\pi\left(f_c \cdot \frac{2R_0}{v_c}\right) + 2\pi\left(\frac{2R_0}{v_c} \cdot \frac{B}{T} + \frac{2f_c v}{v_c}\right)t\right)$$

Similarly, the IF signal $s_{IF}(t)$ of the LPF output can be obtained for the down ramp (with the same slope as the up ramp, but the opposite sign) as follows $$s_{IF}(t) = \frac{1}{2}\cos\left(2\pi\left(f_c \cdot \frac{2R_0}{v_c}\right) + 2\pi\left(-\frac{2R_0}{v_c} \cdot \frac{B}{T} + \frac{2f_c v}{v_c}\right)t\right)$$

Hence, two time-dependent frequency terms called the up and down ramp beat frequencies appear in the spectrum of the baseband signal:

$$f_{bu} = \frac{2R_0}{v_c} \cdot \frac{B}{T} + \frac{2f_c v}{v_c} \quad (1)$$

$$f_{bd} = -\frac{2R_0}{v_c} \cdot \frac{B}{T} + \frac{2f_c v}{v_c} \quad (2)$$

These frequencies may be used to solve for target velocity v and range $R_0$. (The references: Rohling and Meinecke, "Waveform design principles for automotive radar systems", 2001 CIE International Conference on Radar (2001), and Rohling and Moller, "Radar waveform for automotive radar systems and applications", 2008 IEEE Radar Conference, 26-30 May (2008), contain this information and references to the papers where the frequencies are derived.) FIG. 1 shows the frequencies for the transmitted (solid lines) and received (dashed lines) signals having a triangular waveform, where $f_{bu}$ and $f_{bd}$ denote the up ramp beat frequency and down ramp beat frequency, respectively.

This disclosure proposes to use a combined waveform having a design that is based on the above-described up and down chirps, so that the radar function is essentially unaffected, but is parameterized in two ways to allow communications to take place:

(1) Each symbol will be of length 2T and have two chirps, one up and one down. Note that one could also use a down chirp followed by an up chirp. The following discussion standardizes on up, then down chirps. The up chirp will start with a frequency $f_c - B/2$ at time 0 and then go to a frequency $f_c + B/2$ at time $T_i$; then the complementary down chirp will start with a frequency $f_c + B/2$ at time $T_i$ and end at a frequency $f_c - B/2$ at time 2T for symbol i. Let the two different chirp slopes be labeled $a_i$ and $\alpha_i$, and the two different frequencies be labeled $b_i$ and $\beta_i$. Their values can be related to the chirp parameters by $a_i = B/T_i$, $b_i = f_c - B/2$, $\alpha_i = -B/(2T - T_i)$, and $\beta_i = f_c + B/2$.

(2) Each symbol will have a separate initial phase for each chirp: phase $c_i$ for the first chirp and phase $\gamma_i$ for the second chirp. Here $-\pi < c_i, \gamma_i \leq \pi$ or in normalized form: $-\frac{1}{2} < c_i, \gamma_i \leq \frac{1}{2}$ in the following equations.

These changes will not impact the radar performance of the waveform at all. The only changes to derive range and range rate have to do with measuring the beat frequency during the two intervals [0, $T_i$] and [$T_i$, 2T], instead of the two intervals [0, T] and [T, 2T]. The equations for the two intervals can be represented in the following forms:

$\exp(2\pi j(a_i t^2 + b_i t + c_i)), 0 \leq t < T_i$ $\exp(2\pi j(\alpha_i (t-T_i)^2 + \beta_i(t-T_i) + \gamma_i)), T_i \leq t < 2T$ In its most general form, the CRCW can be represented by multiple parallel (contiguous or non-contiguous) channels (m in number) having frequency bands $B_i$, where i=1, 2, ..., m. Each frequency band has its own symbol times, chirp slopes and phases within an overall range of frequencies having a total bandwidth $B_T$ that represent all the radar and communications systems that are currently operating. FIG. 2B shows this design in which a respective series of symbols, each symbol including an up chirp and a down chirp as described above, are transmitted in respective channels of width B centered on respective different carrier frequencies.

Henceforth, this disclosure concentrates on the canonical case with one channel with contiguous bandwidth B and center frequency $f_c$.

Figure 2A:
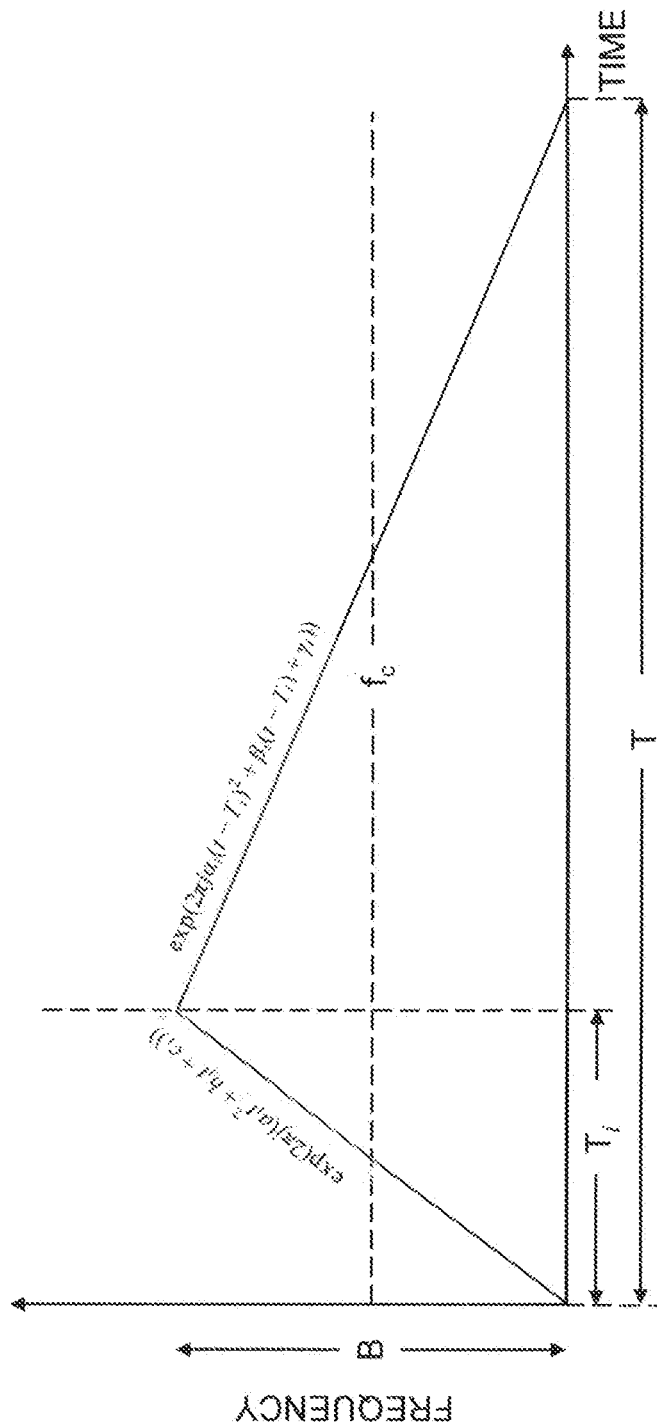
FIG. 2A is a graph showing a symbol design using linear frequency modulation to include one up chirp and one down chirp in each symbol.
Figure 2B:
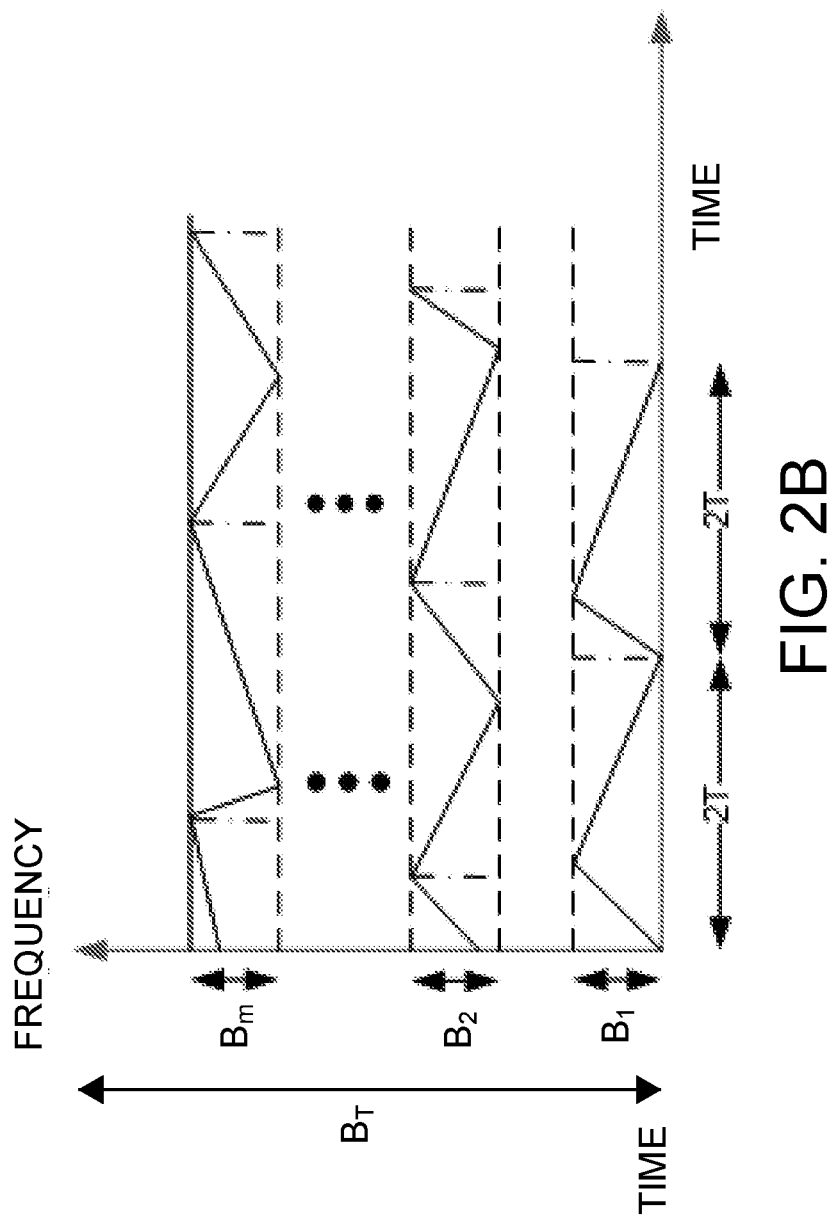
FIG. 2B is a graph representing frequencies of chirp waveforms being transmitted in separate parallel channels.

In accordance with the methodology disclosed herein, symbols having waveforms of the types depicted in FIG. 2A may be transmitted concurrently. Similarly, the reflected and returned signals may be processed in parallel to derive various parameters characterizing the targets detected by the FMCW radar system.

The range resolution ΔR represents the minimum discernible range of two targets with the same velocity, and the velocity resolution Δv represents the minimum discernible velocity of two targets with the same range. The required bandwidth B is related to the given range resolution ΔR and can be formulated as $$B \geq \frac{v_c}{2\Delta R}$$

Similarly, the observation time T is related to the velocity resolution Δv and can be expressed as $$T \geq \frac{v_c}{2f_c \Delta v}$$

The Nyquist sampling theorem then requires $$f_s(\text{radar}) \geq \frac{2BR_{max}}{v_c T} + \frac{2f_c v_{max}}{v_c}$$

in order to not have the maximum beat frequency fold over in the frequency domain. In order that the maximum return does not fold over in the time domain (folding into the next time interval T), a similar requirement is that $$t_d = 2\frac{R_{max} + v_{max}T}{v_c} < T$$

or $$T > \frac{2R_{max}}{v_c}$$

for reasonable velocities. These equations give a relationship between the radar performance parameters {$R_{max}$, $v_{max}$, ΔR, Δv, $f_c$} and the waveform parameters {B, T, $f_s$}. Note that for a given CRCW symbol with durations $T_i$ and $2T-T_i$ for the two chirps, T in the above equations would be replaced by one of these two quantities depending on which part of the symbol is being referred to.

For communications functions using the CRCW, one may take the desired maximum data rate for communications in each channel m and find a bandwidth $B_m$ that will support that through standard communications analysis. The result is an available total bandwidth $B_T$. Then clearly $$\sum_m B_m \leq B_T$$

The sample rate of the communications receiver $f_s$(comm) after down conversion must satisfy the condition:

$$f_s(\text{comm}) \geq 2B_m$$

for each channel in order to capture the full bandwidth of the communicated signal.

For simplicity, the following additional disclosure assumes that each channel bandwidth is the same value B, meaning that the subscript m will be dropped. Suppose there are S symbols from a set {$S_k$} defined by {T, $T_i$, B, $\Theta_j$, $\Phi_l$} (where $0<T_i<2T$, $0 \leq i \leq C-1$, and $-\pi < \Theta_j$, $\Phi_l < \pi$, $j \geq 0$, $1 \leq C_1 - 1$, $C \cdot C_1^2 = S$), where $T_i$ is the length of time of the first chirp, B is the corresponding frequency range for both chirps (all symbols will have the same bandwidth and it is the same for both up and down chirps), and $\Theta_j$ and $\Phi_l$ are the corresponding phases of the up and down ramps.

To support a required data rate Λ bits per second, one should have $$\Lambda \leq \lfloor \log_2(S) \rfloor / 2T \lfloor B_T/B \rfloor$$

where $\lfloor \log_2(S) \rfloor$ is the number of bits/symbol, 1/2T is the number of symbols per second, and $B_T$ is the total bandwidth allocated (via regulation, hardware limits, etc.) for the combined radar/communications system. If all of the limits on the chirp periods are combined, the result is $$T_i, 2T - T_i \geq T_{min} \geq \max\left\{\frac{2R_{max}}{v_c}, \frac{v_c}{2f_c \Delta v}\right\}$$

and $$T \geq T_{max} \geq \max\{T_i, 2T - T_i\}.$$

Similarly, $$\log_2 S \geq 2\Lambda T / \lfloor B_T / B \rfloor$$

and $$f_s \geq \max\left\{B, \frac{2BR_{max}}{v_c T} + \frac{2f_c v_{max}}{v_c}\right\}$$

Let the number of unique chirp times (the unique values in {$T_i$}) (or equivalently the number of unique positive frequency slopes for the symbol set) be C. These conditions can be met via the following equations:

$$T = (T_{min} + T_{max})/2$$

$$T_i = T_{min} + (T_{max} - T_{min}) \cdot i/(C-1)$$

for i=1, . . . , C−1 as an example. Then the complementary duration $$2T - T_i = T_{max} - (T_{max} - T_{min}) \cdot i/(C-1)$$

is simply the reverse list of the {$T_i$}, simplifying the receiver and transmitter design.

With no other limits on the phases and a symbol defined by a phase pair $$\langle \Theta, \Phi \rangle$$

there can be $D = \lceil \sqrt{S/C} \rceil$ unique values of each phase for both coordinates for a total of $D^2$ phases for each slope C. Thus the total number of symbols would then be $$C \cdot D^2 = C \cdot \lceil \sqrt{S/C} \rceil \cdot \lceil \sqrt{S/C} \rceil$$

which is greater than S as required. A simple assumption is to spread the phases evenly over (−π, π] via the following phase definitions:

$$\Theta_j = -\pi + 2\pi j/C_1$$

$$\Phi_l = -\pi + 2\pi l/C_1$$

for j, l=1, . . . , D−1.

Together (both radar and communication cases), the above description has defined almost all of the basic waveform parameters $$\{S, B, T, f_s, \{T_i\}, \{\Phi_j\}, \{\Theta_l\}\}$$

using the requirement/design parameters $$\{R_{max}, v_{max}, \Delta R, \Delta v, f_c, B_T, \Lambda\}.$$

Note that the amplitude A (which was normalized to unity in the above discussion) has not been discussed because amplitude is better handled through the link budget and RF front-end hardware, which are purely application specific, as described above. The remaining values C and D give a way to adjust the spread of symbols so as to give the best and most consistent symbol detection performance as a function of SNR. This balance of slope versus phase (C and D) is described in the following paragraphs.

A method for balancing symbol slopes and phases will now be described in some detail. The following discrete chirp model will be used in order to estimate variance:

$$s[n] = A\exp(j(2\pi j(\alpha m^2 + \beta n + \gamma))$$

$$z[n] = s[n] + w[n]$$

$$m = n - (N-1)/2, \quad 0 \le n \le N-1 \quad (3)$$

where s[n] is the sampled version of a symbol, z[n] is the sampled received signal plus noise, and w[n] is the sampled version of the received noise with a standard deviation of 3σ. The value N is the number of samples during the chirp period. The parameters $\{\alpha, \beta, \gamma\}$ define each chirp of the two-chirp set that corresponds to a symbol and respectively correspond to chirp rate (or frequency slope of chirp), frequency and phase. This disclosure employs modified approximations to the Cramer-Rao lower bound for the variance estimators of each parameter using the following notation:

$$\operatorname{var}\{\hat{\alpha}\} \gtrsim \left(\frac{\sigma}{\pi A}\right)^2 \frac{90}{NT^4} \quad (4)$$

$$\operatorname{var}\{\hat{\beta}\} \gtrsim \left(\frac{\sigma}{\pi A}\right)^2 \frac{6}{NT^2} \quad (5)$$

$$\operatorname{var}\{\hat{\gamma}\} \gtrsim \left(\frac{\sigma}{\pi A}\right)^2 \frac{9}{8N} \quad (6)$$

This information can be used to choose a balance between the number C of different frequency slopes and number D of different phases.

A specific example will now be described to show how to balance the values of C and D as a function of the other waveform parameters. Suppose that B=1 MHz and $T_{min}$=10 μs. And suppose that the chirp bandwidths for the symbols are equally spaced in frequency. In particular, assume that the maximum slope is $$a_{max} = \frac{B}{T_{min}}$$

and then distribute the frequency slope values evenly to cover the full range to this maximum. This equation follows from the following observations. The Doppler equation relates transmit frequency f versus apparent observed frequency f' due to relative motion. So $$f' = \frac{v_c + v_0}{v_c + v_s} f$$

where $v_c$ is the velocity of the signal (the velocity of light for RF signals), $v_0$ is the signed velocity of the observer, and $v_s$ is the signed velocity of the source (transmitter). Thus the received chirp may be shifted in frequency from the transmitted chirp by the ratio $(v_c+v_0)/(v_c+v_s)$. This essentially changes the value of β of the received signal to $$\beta' = \frac{v_c + v_0}{v_c + v_s} \beta$$

where β is the starting frequency of the transmitted chirp and β' is the starting frequency of the received chirp. Because of the way the received signal is processed (described in some detail below), the estimation of β may be avoided without affecting receiver performance.

Some components of a simplified FMCW radar system 100 that is not configured to use the waveforms disclosed hereinabove are identified in FIG. 3. The FMCW radar system 100 may installed on a vehicle such as a car, a bus, a truck, etc., for measuring the range of a radar target 102, such as another vehicle or a person, and sending out an alarm signal when the measured range is less than a specified minimum separation distance. The FMCW radar system 100 is functionally divided into a transmission portion and a reception portion. The transmission portion includes an up/down ramp controller 104, a digital-to-analog (D/A) converter 105, a frequency-modulated continuous waveform generator 106, a voltage-controlled oscillator (VCO) 107, a transmission amplifier 108, and a transmission antenna 110 connected in series. The reception portion includes a reception antenna 116, a low-noise reception amplifier 118, a frequency mixer 120 (which is also connected to VCO 107), a low-pass filter 122, an analog-to-digital (A/D) converter 124, and a baseband radar signal processing module 126 (which is also connected to the up/down ramp controller 104) connected in series. A modulated signal is transmitted and received through the antennas, and the transmitted and received signals are multiplied in the time domain, filtered and processed to find the peaks in frequency which correspond to target returns. The final result is a stream of measurements including range and range rate (relative velocity) of all the targets present.

Sensing operations of the FMCW radar system 100 can be briefly described as follows. The up/down ramp controller 104 outputs digital control signals to the digital-to-analog converter 105, which converts the digital signals into analog signals that control the frequency-modulated continuous waveform generator 106 to generate frequency-modulated continuous waveforms, which the VCO 107 converts to FMCW signals having a carrier frequency $f_c$(Tx). The FMCW signals are amplified by transmission amplifier 108 and emitted as RF electromagnetic waves 112 toward the radar target 102 by the transmission antenna 110. Correspondingly, the reception antenna 116 receives RF electromagnetic waves 114 reflected from the radar target 102. The reception antenna 116 acts as a transducer to convert the reflected RF electromagnetic waves into electrical signals which are amplified by low-noise reception amplifier 118. The frequency mixer 120 then frequency mixes the received signals output by the low-noise reception amplifier 118 with the transmitted signals having a carrier frequency $f_c$(Tx)

generated by the VCO 107 to produce first demodulated signals that contain phase information. The low-pass filter 122 performs low-pass filtering to obtain beat frequency signals between the transmitted and received signals. The analog-to-digital converter 124 samples the beat frequency signals and converts the beat frequency signals into digital signals. In order to compute information of the targets such as ranges and range rates, the baseband radar signal processing module 126 is configured to convert the digital beat frequency signals from the time domain to the frequency domain. A common method is using fast Fourier transforms. The up and down chirp signals are processed separately in two fast Fourier transforms. After fast Fourier transformation, the baseband radar signal processing module 126 finds the peaks in frequency, which correspond to target returns, utilizing a threshold value. The beat frequencies are then used to solve for target velocity v and range $R_0$, as previously described. The final result is a stream of measurements of range and target velocity (or range rate) for all targets present. In the example depicted in FIG. 3, the baseband radar signal processing module 126 is configured to compute and derive information about the target 102, such as range and range rate, and then store these radar measurements 128 in a non-transitory tangible computer-readable storage medium.

Figure 3:
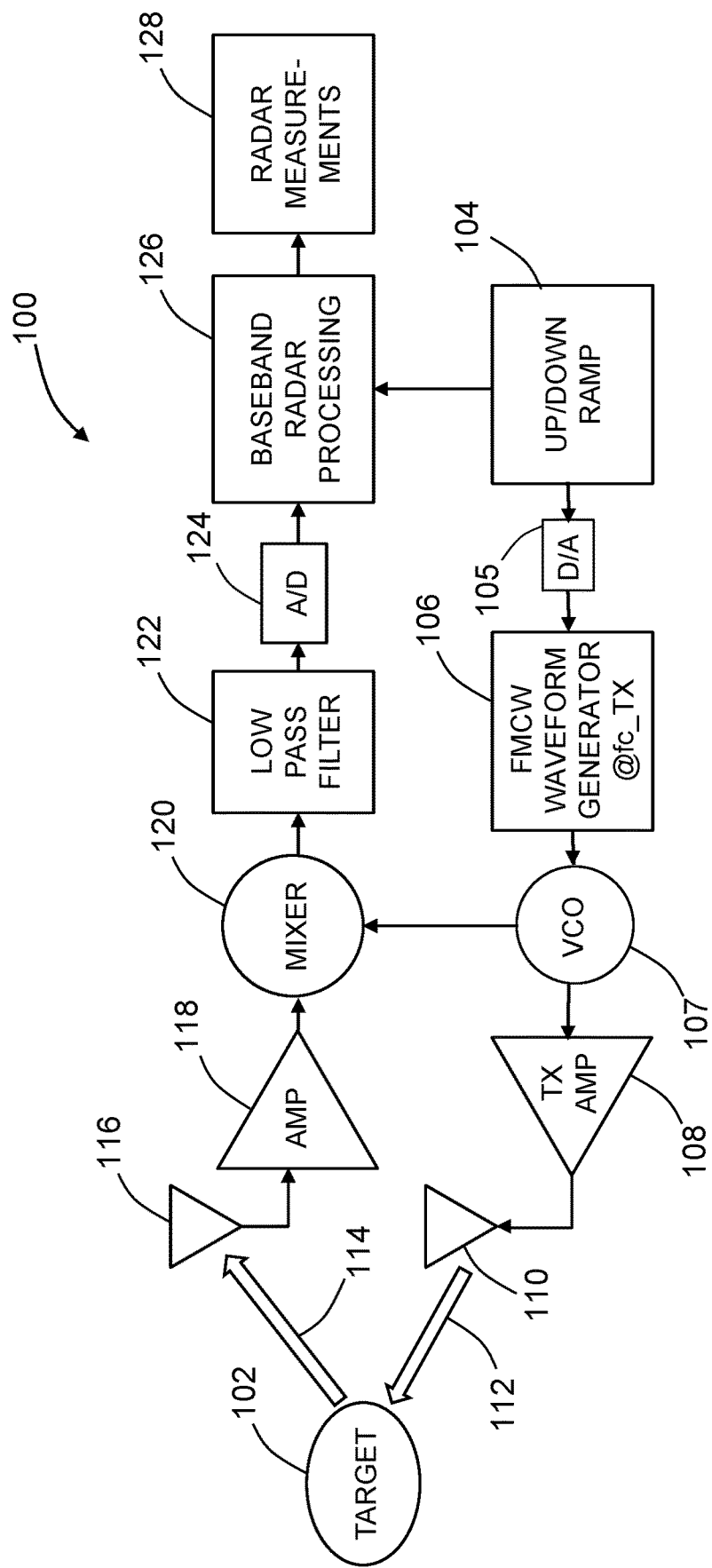
FIG. 3 is a block diagram identifying some components of a FMCW radar system that is not configured to use the combined radar/communications waveform disclosed herein.
Figure 4:
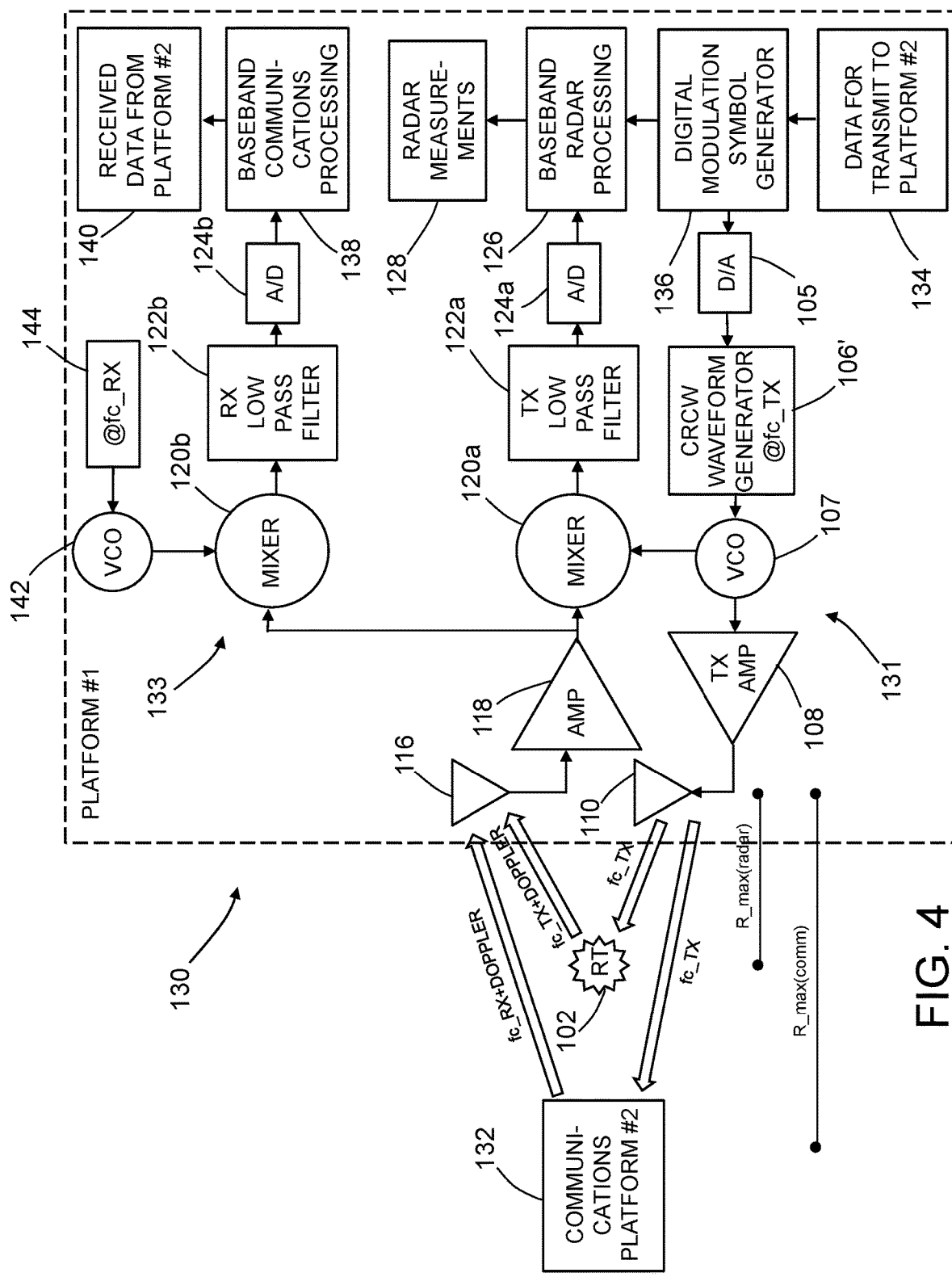
FIG. 4 is a block diagram identifying some components of a combined radar/communications system configured in accordance with one embodiment to use the combined radar/communications waveform disclosed herein.

By contrast, with a modification to the FMCW radar system partly depicted FIG. 3, a combined radar/communications system may be configured to use the previously described CRCW. FIG. 4 is a block diagram identifying some components of a combined radar/communications system 130 configured to use the CRCW disclosed herein. In the example partly depicted in FIG. 4, data may be transmitted from the combined radar/communications system 130 (which is part of a communications platform #1) to a communications platform 132 (also referred to herein as "communications platform #2"). Conversely, data may be transmitted from the communications platform 132 to the combined radar/communications system 130 of communications platform #1. Thus the combined radar/communications system 130 has both radar and communications data output and radar and communications data input. The radar portion is essentially unchanged from what is depicted in FIG. 3, merely requiring non-uniform symbol timing beyond the simpler FMCW radar system, which only needed uniform timing of the up or down chirp to compute the range and range rate. The processing of the waveform by the communications receiver (the uppermost processing path in FIG. 4) will be described in more detail later with reference to FIGS. 19-23.

As depicted in FIG. 4, the combined radar/communications system 130 includes a local transmitter and a local receiver which combine both radar and communications signals. The remote communications platform 132 (communications platform #2) that is communicating with combined radar/communications system 130 of communications platform #1 would typically use a different frequency band or bands for its communications. Thus FIG. 4 shows two different frequencies: fc_Tx (equal to $f_c(Tx)$) for the center frequency of the transmitter of the combined radar/communications system 130 (and of the radar receiver) and fc_Rx (equal to $f_c(Rx)$) for the center frequency of the communications receiver of the combined radar/communications system 130, which from the point of view of the remote communications platform 132 is the center frequency for its transmitter.

To clarify the terminology used herein, modulation is a process by which a carrier signal is altered according to information in a message signal. The transmission frequency $f_c(Tx)$ is the frequency of the carrier signal transmitted by a transmitter. The signal received by a receiver is demodulated using the same frequency. The demodulated signal is then sampled by the receiver. The sampling rate is the rate at which the message signal is sampled. The frequency of the carrier signal is usually much greater than the highest frequency of the input message signal. The Nyquist sampling theorem requires that the sampling rate $f_s$ be greater than two times the sum of the carrier frequency and the highest frequency of the modulated signal in order for the demodulator to recover the message correctly. To modulate a signal using digital modulation with an alphabet having M symbols, one may start with a real message signal whose values are integers from 0 to M−1.

In the example depicted in FIG. 4, the transmission antenna 110 of the combined radar/communications system 130 is transmitting RF electromagnetic waves having a transmit center frequency $f_c(Tx)$ toward a radar target 102 and toward a communications platform 132. In return, the reception antenna 116 of the combined radar/communications system 130 receives RF electromagnetic waves from the radar target 102 having a frequency equal to the center frequency $f_c(Tx)$ plus the Doppler frequency due to movement of the radar target 102 relative to the combined radar/communications system 130. The reception antenna 116 also receives RF electromagnetic waves from the communications platform 132 having a frequency equal to the center frequency $f_c(Rx)$ transmitted by the transmission antenna (not shown in FIG. 4) of the communications platform 132 plus the Doppler frequency due to movement of the communications platform 132 (communications platform #2) relative to the communications platform #1. As previously mentioned, the separate receive frequency channel for communications from the communications platform 132 uses a different center frequency $f_c(Rx)$ than the transmit center frequency $f_c(Tx)$ so that the two radar/communications transmitters do not transmit in the same frequency band.

Referring to FIG. 4, the transmitting portion (hereinafter "common radar/communications transmitter 131") of the combined radar/communications system 130 of communications platform #1 includes the following components connected in series: a communications data source 134 that stores data to be transmitted to communications platform 132; a digital modulation symbol generator 136 that converts the communications data to symbols; a digital-to-analog converter 105 that converts the digital symbols to analog symbols; a combined radar/communications waveform generator 106' that converts the analog symbols received from the digital-to-analog converter 125 into oscillator control voltages; a VCO 107 that applies a modulating signal to a carrier signal having a transmit frequency $f_c(Tx)$ based on the voltage control inputs and outputs CRCW-modulated signals; a transmission amplifier 108 that amplifies the resulting CRCW-modulated signals received from VCO 107; and a transmission antenna 110 that broadcasts the CRCW-modulated signals received from transmission amplifier 108.

Still referring to FIG. 4, the radar receiver and communications receiver (hereinafter collectively referred to as the "combined radar/communications receiver 133") of the combined radar/communications system 130 both receive signals via a reception antenna 116 and a low-noise reception amplifier 118. In the next paragraph, additional components of the radar receiver of the combined radar/communications receiver 133 will be described. Thereafter, additional components of the communications receiver of the combined radar/communications receiver 133 will be described.

The radar receiver of the combined radar/communications system 130 includes reception antenna 116, low-noise reception amplifier 118, a frequency mixer 120a (which is also connected to VCO 107), a low-pass filter 122a with a bandwidth B, an analog-to-digital converter 124a, and a baseband radar signal processing module 126 (which is also connected to the digital modulation symbol generator 136) connected in series. The reception antenna 116 receives RF electromagnetic waves reflected from the radar target 102. The reception antenna 116 converts the reflected RF electromagnetic waves into electrical signals which are amplified by low-noise reception amplifier 118. The frequency mixer 120a then frequency mixes the amplified signals output by the low-noise reception amplifier 118 with the signals having a carrier frequency $f_c(Tx)$ generated by the VCO 107 to produce first demodulated signals containing phase information. The low-pass filter 122a performs low-pass filtering to obtain beat frequency signals between the transmitted and received signals. The analog-to-digital converter 124a samples the beat frequency signals and converts the beat frequency signals into digital signals. The baseband radar signal processing module 126 is configured to convert the digital beat frequency signals from the time domain to the frequency domain using separate fast Fourier transforms for the up and down chirp signals. After fast Fourier transformation, the baseband radar signal processing module 126 finds the peaks in frequency, which correspond to target returns, utilizing a threshold value. The beat frequencies are then used to solve for target velocity v and range $R_0$, as previously described. The final result is a stream of measurements of range and target velocity (or range rate) for all targets present. In the example depicted in FIG. 4, the baseband radar signal processing module 126 is configured to compute and derive information about the radar target 102, such as range and range rate, and then store these radar measurements in a non-transitory tangible computer-readable storage medium 128.

The communications receiver of the combined radar/communications system 130 includes the reception antenna 116, the low-noise reception amplifier 118, a frequency mixer 120b (which is connected to a VCO 142 that applies a modulating signal of frequency $f_c(Rx)$ to the voltage control input from waveform generator 144, a low-pass filter 122b with a bandwidth B, an analog-to-digital converter 124b, and a baseband communications signal processing module 138 connected in series. The reception antenna 116 receives RF electromagnetic waves transmitted by the transmitter of the remote communications platform 132. The frequency mixer 120b frequency mixes the received signals output by the low-noise reception amplifier 118 with the signals having a carrier frequency $f_c(Rx)$ generated by the VCO 142 to produce second modulated signals containing phase information. The low-pass filter 122b performs low-pass filtering. The analog-to-digital converter 124a samples the filtered signals and converts those analog signals into digital signals. The baseband communications signal processing module 138 is configured to decode the digitals signals to extract the received communications data 140, which is then stored in a non-transitory tangible computer-readable storage medium.

As shown in FIG. 4, the baseband radar signal processing is only changed in a minor way to use the up and down chirped signals containing the communicated data. Basically, instead of processing up and down chirps with identical duration, the radar processing would process the received data by mixing with the transmitted non-uniform up and down chirps and doing the same calculations as in traditional FMCW processing. Fourier transforms together with Eqs. (1) and (2), which relate the beat frequency to range and range rate (or relative velocity), can be processed in the same manner as in typical FMCW radar. The controlling equations become $$f_{bu} = \frac{2R_0}{v_c} \cdot \frac{B}{\tau_i} + \frac{2f_c v}{v_c} \qquad (7)$$

$$f_{bd} = -\frac{2R_0}{v_c} \cdot \frac{B}{2T - T_i} + \frac{2f_c v}{v_c} \qquad (8)$$

when a symbol with slope dictated by $T_i$ is sent. From these equations, range $R_0$ and range rate v can be effectively estimated.

As described above, the basic FMCW system consists of a transmitter, a receiver and a mixer. A modulated signal is transmitted and received, and the transmitted and received signals are multiplied in the time domain and processed. More specifically, the process typically involves at least the following steps: (1) calculate the transmitted signal; (2) calculate the received signal; (3) mix the signals by multiplying in the time domain; (4) filter out one of the two derived sinusoidal terms; and (5) perform FFT on the filtered signal. FMCW processing is described in detail in many papers and books (see, e.g., Wu and Linnartz, "Detection Performance Improvement of FMCW Radar Using Frequency Shift", Symposium on Information Theory and Signal Processing in the Benelux, Brussels, Belgium, May 10-11, 2011 and Parrish, "An Overview of FMCW Systems in MATLAB") and is not further described herein.

Figure 5:
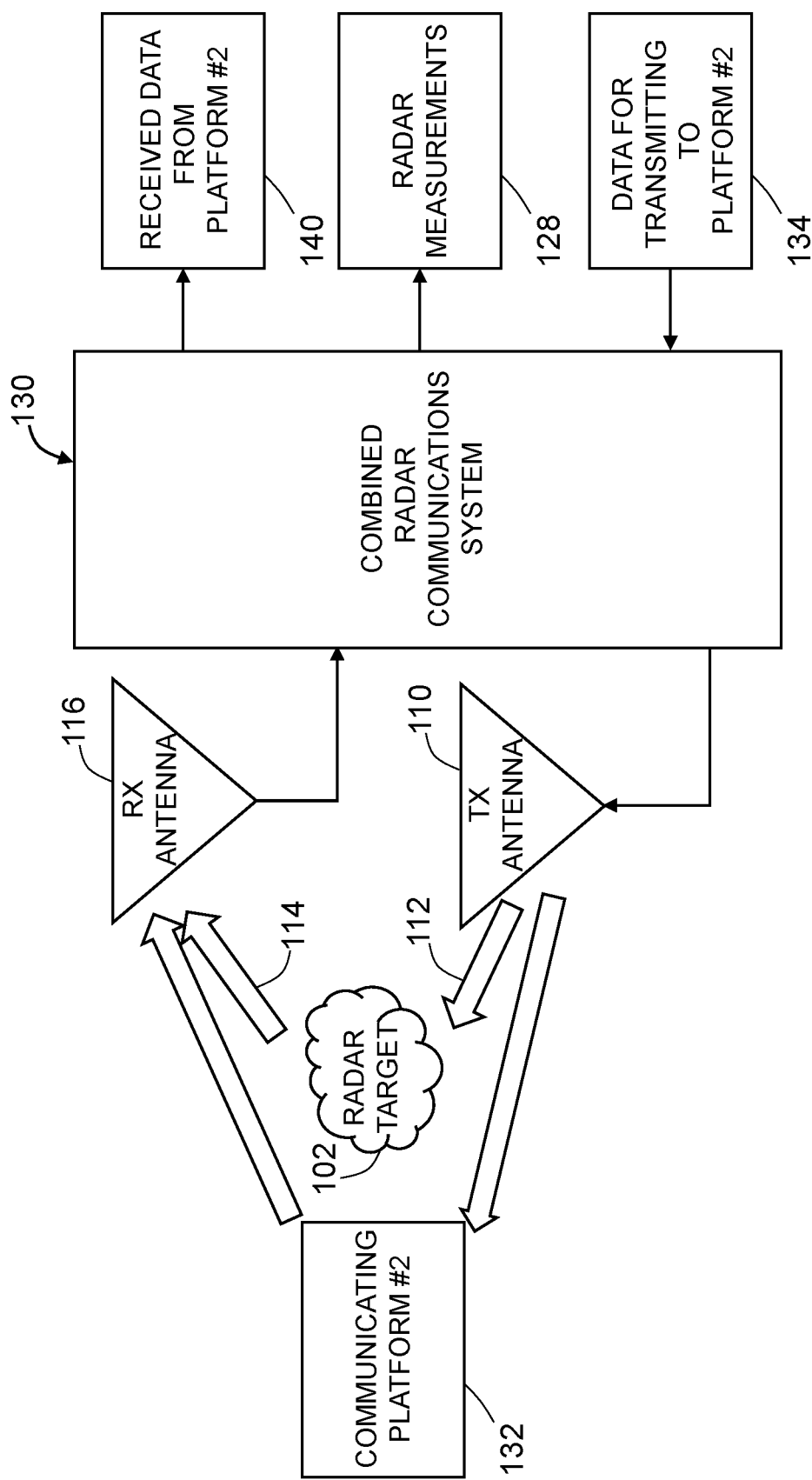
FIG. 5 is a block diagram that simplifies FIG. 4 by reducing the components of the combined radar/communications system to a single block.

FIG. 5 is a block diagram that simplifies FIG. 4 by reducing the components of the combined radar/communications system 130 to a single block. A comparison of FIGS. 4 and 5 reveals that the combined radar/communications system 130 (as the term is defined herein) does not include transmission antenna 110, reception antenna 116, radar measurements 128, communications data source 134 and received communications data 140, which are all indicated in FIG. 5 to be external to the combined radar/communications system 130.

The above-described common radar/communications system 130 may be further enhanced by configuring the transmitted symbols to enable time transfer and position determination during radar and/or communications operations. New capabilities are added to the combined radar and communications operation through a set of processing blocks and a new packet format. One aspect of the methodology is that each communications platform is further configured to broadcast a signal that any other communications platform receiving the signal can use to synchronize system clocks to the set of master clocks among a selected subset of transmitting platforms. This broadcast signal can occur during both radar and communications operations. In addition, with three or more mobile or fixed platforms broadcasting the signal, any one receiving the signal can also derive position information. The time transfer and position determination service can operate at the same time as operation of both radar and communications functions. The broadcast information is derived from internal time and position information as determined by the individual transmitting platforms. A small set of such platforms are configured to broadcast signals that transfer both accurate time and accurate position to all other platforms within radiofrequency (RF) range.

Figure 6A:
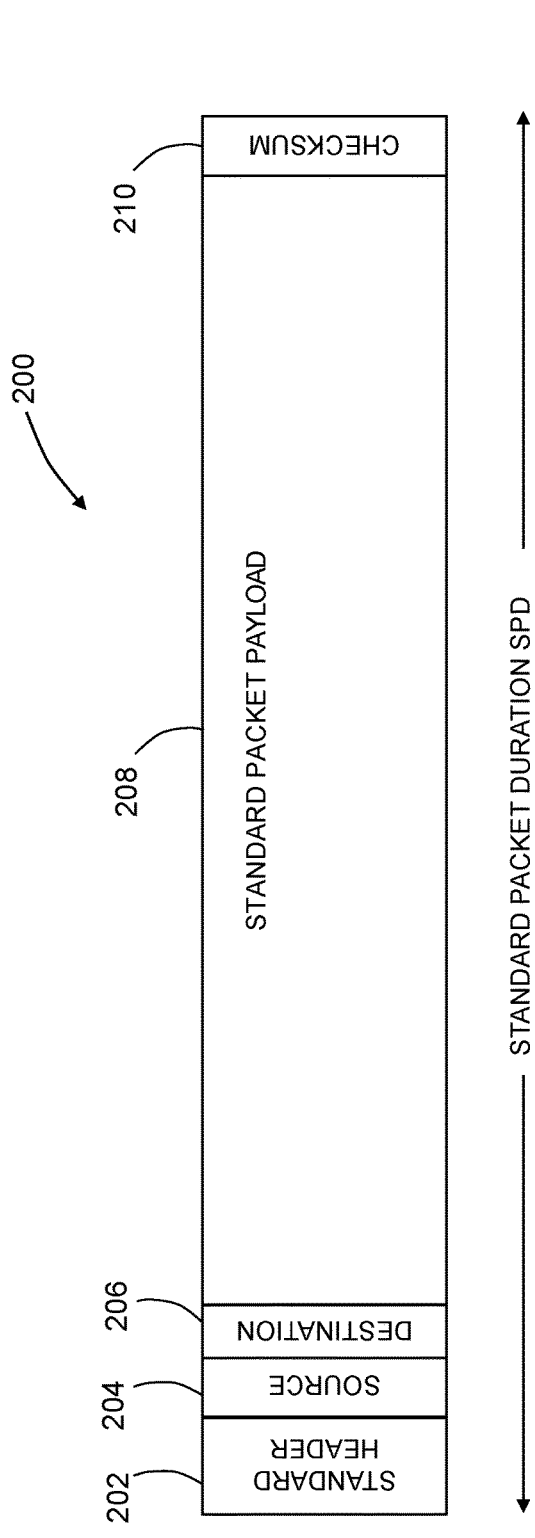
FIG. 6A is a diagram representing the format of a standard packet.

An earlier section of this disclosure described how symbols are organized to form a combined radar and communications waveform that enables both the radar and communications system to function simultaneously. Once it has been determined how symbols can be transmitted, traditional methods allow their combination into sets of symbols called a packet. FIG. 6A is a diagram representing the format of a standard packet 200. Each standard packet 200 includes the following data in the order listed: a header 202, source data 204, destination data 206, error correction-coded payload data 208 and checksum data 210. From that basic item, a sequence of packets can be transmitted reliably to one or many destinations and can thus form a communications network. This packet architecture comes in many specific forms made for specific protocols, but shares a number of common attributes that are known to practitioners of the art of radionavigation. In a standard approach, to add time and position information, a contiguous portion of the standard packet is typically set aside for this information. While this would be a normal design choice, it would have several drawbacks.

The first drawback is that having a single contiguous time and position information packet section does not allow fast enough updates under many conditions where the transmitting platform is very dynamic in motion (and thus changing in position at a very fast rate in an unpredictable fashion). This is because the position could only be updated at the packet rate, rather than the rate required by the dynamic rate of the platform which might be much higher. Note that this is not a problem for GPS since the GPS satellites have known and tightly controlled orbits and their position can be predicted far in advance.

The second drawback is that pulsed jamming could destroy detection of the entire time and position information if it occurred during the contiguous time and position packet section.

The third drawback is that using such a normal packet section with symbols chosen to meet the designed signal to noise ratio (SNR) only allows time and position information to be shared when the communications link meets the minimum SNR level for communications. However, a system must often be designed such that during GPS outages when the radar antenna is pointed in a completely different direction from other platforms in the network, it must still be possible to support continuous time transfer and position determination services. This means that the signal may only be detected in the lowest sidelobes of the antenna pattern and therefore the SNR may be much lower than the SNR for communications depending on the relationship between the pointing direction of the transmitting antenna and the receiving platform's antenna.

Figure 7:
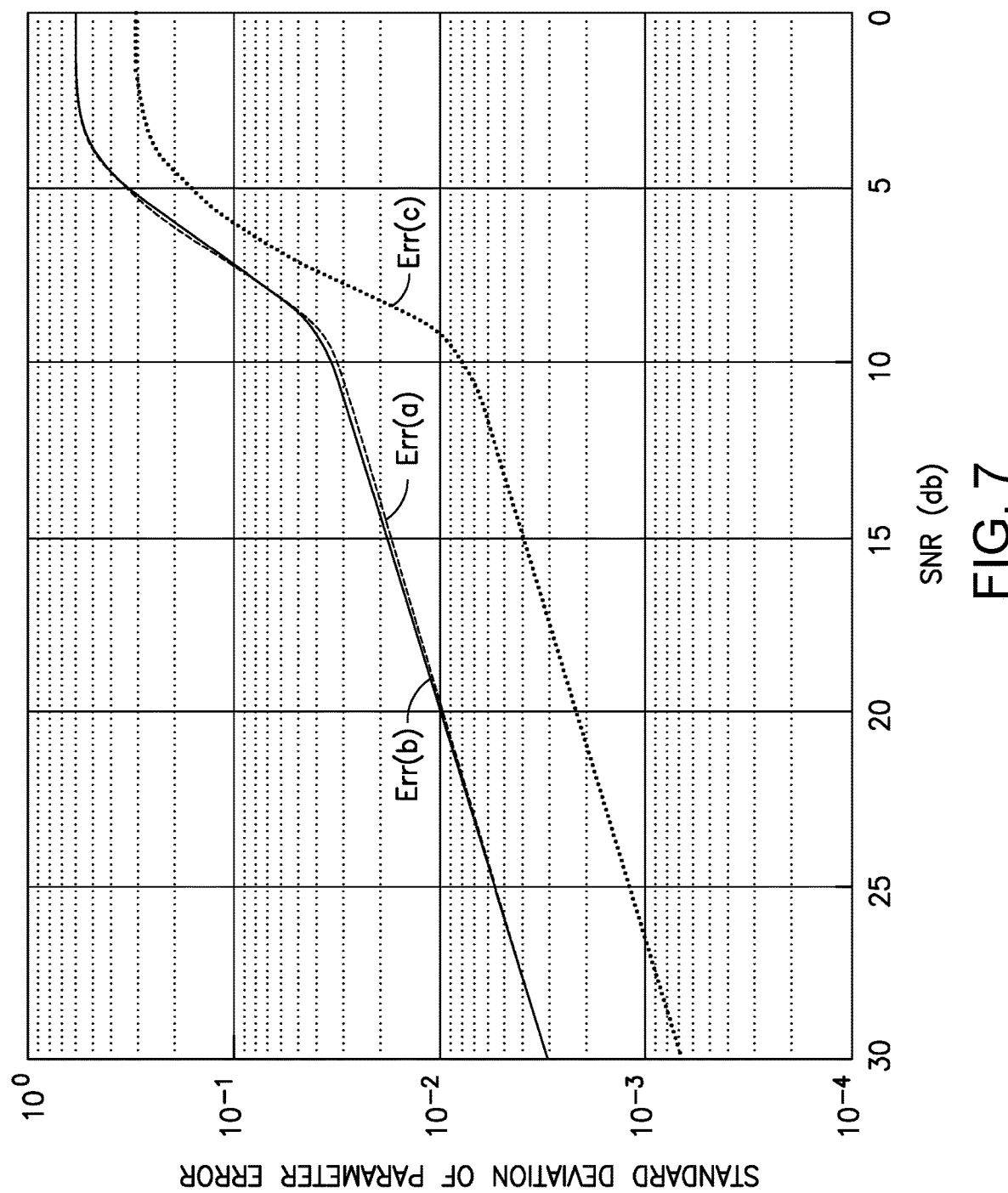
FIG. 7 is a graph of standard deviation of parameter error versus SNR (dB) that shows the performance of a linear chirp parameter estimation method for a sub-sample length of N=1000. The solid, dashed and dotted lines respectively represent the errors in parameters a, b and c, which respectively control the chirp slope (a.k.a. chirp rate), initial frequency and initial phase of the chirp signal.

In an attempt to solve all of the above-described problems attending a standard packet, this disclosure introduces the concept of a supersymbol. A supersymbol uses the phase terms, but does not change the chirp slopes. Thus $T_i=T$ and only the phases $\{c_i, \gamma_i\}$ are used. This is because the chirp phase can be more accurately estimated. This is shown in FIG. 7 for a 1000-sample simulation involving a linear chirp pulse model in which the linear phase-modulated signal is described by Eq. (7), where a, b, c are parameters (hereinafter "coefficients") of a polynomial function that control the chirp slope (a.k.a. chirp rate), initial frequency and initial phase of the chirp signal. FIG. 7 shows the simulated errors for parameter a (solid line), parameter b (dashed line) and parameter c (dotted line).

The supersymbol is defined as follows in a channel with bandwidth B: Let the up chirp start with a frequency $f_c-B/2$ at time 0 and then go to a frequency $f_c+B/2$ at time T; then the complementary down chirp will start with a frequency $f_c+B/2$ at time T and end at a frequency $f_c-B/2$ at time 2T. Thus the up and down chirps are equal in length. The two chirp slopes are represented by the values of parameters named a and $\alpha$, and the two frequencies are represented by the values of parameters named b and $\beta$. Their values can be related to the chirp parameters by $a=B/T$, $b=f_c-B/2$, $\alpha=-B/T$, AND $\beta=f_c+B/2$. The results are the following equations representing the two chirps of one supersymbol:

$$s_{up}(t)=\exp(2\pi j((B/T)t^2+(f_c-B/2)t+c)),\ 0\le t<T$$

$$s_{down}(t)=\exp(2\pi j((-B/T)(t-T)^2+(f_c+B/2)(t-T)+\gamma)),\ T\le t<2T$$

Here $-1/2 < c, \gamma < 1/2$. Then the supersymbol S(t) of length m is defined as the concatenation of m pairs of up and down chirps with identical up and down phases c and $\gamma$ as:

$$S(t)=[s_{up}(t)_1, s_{down}(t)_1, s_{up}(t)_2, s_{down}(t)_2, \ldots, s_{up}(t)_m, s_{down}(t)_m]$$

Then the packet is formed by including multiple pairs of contiguous sections made up of supersymbols (referred to hereinafter as "timing header/position prediction slots"), which timing header/position prediction slots occur at a rate defined by the platform dynamics. Each position prediction section may include one or more supersymbols. Each timing header also is made up of supersymbols. When a supersymbol of length m is used, the length can be adjusted to meet much lower SNR requirements than the communications channel.

Figure 8:
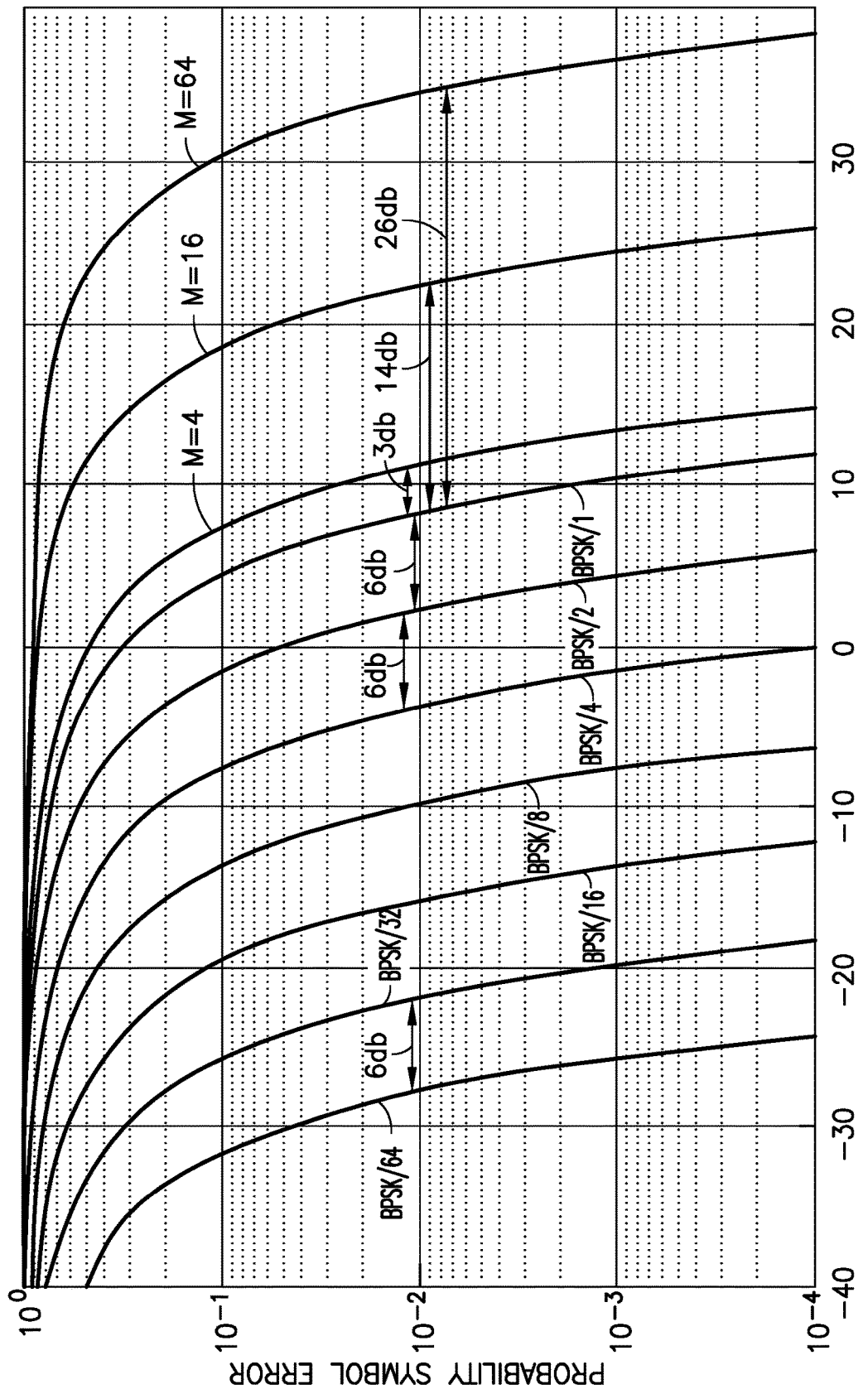
FIG. 8 is a graph of the probability of symbol error versus relative SNR (dB) as a function of supersymbol length derived by computer simulation.

The symbol error as a function of supersymbol length is illustrated in FIG. 8, which graph depicts results of a computer simulation of the probability of symbol error versus relative SNR (dB) for different supersymbol lengths. This graph shows how moving from a high multiphase shift-keyed (MPSK) modulation symbol (such as might be used for high-data-rate communications) having 64 MPSK modulation phases per symbol (M=64) down to a binary phase shift-keyed (BPSK) modulation symbol having two phases per symbol (M=2) produces an improvement in the SNR of 26 dB. Further improvements to the SNR can be achieved by increasing the symbol length m. FIG. 8 shows the symbol error as a function of lengthening of the symbols by factors of 2 (that is, keeping the modulation type BPSK and lengthening the symbols by factors of 2). Each increment in symbol length causes a similar improvement of an additional 6 dB. This is indicated in FIG. 8 by curve labels in the form $BPSK/2^i$, which means that the denominator is 2 to the i-th power, where i in an integer that varies from 0 to 6 in FIG. 8. Thus the operation of the time transfer and position determination services can be pushed down by 20, 30, even 50 dB SNR in extreme cases as compared to the communications SNR.

The up and down phases of the supersymbols in each position prediction section in a packet are varied from one position prediction section to a next position prediction section to represent respective position predictions for the combined radar/communications system which were valid for respective durations of the associated (contiguous) timing headers included in the packet. In the case wherein a position prediction is associated with a timing header, the combined information provides a predicted position of a transmitting platform which was valid for the duration of the timing header transmission.

Figure 6B:
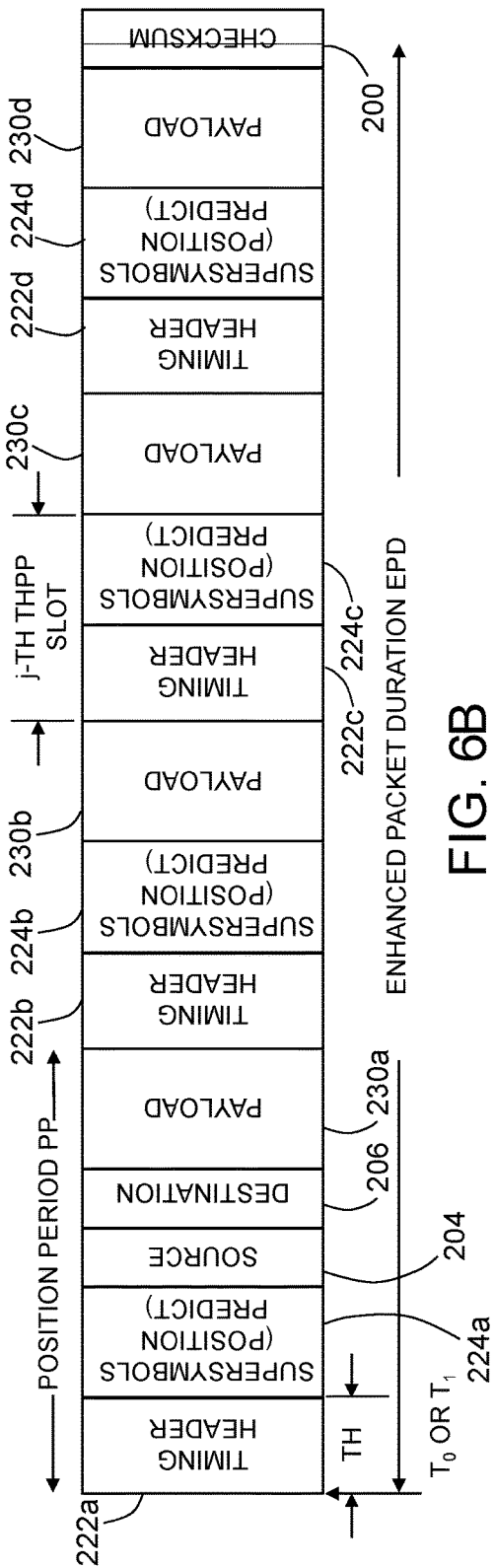
FIG. 6B is a diagram representing the format of an enhanced packet containing supersymbols.

FIG. 6B is a diagram representing the format of one example of an enhanced packet 220 containing four timing headers 222a-222d made up of supersymbols and four position prediction sections 224a-224d also made up of supersymbols. Each contiguous timing header and position prediction section with position prediction forms a respective timing header/position prediction (THPP) slot. The number of THPP slots in an enhanced packet 220 may be different than four. Depending on whether the enhanced packet 220 is being transmitted or received, the timing header 222a will start at time $T_0$ using the transmit clock or time $T_1$ using the receive clock. In accordance with the format depicted in FIG. 6B: position prediction section 224a is contiguous with timing header 222a; position prediction section 224b is contiguous with timing header 222b; position prediction section 224c is contiguous with timing header 222c; and position prediction section 224d is contiguous with timing header 222d. Each of the position prediction sections 224a-224d can have one or more supersymbols. It should be appreciated that the timing header 222a (see FIG. 6B) that replaces the standard header 202 (see FIG. 6A) at the start of the packet is made up of supersymbols. The purpose of constructing a timing header using supersymbols is described below.

Figure 9:
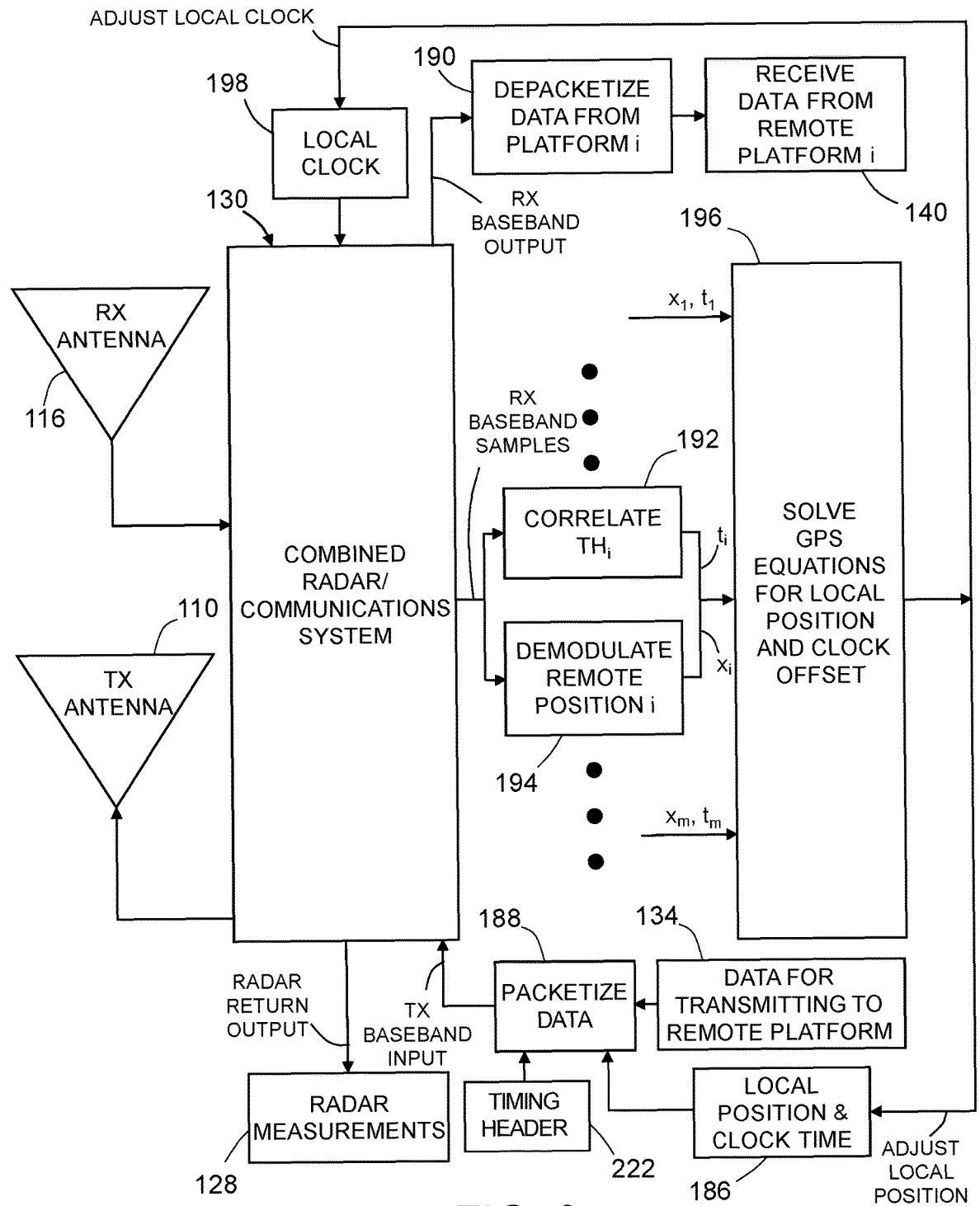
FIG. 9 is a block diagram identifying some components of a system for timing and position processing in accordance with one embodiment which has been added to (and may be incorporated in) a combined radar/communications system that transmits and receives using fixed antennas.

The enhanced packet 220 depicted in FIG. 6B further includes: source data 204 contiguous with position prediction section 224a; destination data 206 contiguous with source data 204; error correction-coded payload data 230a between destination data 206 and timing header 222b; error correction-coded payload data 230b between position prediction section 224b and timing header 222c; error correction-coded payload data 230c between position prediction section 224c and timing header 222d; and error correction-coded payload data 230d between position prediction section 224d and the checksum data 210 at the end of the enhanced packet 220. The lengths of the packet sections shown in FIG. 6B are not drawn to scale, meaning that the depicted lengths are not intended to represent the number of bits of data contained in each section. For example, the packet sections containing payload data may contain more bits of data FIG. 9 is a block diagram identifying some components of a time transfer and position determination system in accordance with one embodiment which has been added to (and may be incorporated in) the combined radar/communications system 130. In this example, the combined radar/communications system 130 transmits signals using a fixed transmission antenna 110 and receives signals using a fixed reception antenna 116. Each receiving platform may be configured as shown in FIG. 9 to receive time and position information from at least three similarly configured transmitting platforms and then use that broadcast information to calculate the time and position of the receiving platform.

Figure 17A:
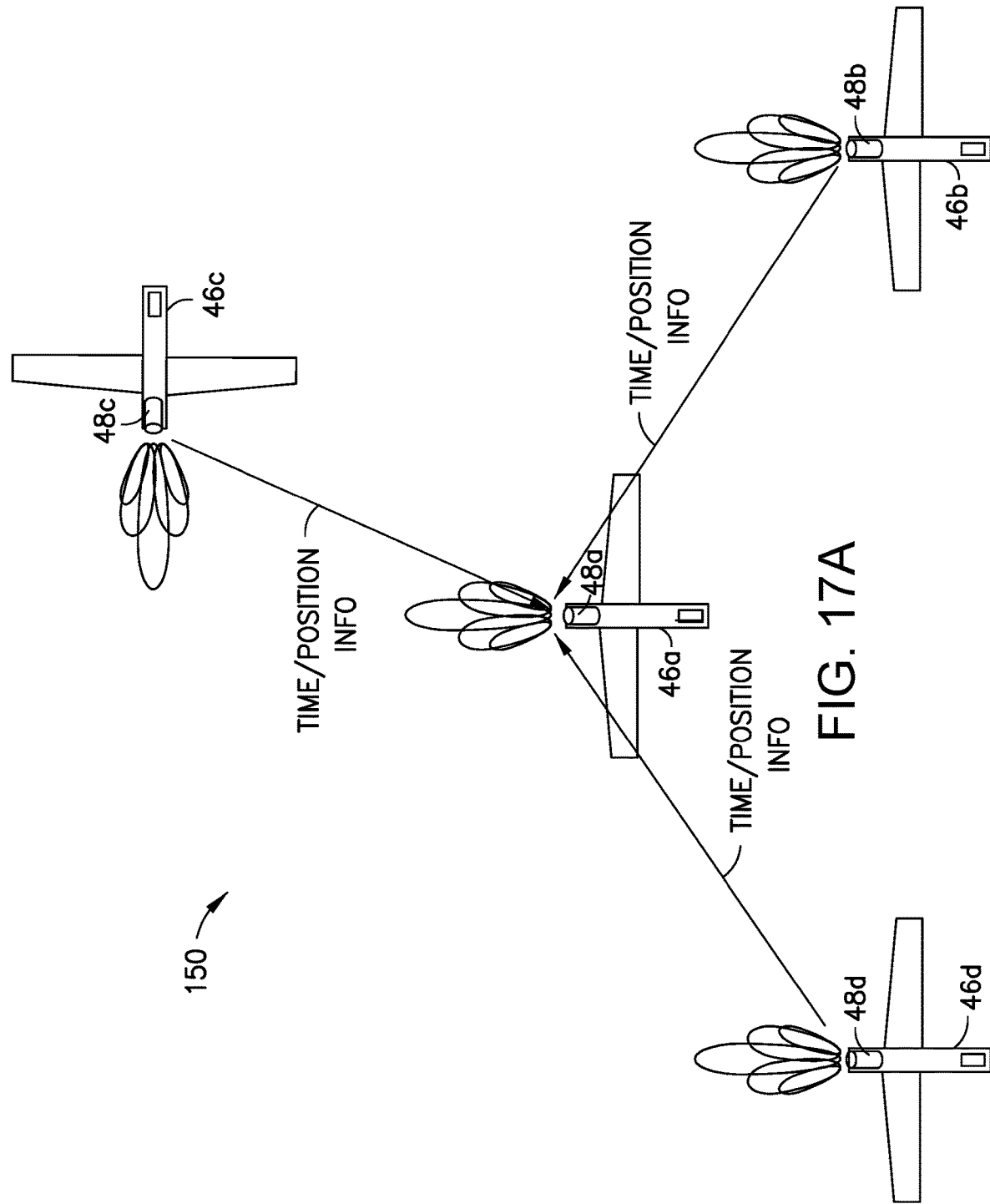
FIG. 17A is a diagram showing a first FMCW platform receiving time and position information from three other FMCW platforms in the course of concurrent combined radar and communications operations.

FIG. 17A is a diagram showing four radar systems 48a-48d respectively mounted on aircraft 46a-46d. Assume that the four radar systems 48a-48d are all operating concurrently while the aircraft 46a-46d are moving along their respective flight paths. More specifically, it is assumed that radar systems 48b, 48c and 48d are broadcasting signals containing time and position information for each aircraft. For example, the time and position information broadcast by the radar system 48b onboard aircraft 46b specifies the position of aircraft 46b at a first specified time. Likewise the time and position information broadcast by the radar system 48c onboard aircraft 46c specifies the position of aircraft 46c at a second specified time. Similarly, the time and position information broadcast by the radar system 48d onboard aircraft 46d specifies the position of aircraft 46d at a third specified time. The arrows in FIG. 17A indicate that these broadcast signals are being received by the radar system 48a onboard the aircraft 46a. A computer system onboard the aircraft 46a is configured to compute the local position and time offset of the radar system 48a using the timing and position information received from the radar systems 48b-48d. The time offset is used to adjust a local clock onboard the aircraft 46a. The computed local position of aircraft 46a may be used to compute the distance separating aircraft 46a from any one of the other three aircraft 46b-46d. With cooperating FMCW radar systems at known distances, some of these returns could be filtered using a demod/remod filter, as will be described in more detail below with reference to FIG. 17B.

Referring again to FIG. 9, communications data generated by a communications data source 134, local position data 186 and timing headers 222 are converted by a packetizing module 188 into enhanced packets (hereinafter "packetized") in accordance with the protocol depicted in FIG. 6B. The packetized data output by the packetizing module 188 forms the transmit baseband input to the CRCW waveform generator 106' (not shown in FIG. 9, but see FIG. 4) of the combined radar/communications system 130. The CRCW waveform generator 106' converts the packetized data into CRCW-modulated signals which are broadcast by the transmission antenna 110 of the platform.

The platform partly depicted in FIG. 9 also receives CRCW-modulated signals representing communications data broadcast by other platforms. The baseband communications signal processing module 138 (not shown in FIG. 9, but see FIG. 4) of the combined radar/communications system 130 is configured to decode the digitals signals to form the receive baseband output consisting of the set of symbols derived by the communications receiver that were received from the i-th transmitting platform, including time and position information for the i-th transmitting platform. The communications data 140 contained in the enhanced packets from the i-th transmitting platform is reconstructed by a de-packetizing module 190. Respective sets of communications data 140 received from multiple transmitting platforms are stored in a non-transitory tangible computer-readable storage medium.

The platform depicted in FIG. 9 further includes modules for processing raw digitized baseband samples being processed in the combined radar/communications system 130, which baseband samples are derived from enhanced packets transmitted by and received from other platforms. As previously described, the received enhanced packets contain information regarding the predicted positions of other transmitting platforms which are valid for the duration of the respective timing header transmissions. The modules for processing baseband samples include a timing correlation module 192 which uses correlation (described in detail below) to extract the timing information $t_i$ (i=1, 2, . . . , m, where m≥3) from respective timing headers received from the m transmitting platforms. The modules for processing baseband samples further include a position demodulation module 194 which uses demodulation to extract the position information $x_i$ (i=1, 2, . . . , m) from respective position predictions received from the m transmitting platforms. The timing and position information $(x_1, t_1), \ldots, (x_i, t_i), \ldots, (x_m, t_m)$ is then processed by time and position calculation module 196, which is configured to compute the local position and time offset of the receiving platform using the timing and position information received from at least three transmitting platforms. The local position data 186 is then included in subsequent transmissions by the combined radar/communications system 130, while the time offset is used to adjust the local clock 198.

For ease of comparison, FIG. 9 depicts modules 188, 190, 192, 194 and 196 which are external to the combined radar/communications system 130. However, all of these modules are preferably incorporated inside the combined radar/communications system 130 for the purpose of creating an enhanced combined radar/communications system 130.

The process for a receiving platform to estimate its own time and position from the information in an enhanced packet will now be described. For completeness, a standard process is described below which any receiving platform may use to estimate its position and time by receiving time and position information from a set of n platforms all broadcasting enhanced packets using the methodology described herein.

The first pieces of information that each receiver must receive are the updated positions of all n transmitting platforms. This comes in the form of a position prediction valid during the timing header transmission. In particular, every position prediction is a set of D bits sent in a position prediction section of an enhanced packet 220, corresponding to a standard constant acceleration motion equation:

$$r_{ij}(t) = r_{0ij} + r_{1ij}t + r_{2ij}t^2/2, \quad 0 < t < TH$$

where $r_{ij}(0)$ is the position at time $TH_0$ when the previous timing header was transmitted. Here $r$, $r_0$, $r_1$ and $r_2$ are three-dimensional vectors. Each vector has x, y, z components, with this equation representing motion of the i-th transmitting platform, and j is the slot index of the j-th such position prediction section within the packet as shown in FIG. 6B (e.g., position prediction section 224c is the third position prediction section from the start of the enhanced packet 220, in which instance j=3). As previously noted, each packet portion consisting of a timing header (in the form of supersymbols) and a contiguous position prediction section (also in the form of supersymbols) is referred to herein as a THPP slot, so that the j-th position prediction section is part of the j-th THPP slot. Note that other types of motion equations and even more complicated or simpler motion models are equally possible to support. Here the information sent in the j-th THPP slot of the enhanced packet would contain the x, y, z coordinates of each vector $r_0$, $r_1$, $r_2$ (or an equivalent form of the equation) as well as the time $TH_0$. The motion equation is valid over its j-th corresponding header transmission time (TH) on the transmitting platform and every position period PP the timing header and motion equations are retransmitted during the total enhanced packet transmission time. This allows more frequent position and time updates, required when platforms are moving unpredictably (unlike GPS satellites whose motion can be predicted years in advance).

The second piece of information that each receiver must estimate is the time of arrival of the timing header from each transmitting platform to a receiving platform. The j-th timing header (as shown in FIG. 6B) is sent out at time $H_j$ according to the transmitter clock from all of the transmitting platforms. This timing header consists of a sequence of supersymbols with good autocorrelation properties. The sequence could be the same across all platforms within the common timing and position network. Or the sequence could be specific to each platform. In the latter case, the sequence must be communicated to all other participating platforms. Hence the latter type of operation requires more complexity and overhead than simply using a single agreed-upon sequence. This disclosure henceforth assumes that the sequence is the same across the network; thus the time duration TH is also known. Standard sequences with good autocorrelation properties are the Barker codes as shown in Table 1 below.

TABLE 1

| Length | Codes | Sidelobe Level Ratio (dB) |
|---|---|---|
| 2 | +1 −1 | −6 |
| 3 | +1 +1 −1 | −9.5 |
| 4 | +1 +1 −1 +1 | −12 |
| 5 | +1 +1 +1 −1 +1 | −14 |
| 7 | +1 +1 +1 −1 −1 +1 −1 | −16.9 |
| 11 | +1 +1 +1 −1 −1 −1 +1 −1 −1 +1 −1 | −20.8 |
| 13 | +1 +1 +1 +1 +1 −1 −1 +1 +1 −1 +1 −1 +1 | −22.3 |

For longer sequences, one can use maximum length sequences, which are a type of pseudorandom binary sequence. Note that the received sequence is correlated against the known sequence to measure the relative time delay of the timing header between remote transmitting and local receiving clocks. The final clock time that is used for setting the local time is based on this relative time delay together with the remote clock time ($TH_0$) communicated within the THPP slot. This aspect is described in more detail below.

The timing header arrives at a receiving platform i at some later time $h_{ji}$ according to the receiving clock. The time delay $t_{ij} = h_{ij} - H_j$ depends on the distance and propagation velocity, as well as the receiver clock offset, which is unknown. Note that this is different from GPS in that the signals from each satellite being correlated are unique to that satellite. In the system disclosed herein, each signal occupies a different frequency band. By having a single known timing header, new transmitting platforms can join the position/timing network at will (unlike the GPS satellite system where all the satellite information must be known a priori). Succeeding timing headers and position predictions in the packet are handled in the same manner.

The standard "GPS" equations allow a solution for both time and position of the receiving platform as follows. Let c be the RF propagation velocity (speed of light in the medium under consideration). Then the following equations must be solved for each of the j THPP slots:

$$|a_j - x_{ij}| + b_j = ct_i, \quad i = 1, 2, \ldots n.$$

Here $a_j = (a_1, a_2, \ldots, a_d)^T$ is the (unknown) position vector of the receiving platform (in d dimensions, which is typically d=3); $x_{ij} = r_{ij}(TH/2)$ is the position vector of the i-th transmitting platform at the center time of timing header transmission for the j-th THPP slot within the enhanced packet 220; and b is the unknown time (clock) offset. By sending the motion model, this can also be used to compute the Doppler frequency during each timing header transmission and hence to get a better correlation and time of arrival. These equations can be solved either by iteration or directly or by using a combination of iteration and direct solution. For the purpose of illustration, a direct method is described in what follows. The index j is dropped since the processing is identical for all of the THPP slots.

Moving b to the other side of the equation and squaring gives:

$$a^T a - 2x_i^T a + x_i^T x_i = (ct_i)^2 - 2b(ct_i) + b^2.$$

Rearranging this equation gives:

$$x_i^T a - b(ct_i) = (a^T a - b^2)/2 + (x_i^T x_i - (ct_i)^2)/2.$$

Define the following matrix:

$$\beta = \begin{pmatrix} 1 & 0 & \cdots & 0 \\ 0 & 1 & \cdots & 0 \\ \vdots & \vdots & \ddots & 0 \\ 0 & 0 & \cdots & -1 \end{pmatrix}$$

Then the vector $z=(a, b)^T$ of unknowns satisfies the following equation:

$$z^T \beta z = a^T a - b^2$$

and $h_i = (x_i, ct_i)^T$ satisfies the following equation:

$$h_i^T \beta h_i = x_i^T x_i - (ct_i)^2.$$

This gives:

$$h_i^T \beta z = z^T \beta z/2 + h_i^T \beta h_i/2.$$

Set the matrix $H = (h_1^T, h_2^T, \ldots, h_n^T)^T$ and the scalar unknown $\lambda = z^T \beta z/2$. Set $u = (H^T)^{-1} (1, 1, \ldots, 1)^T$ and $$v = (H^T)^{-1} (h_1^T \beta h_1, h_2^T \beta h_2, \ldots, h_n^T \beta h_n)^T/2.$$

Then $$\beta z = \lambda u + v$$

and $$\lambda = z^T \beta z/2$$

are two equations both satisfied by the unknown $\lambda$. Solving yields:

$$z^T \beta z = (\lambda u + v)^T \beta (\lambda u + v) = 2\lambda$$

Or $$(u^T \beta u) \lambda^2 + 2(u^T \beta v - 1)\lambda + (v^T \beta v) = 0$$

which is a quadratic equation in $\lambda$. Then the unknowns a and b can be solved using the following equation:

$$\begin{pmatrix} a \\ b \end{pmatrix} = z = \lambda u + v$$

This result gives both the position of the receiver a and the time offset b (so that its clock can be adjusted). Note that there may be two solutions for the quadratic equation, yielding two different possible position for a. This ambiguity can be resolved based on previous positions. Note that the time offset b is the time difference between the remote clock and the local clock for the current timing header. To set/update the local clock with the actual synchronized time, the clock time $TH_0$ included in the THPP slot is used together with this time offset b.

Figure 10:
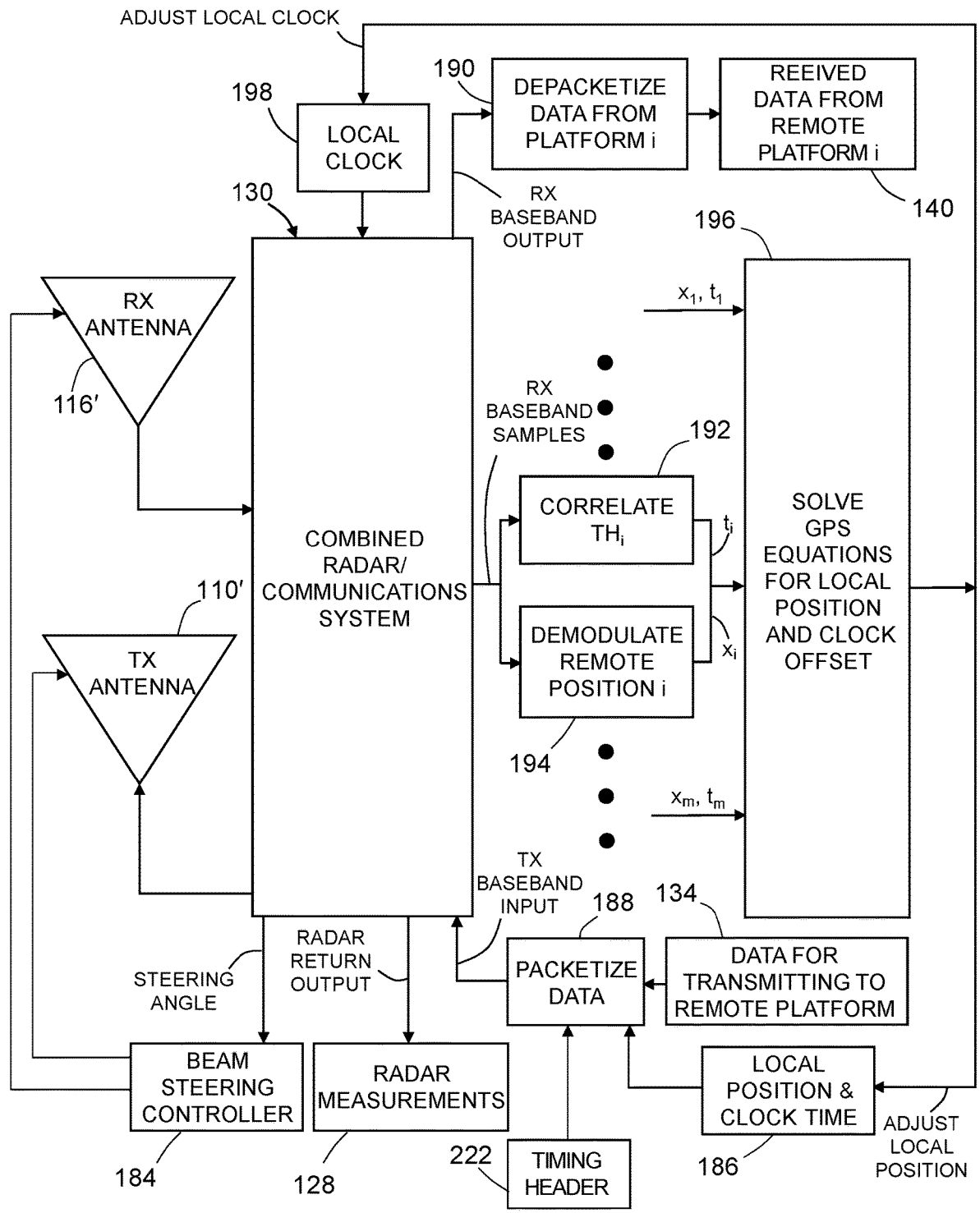
FIG. 10 is a block diagram identifying some components of a system for timing and position processing in accordance with another embodiment which has been added to (and may be incorporated in) a combined radar/communications system that transmits and receives using steerable antennas.

FIG. 10 is a block diagram identifying some components of a time transfer and position determination system in accordance with another embodiment which has been added to (and may be incorporated in) a combined radar/communications system 130 that transmits and receives signals using steerable antennas instead of fixed antennas as shown in FIG. 9. The system depicted in FIG. 10 further differs from the system depicted in FIG. 9 by the addition of a beam steering controller 184. The beam steering controller 184 comprises a processor or computer that is configured (e.g., programmed) to compute a steering vector that controls the directions of the steerable antennas based on a steering angle received from a system controller (not shown in FIG. 10) of the combined radar/communications system 130. The steering angle is selected to facilitate the transmission of signals in a particular direction using a steerable transmission antenna 110' and the reception of signals from that particular direction using a steerable reception antenna 116'.

In accordance with a further aspect of the methodology disclosed herein, performance is optionally enhanced through the use of intentional beam jitter. More specifically, sidelobe operation of the time/position service (as well as the communications service or any other signal service taking place through the sidelobes of the antenna pattern) is enhanced using intentional beam jitter. For example, during operation of a radar system while using the sidelobes of the beam pattern to communicate with other platforms (including the time/position service being described), the signal being received through the sidelobes is much weaker than the signal of the mainbeam (a.k.a., main lobe).

Figure 11:
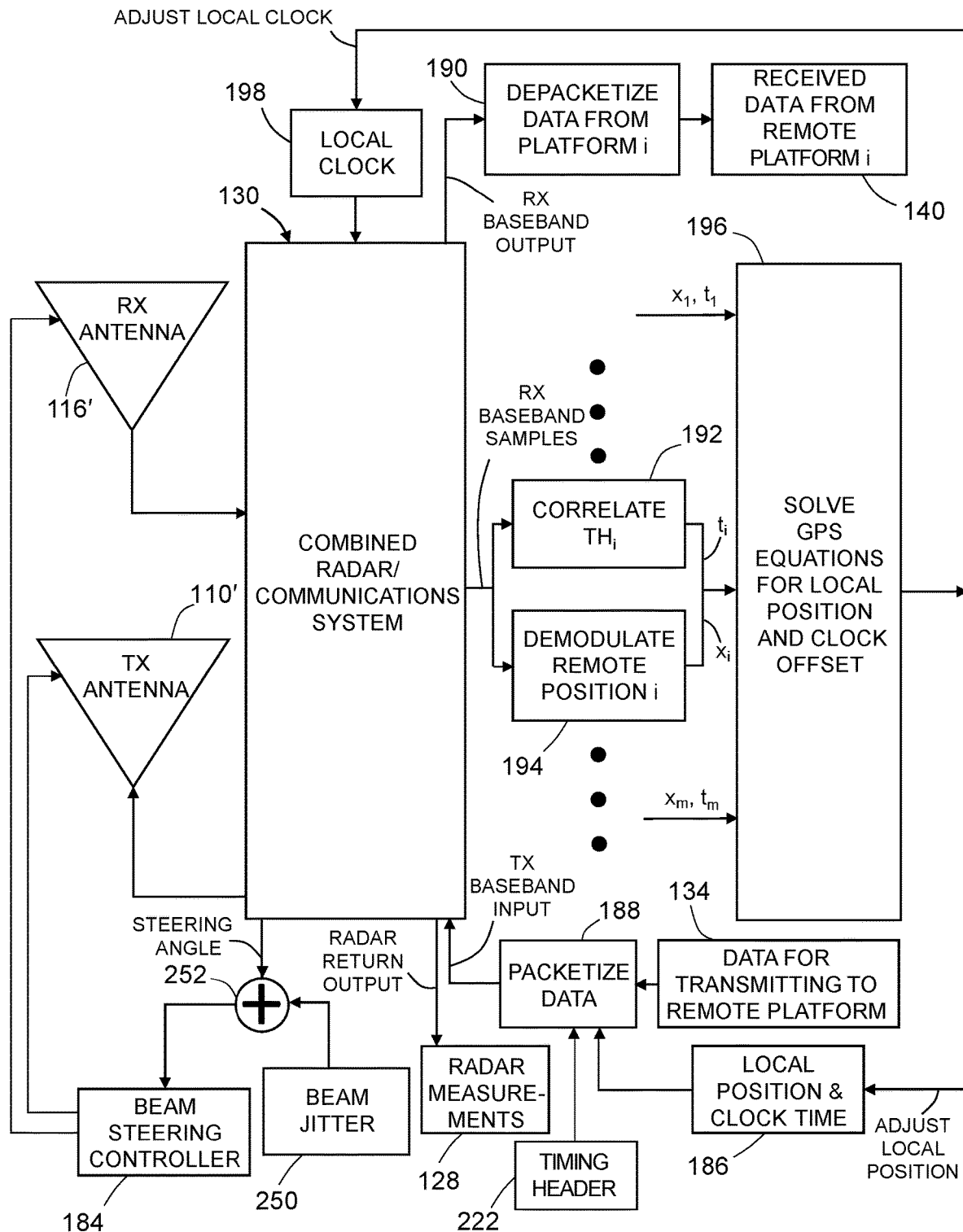
FIG. 11 is a block diagram identifying the same components identified in FIG. 10, but with the addition of an intentional beam jitter subsystem in accordance with a further embodiment.

FIG. 11 is a block diagram identifying the same components identified in FIG. 10, but with the addition of a beam jitter subsystem 250 in accordance with a further embodiment. This beam jitter subsystem 250 is configured to intentionally apply angle jitter to the steerable transmission antenna 110' to enhance performance as described in the immediately preceding paragraph.

Figure 12:
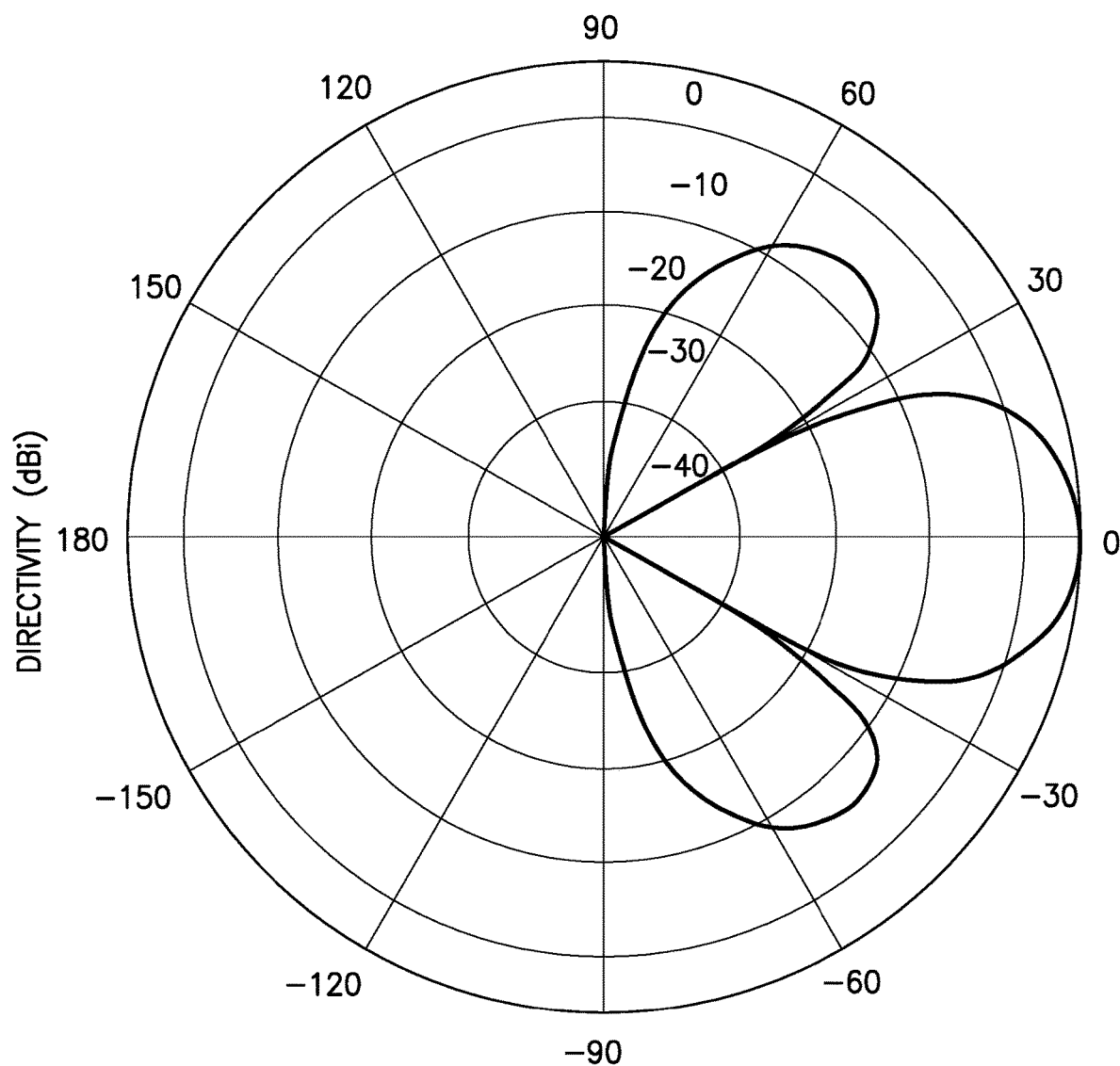
FIG. 12 is a polar plot of a normalized antenna radiation pattern for a uniform linear array having four elements with 0-degree boresight pointing angle with a ground plane that eliminates any backside radiation.

To provide a specific example, it will be assumed that the type of antenna being used is a uniform linear array, but any other type of antenna that can be rapidly and dynamically pointed to a desired direction can be used. FIG. 12 shows an example of an antenna radiation pattern in polar form for a vertical uniform linear array with four elements with 0-degree boresight pointing angle with a ground plane that eliminates any backside radiation.

Figure 13:
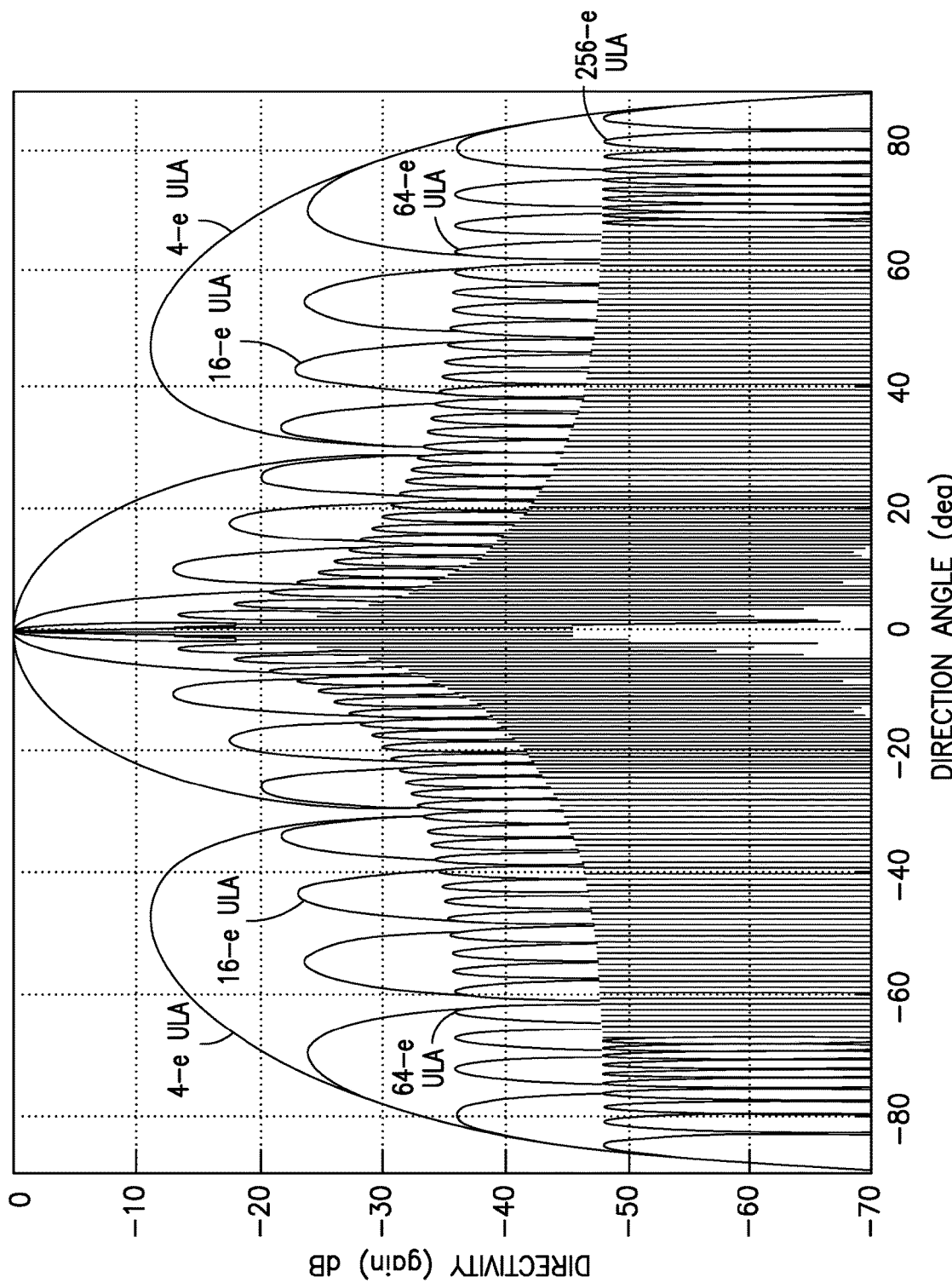
FIG. 13 is a graph showing how the plots (plotted in rectangular coordinates) of normalized antenna radiation patterns (directivity versus direction angle) vary with array size for simulated uniform linear arrays with 4, 16, 64 and 256 elements respectively.
Figure 14:
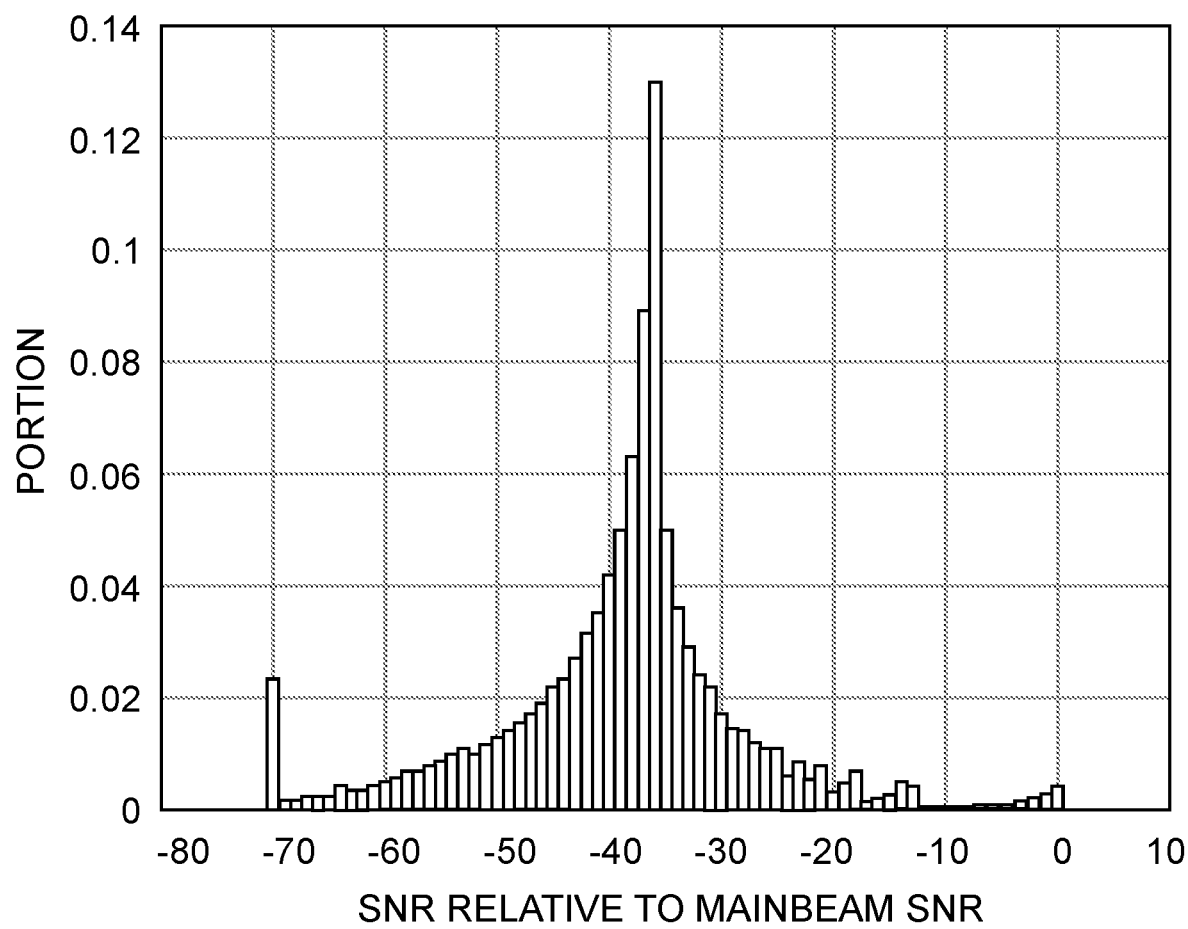
FIG. 14 is a graph showing the angular distribution of SNR relative to the mainbeam for a simulated uniform linear array having 64 elements.

More generally, FIG. 13 shows the pattern of various uniform linear arrays having a number of elements in a range from 4 to 256, showing how the beam width and sidelobes vary with array size and plotted in rectangular coordinates. As seen in FIG. 13, the sidelobes can impact the SNR by 40 or 50 dB or more compared to the mainbeam. What is even worse is that for many azimuth angles, the pattern has nulls and drops rapidly in power, creating situations where badly placed platforms may have a much worse SNR than even the typical sidelobe level at certain angular locations. For example, with a uniform linear array of 64 elements, the distribution of SNR relative to the mainbeam is shown in FIG. 14. In this figure, almost half of the spatial angles have relative SNRs below −40 dB, with over 2% of the angles having a relative SNR impact of more than 70 dB.

Intentional beam jitter solves this problem by increasing the minimum SNR rather than having "nulls" in the signal coverage. The effect is to slightly reduce the mainbeam power; this can be balanced by choosing the jitter angle sequence appropriately. Beam jitter uses a clock that is J times faster than the sample clock for the transmitter and receiver. The integer J≥2 is chosen to meet system requirements; common values are 2 or 3.

Figure 15:
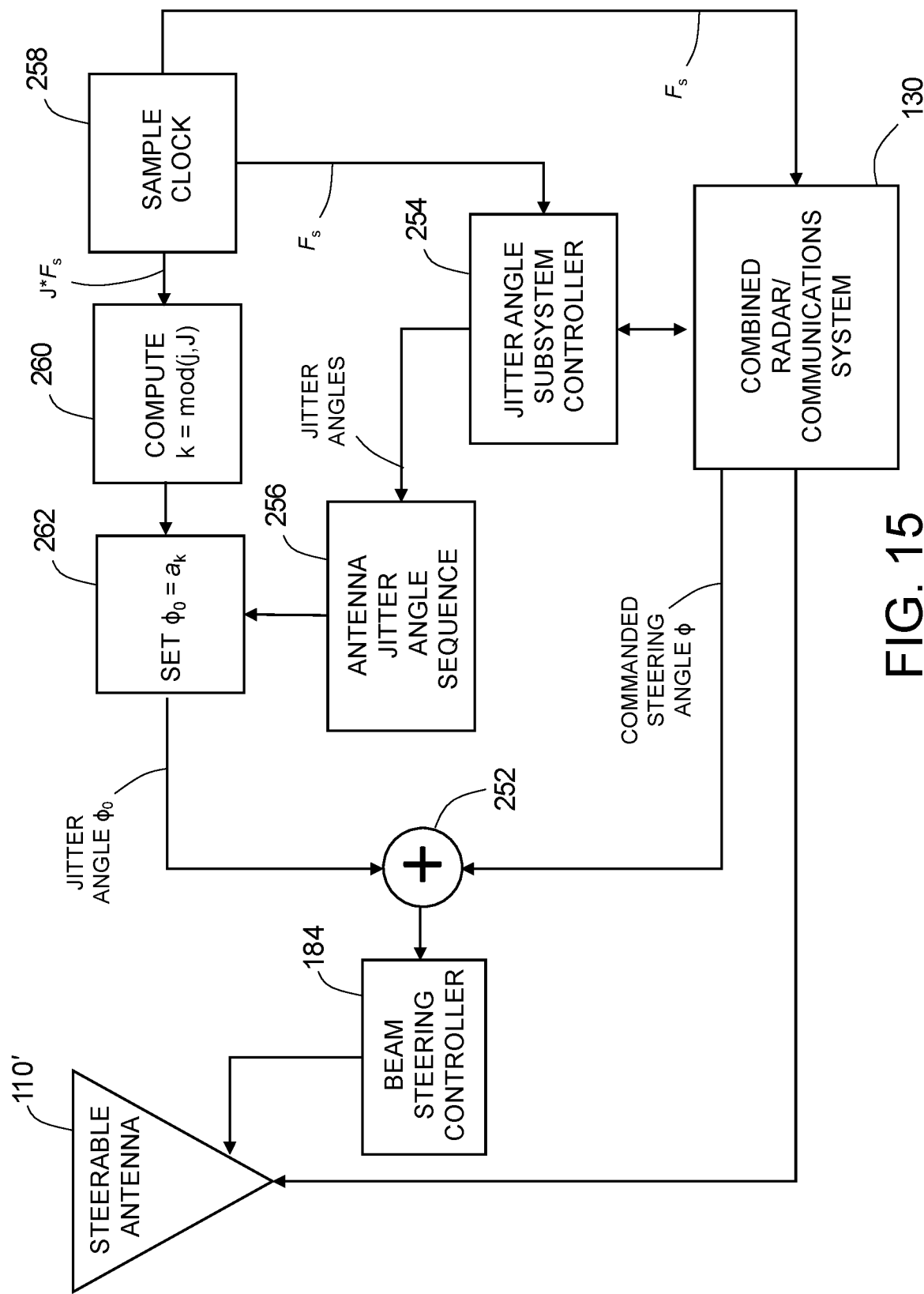
FIG. 15 is a block diagram showing the operation of an intentional beam jitter system that is part of a combined radar/communications system.
Figure 16A:
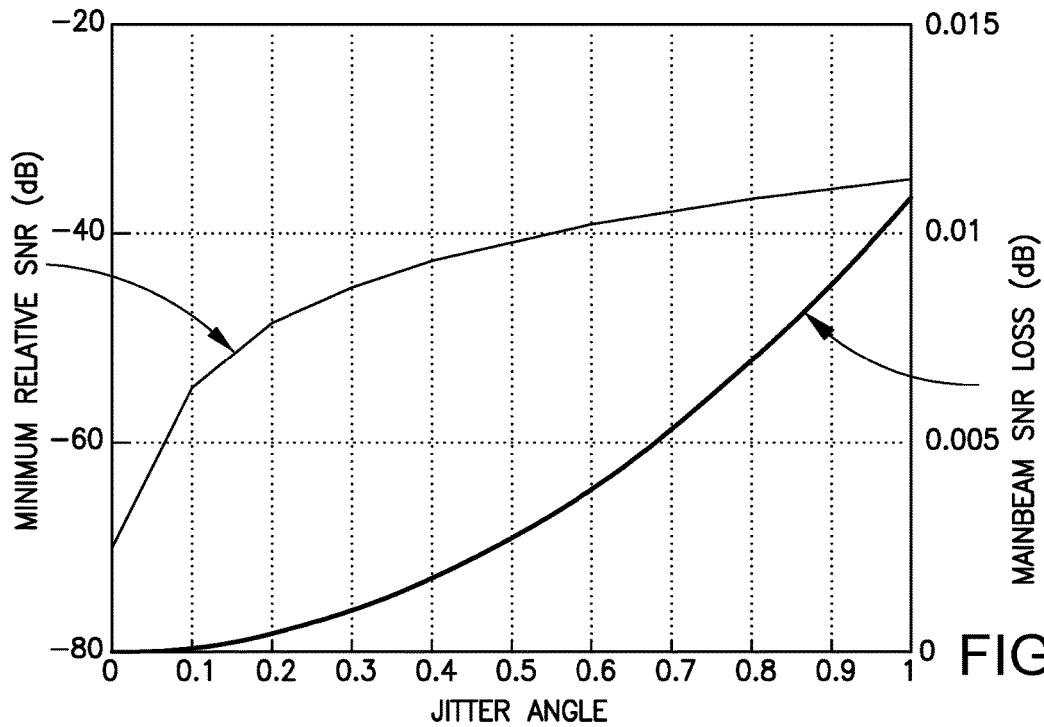
FIGS. 16A through 16D are graphs showing the effects of intentional beam jitter on both sidelobe and mainlobe performance for simulated uniform linear arrays with 4, 16, 64 and 256 elements respectively for a frequency of 800 MHz.
Figure 16B:
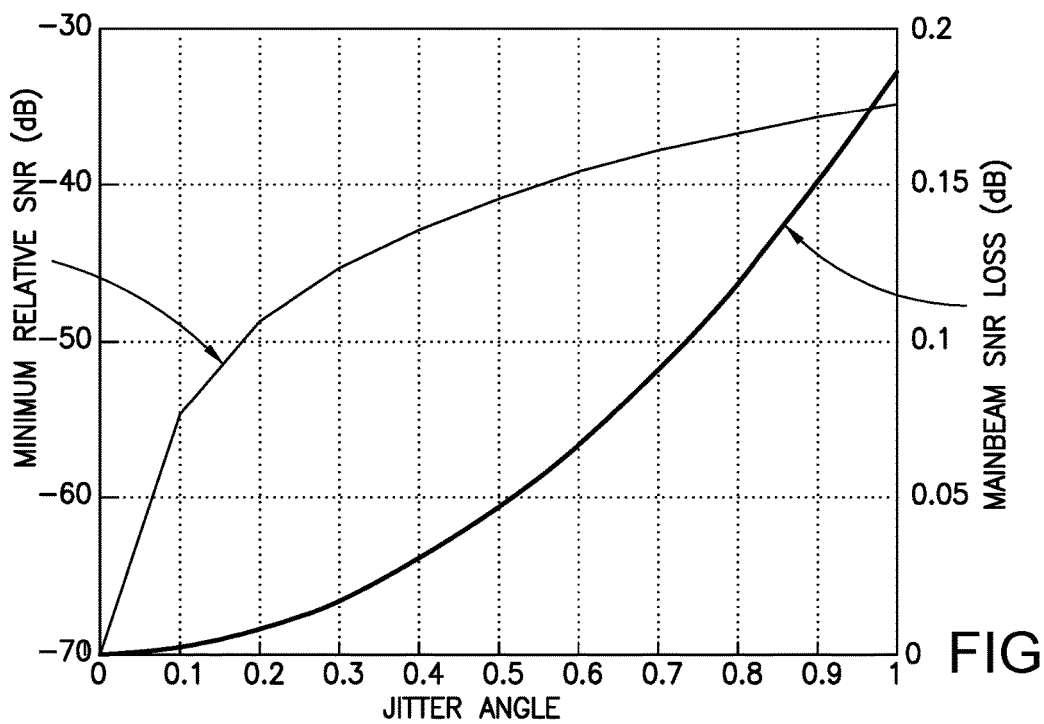
Figure 16C:
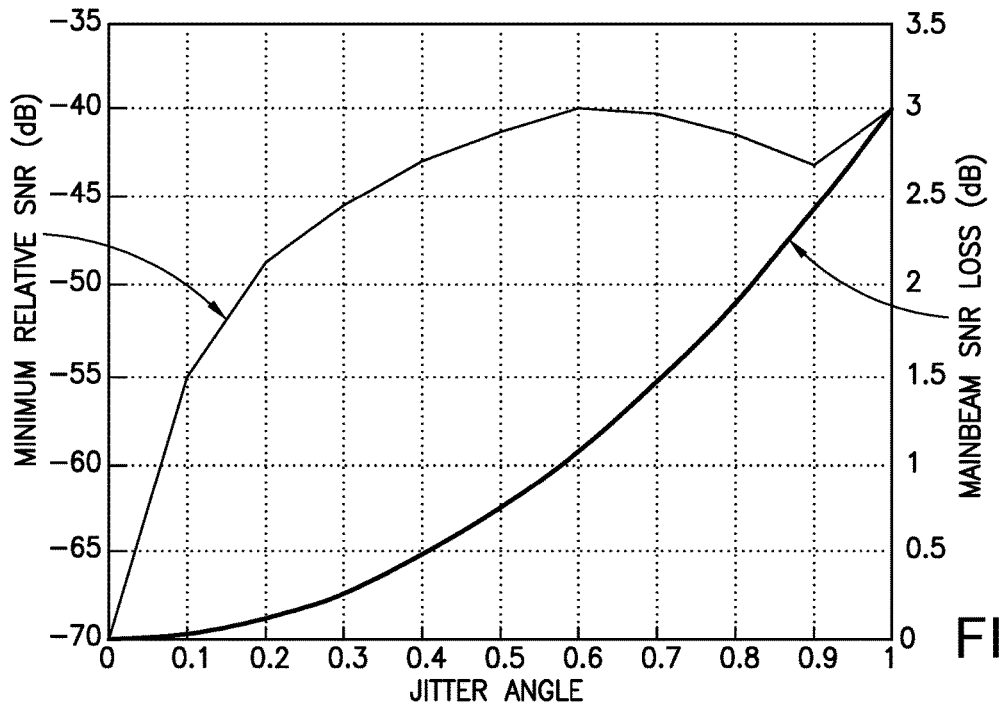
Figure 16D:
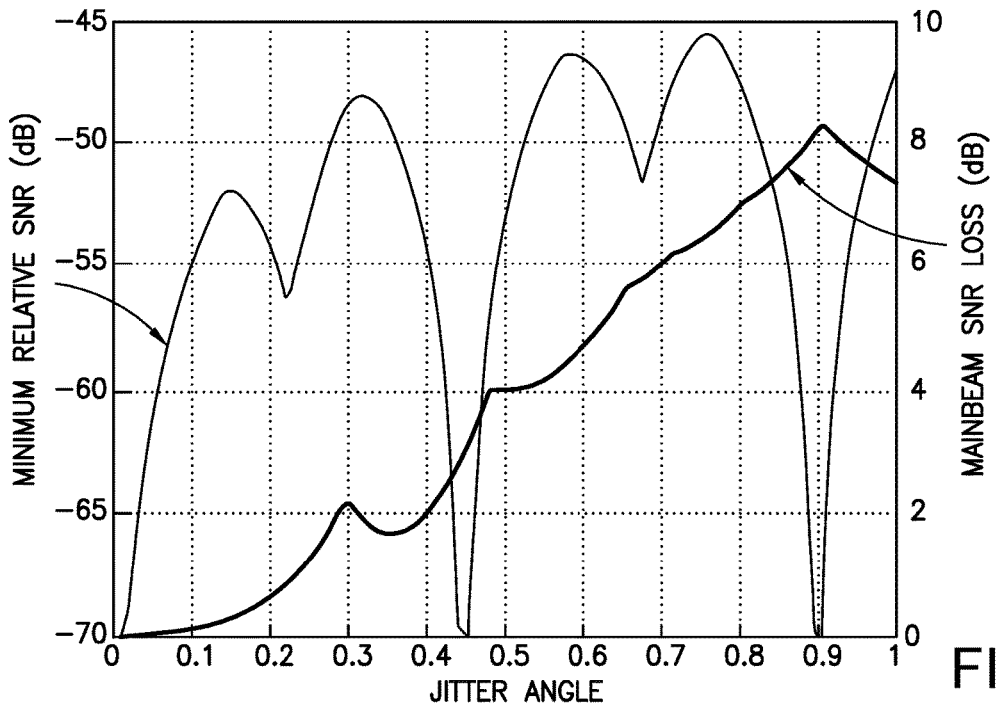

FIG. 15 is a block diagram identifying components of a beam jitter subsystem 250 that is added to (and may be incorporated in) a combined radar/communications system 130. However, this same approach can be used in any sidelobe broadcast of a signal where SNR control is desired.

As depicted in FIG. 15, the system controller of the combined radar/communications system 130 generates a commanded steering angle ϕ, representing the desired direction of the steerable transmission antenna 110'. This commanded steering angle ϕ is intentionally altered using beam jitter calculated to enhance performance of the overall system. The combined radar/communications system 130 also communicates with a jitter angle subsystem controller 254, sending commands to point the beam to specified angles based on system needs, such as tracking friend or foe or scanning. Both the transmitter antenna beam and receiver antenna beam must be jittered to ensure that their respective antenna nulls are not at the angle of the other antenna.

In accordance with one embodiment, the beam jitter subsystem 250 operates as follows. The jitter angle subsystem controller 254 loads the desired antenna jitter angle sequence 256 at the beginning of each operation. At each clock signal of frequency $F_s$ (the sample rate) from the sample clock 258, a modulo operator 260 computes k=mod (j, J), meaning that the modulo operator 260 finds the remainder k after division of number j by the number J. The next jitter angle $\phi_0 = a_k$ from the antenna jitter angle sequence $\{a_0, a_1, \ldots, a_k, \ldots, a_{J-1}\}$ is chosen at a rate of $J*F_s$ by a jitter angle setting module 262 and then added to the commanded steering angle $\phi$ by a summer 252. The sum $\phi+\phi_0$ output by summer 252 is then used by the beam steering controller 184 to compute a steering vector that controls the direction of the steerable transmission antenna 110'. The beam steering controller 184 computes a steering vector that controls the direction of the steerable reception antenna 116' in a similar manner. The pointing angle thus changes at a rate J times the sample rate $F_s$ of the transmitter and receiver, causing an averaging effect on each sample.

The performance improvement due to intentional beam jitter is shown in FIGS. 16A-16D for uniform linear arrays having a respective number of elements equal to 4, 16, 64 and 256 with J=3. A system designer would choose the angle sequence based on the performance given by such a simulation based on the actual antenna response. The angle sequence used in FIGS. 16A-16D is {−a, 0, a}, where the value of a is the x-axis value labeled "Jitter Angle" (jitter angle is in degrees in FIGS. 16A-16D). Alternative sequences could be {−a, a} with J=2 or even longer sequences depending on the desired performance. The system designer would weigh the improvement in minimum SNR over the mainbeam loss and choose an appropriate level of jitter. For example, with a uniform linear array including 64 elements, one could achieve a 27-dB improvement in minimum SNR at the expense of a 0.5-dB loss in mainbeam performance with a jitter sequence of {−0.4°, 0°, 0.4°} (see FIG. 16C).

A combined radar/communications system configured as described above has the following advantageous features: (1) time transfer and position determination are enabled by the broadcast of signals; (2) the time transfer and position determination services can operate at the same time as operation of either or both radar and communications functions; (3) the time transfer and position determination services can operate at much lower signal-to-noise levels (i.e., at much greater ranges) than the communications functions; (4) platforms can easily join or leave the timing and position network due to operation on different frequencies; and (5) further improvements in signal coverage can be achieved through intentional beam jitter. These features may be employed beneficially in many RF applications for networks of platforms that require both radar and communications functions.

The foregoing features provide benefits for many cross-platform applications that require simultaneous radar and communications. For example, the principles of operation described above may be employed in applications involving wide-band signal generation that can be applied to software-defined radio systems, satellite and ground communications systems and radar systems.

If FMCW radar systems are operated at the same frequency with the same chirp slopes, each radar system can interfere with every other radar system. In accordance with one embodiment of the method proposed herein, a three-step technique is used to significantly reduce such interference: (1) synchronize the time and frequency of all cooperating radar systems; (2) allocate pulse start times for each radar system; and (3) use a demod/remod filter to reduce chirp interference from cross-radar interference.

The first step to reduce interference is to create cooperative operation of the FMCW radar systems by requiring that all radar systems be synchronized in time and frequency (of transmission). This can be done through one of several techniques:

Each platform has clocks that are sufficiently stable that they remain synchronized throughout the radar operation.

Each platform synchronizes its own clock using GPS.

Each platform synchronizes its own clock using the time and position service implemented as described previously herein. This produces time offsets between the local clock of each radar and the synchronized time computed from the master radar's enhanced message packets. This sequence of time offsets is used to adjust the local clock frequency so that future time offsets are driven to very small values.

Figure 17B:
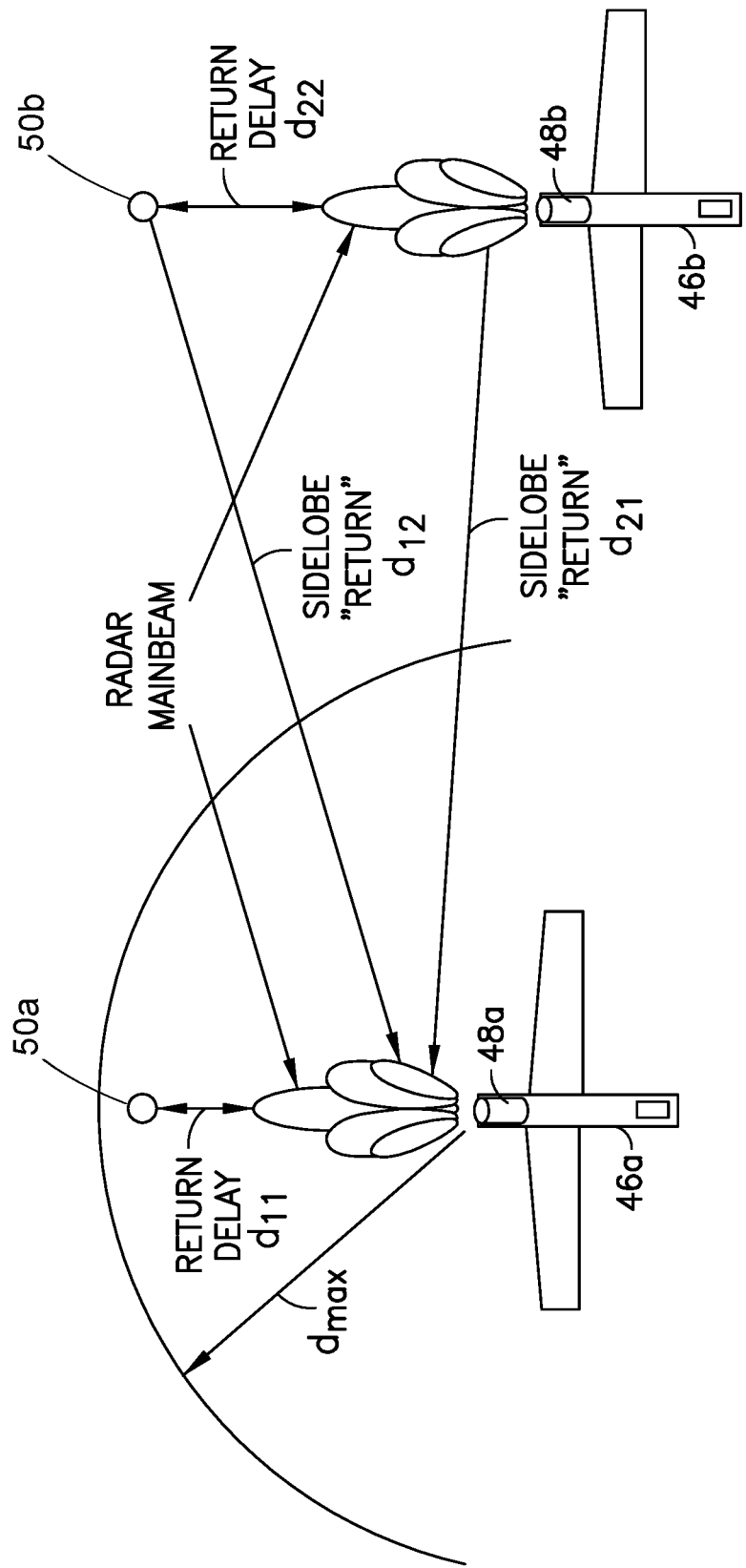
FIG. 17B is a diagram showing two FMCW platforms with their interfering radar "returns".

The synchronization of each of the radar systems allows both the transmission time of each transmitted chirp (or communications symbol) or chirp pair (see FIG. 2A) and the transmission frequencies to be precisely controlled across all platforms within this cooperative FMCW network. This synchronization by itself does not eliminate the cross-radar interference, but subsequent processing of the interfering returns is configured to constrain the interfering returns so that the return delays have specific interpretations. A simple case depicted in FIG. 17B is used to illustrate this point. Note that the propagation delay d corresponding to a range R is $d=R/v_c$, where $v_c$ is the velocity of the RF signals.

FIG. 17B shows four radar returns for two radar systems 48a and 48b (one mounted on an aircraft 46a and the other mounted on an aircraft 46b) which are both operating at the same time while aircraft 46a and 46b are moving along respective flight paths. Three of the four radar returns depicted in FIG. 17B are seen by radar system 48a. Suppose that both radar systems 48a and 48b are synchronized and transmit respective FMCW pulses at the same time at the same frequency and same chirp slope. Then the return delays of the four radar returns are interpreted as follows:

The first FMCW pulse transmitted from radar system 48a (onboard aircraft 46a) is reflected off of object 50a after a delay $d_{11}$ and a return signal is reflected back to radar system 48a after a further delay $d_{11}$, resulting in a return delay of $2d_{11}$ subsequent to transmission of the first FMCW pulse. The return delay of $2d_{11}$ corresponds to twice the range $R_{11}$ to object 50a, i.e., $d_{11}=R_{11}/v_c$.

The second FMCW pulse transmitted directly from radar system 48b (onboard aircraft 46b) to radar system 48a at the same time when the first FMCW pulse was transmitted has an apparent delay of $d_{21}=R_{21}/v_c$, where $R_{21}$ is the range from radar system 48a to radar system 48b.

In addition, the second FMCW pulse transmitted from radar system 48b is reflected off of object 50b after a delay $d_{22}$ and a return signal is reflected to radar system 48a after a further delay $d_{12}$, resulting in an apparent delay (from the vantage point of radar system 48a) of $d_{12}+d_{22}=(R_{12}+R_{22})/v_c$ where $R_{12}$ is the range from radar system 48a to object 50b and $R_{22}$ is the range from radar system 48a to object 50b.

Lastly, the second FMCW pulse transmitted from radar system 48b is reflected off of object 50b after a delay $d_{22}$ and a return signal is reflected back to radar system 48b after a further delay $d_{22}$, resulting in a return delay (from the vantage point of radar system 48b) of $2d_{22}$, where $d_{22}=R_{22}/v_c$ where $R_{22}$ is the range from radar system 48b to object 50b.

Thus, the radar system 48a onboard aircraft 46a sees three returns at delays $2d_{11}$, $d_{21}$ and $d_{12}+d_{22}$, only one of which is a direct reflection of the first pulse transmitted by radar system 48a back to radar system 48a. The other two "fake" returns come through the sidelobes of radar system 48a, but can have significant power, even as much power as the direct return with delay $2d_{11}$. Even though the $d_{21}$ return could be filtered out using a notch filter since the range between the platforms is known, the return $d_{12}+d_{22}$ could not be filtered out because the range to object 50b is unknown. Using notch filters in that manner would also cause blind ranges when objects of interest have the same range as other radar systems, and thus would be undesirable. In general, each radar system could have many possible other returns (both direct and indirect) from the N−1 other radar systems and other reflecting objects.

The second step is to allocate pulse start times across the N cooperating FMCW radar systems. Let the maximum return range be $R_{max}$ so that $d_{max}=2R_{max}/v_c$ is the maximum delay. Then if radar system 48b delayed its pulse start time by $d_{max}$; $d_{21}$ would become $d_{21}+d_{max}$ and $d_{12}+d_{22}$ would become $d_{12}+d_{22}+d_{max}$ as seen by radar system 48a while $d_{11}$ would remain unchanged. Thus the other returns would fall outside of the return delay range [0; $d_{max}$] for radar system 48a and so would be ignored by a low (high) pass frequency filter for up (down) chirps tied to the frequency range corresponding to this delay range. Thus, a notch filter is not necessary as well.

What is described above only applies when each radar system is sending a chirp with the same frequency and chirp slope at a given symbol time. When different symbols are transmitted having different chirp slopes, interference is caused when the interfering returned chirp is mixed with a chirp of a different rate, causing a chirped interfering signal with a rate being the difference of the two chirp slopes. This is a wide-band interfering signal in the receiver that cannot be easily filtered out in the frequency domain. To solve this problem, the methodology proposed herein includes the third step, which is to employ a demod/remod filter that reduces the chirp interference due to cross-radar interference by first demodulating all possible chirped symbols except the current one for the receiver and subtracting out the sum of all the chirps detected before proceeding with the frequency filter.

Figure 18:
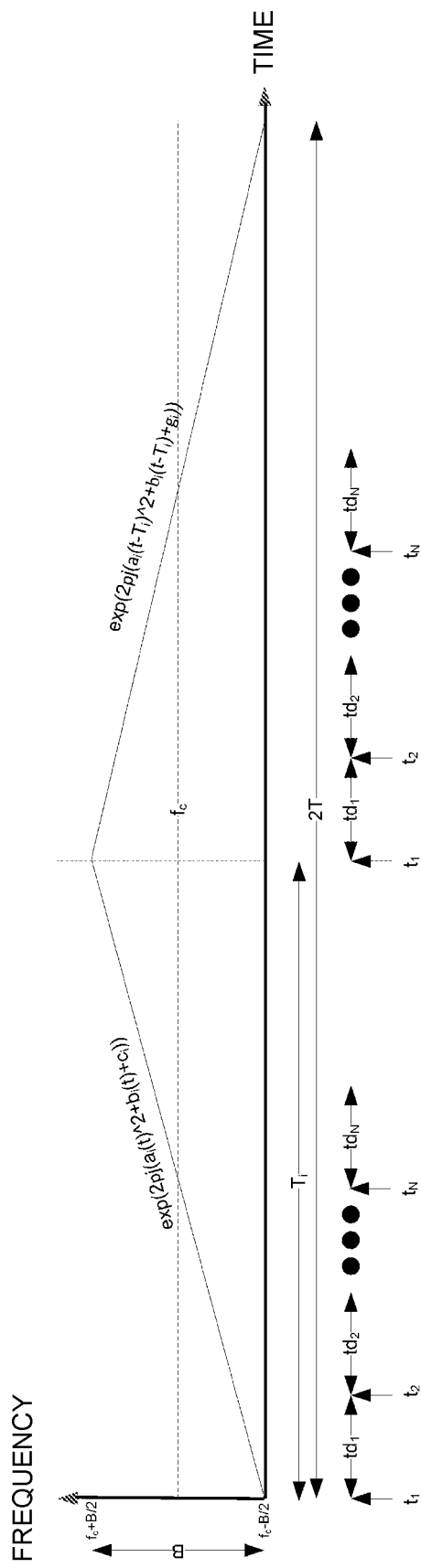
FIG. 18 is a graph showing start times and delay ranges for a distributed FMCW system.
Figure 19:
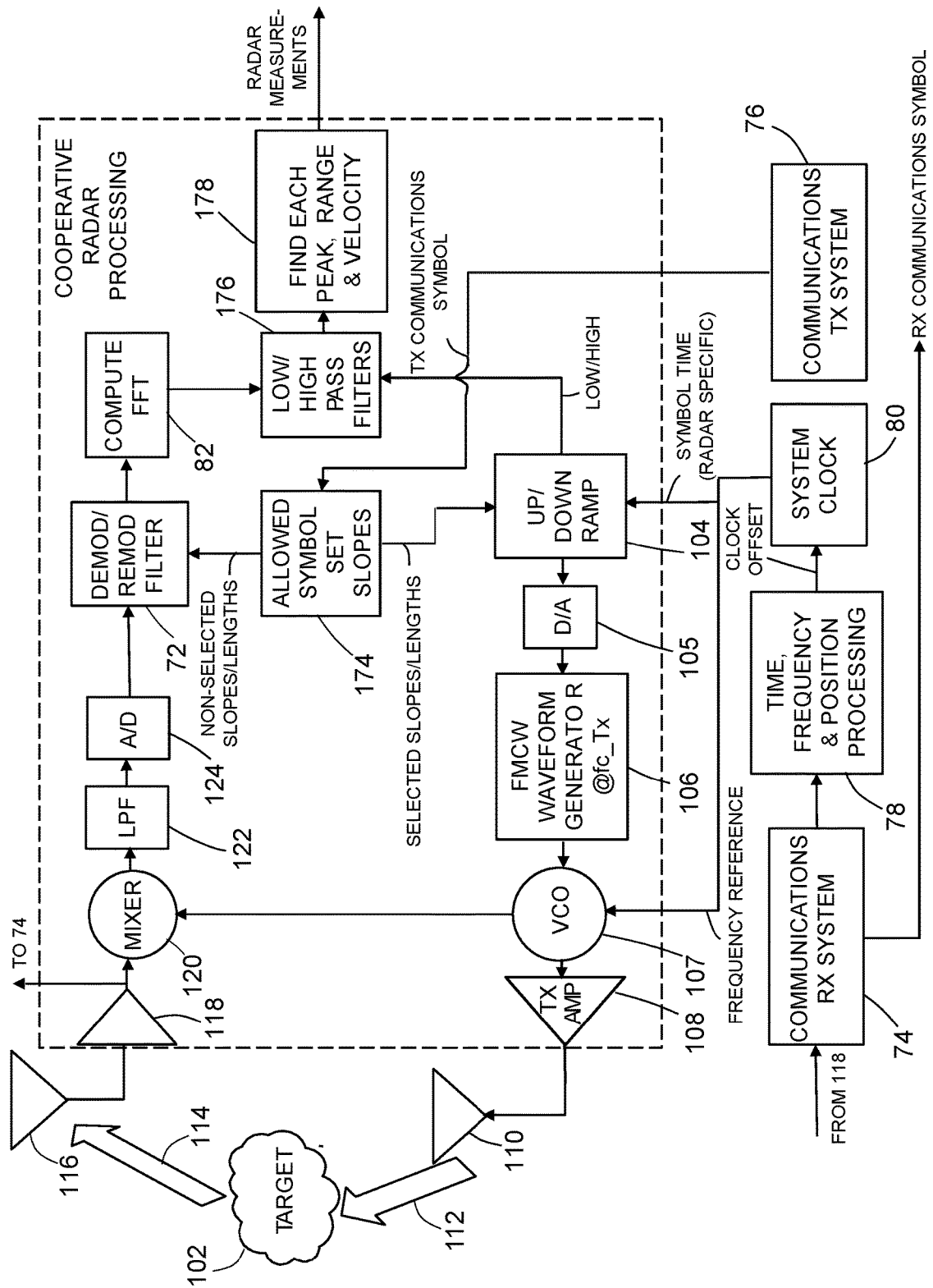
FIG. 19 is a flowchart showing the operation of a FMCW radar network in accordance with one embodiment.

In more detail, each cooperative FMCW radar receiver operates as follows:
(1) Using the communications network among the set of N cooperating FMCW radar systems, time and frequency are synchronized across the network of radar systems.
(2) The pulse start time (hereinafter "symbol time") is allocated across the network based on radar identification. For simplicity, suppose the radar systems are respectively numbered j=1, 2, . . . , N. Then the start time for radar system j will be $t_j=(j-1)*d_{max}$. This assumes that the symbol time $2T>Nd_{max}$. FIG. 18 shows these start times together with the respective time delay range $td_j$ for each radar system j (which delay ranges are assumed to all have a length $d_{max}$).
(3) The return signal is received by a radar system and then mixed with the transmitted chirp signal. As depicted in FIG. 19, the reception antenna 116 receives RF electromagnetic waves 114 reflected from the radar target 102. The electrical signals from the reception antenna 116 are amplified by low-noise reception amplifier 118. The frequency mixer 120 then mixes the received signals with the transmitted signals generated by the VCO 107 to produce first demodulated signals that contain phase information. The low-pass filter 122 performs low-pass filtering to obtain beat frequency signals which are sampled and converted into digital signals. After low pass filtering and analog-to-digital conversion, the digital samples pass through a demod/remod filter 72 to reduce interference due to signals received from other radar systems.

The demod/remod filter 72 attempts to detect (demodulate) every interfering chirped signal and then recreate each one at the correct amplitude and phase (remodulate) and subtract them out from the received signal. The demod/remod filter 72 does this by mixing (multiplying) the received signal (digitized by the analog-to-digital converter 124 shown in FIG. 19) by the conjugate of each non-selected (non-used) chirped symbol having non-selected chirp slopes $a_j$ and averaging the resulting output (producing an average "amplitude") and multiplying the generated chirp by this value to produce a recreated chirp that is subtracted from the received signal. All of the non-used chirps can be detected, generated and subtracted out in parallel.

The communications transmission system 76 identified in FIG. 19 includes the digital modulation symbol generator 136 identified in FIG. 4. That symbol generator outputs the slope and length of the selected symbol used in the transmit communication to an allowed symbol slopes module 174, which stores information defining the sets of allowed symbol slopes in a non-transitory tangible computer-readable storage medium. The allowed symbol slopes not selected by communications transmission system 76 are output to the demod/remod filter 72. The allowed symbol slopes selected by communications transmission system 76 are output to the up/down ramp controller 104.

Still referring to FIG. 19, a time, frequency and position processing module 78 is configured to compute the local position and time offset of the combined radar/communications system using the timing and position information received by the communications reception system 74. The local position data is included in the packet of data transmitted by the common radar/communications transmitter 131. The time offset is used to adjust a system clock 80. The system clock 80 provides the symbol time to up/down ramp controller 104 and a frequency reference to the voltage-controlled oscillator 107.

Figure 20:
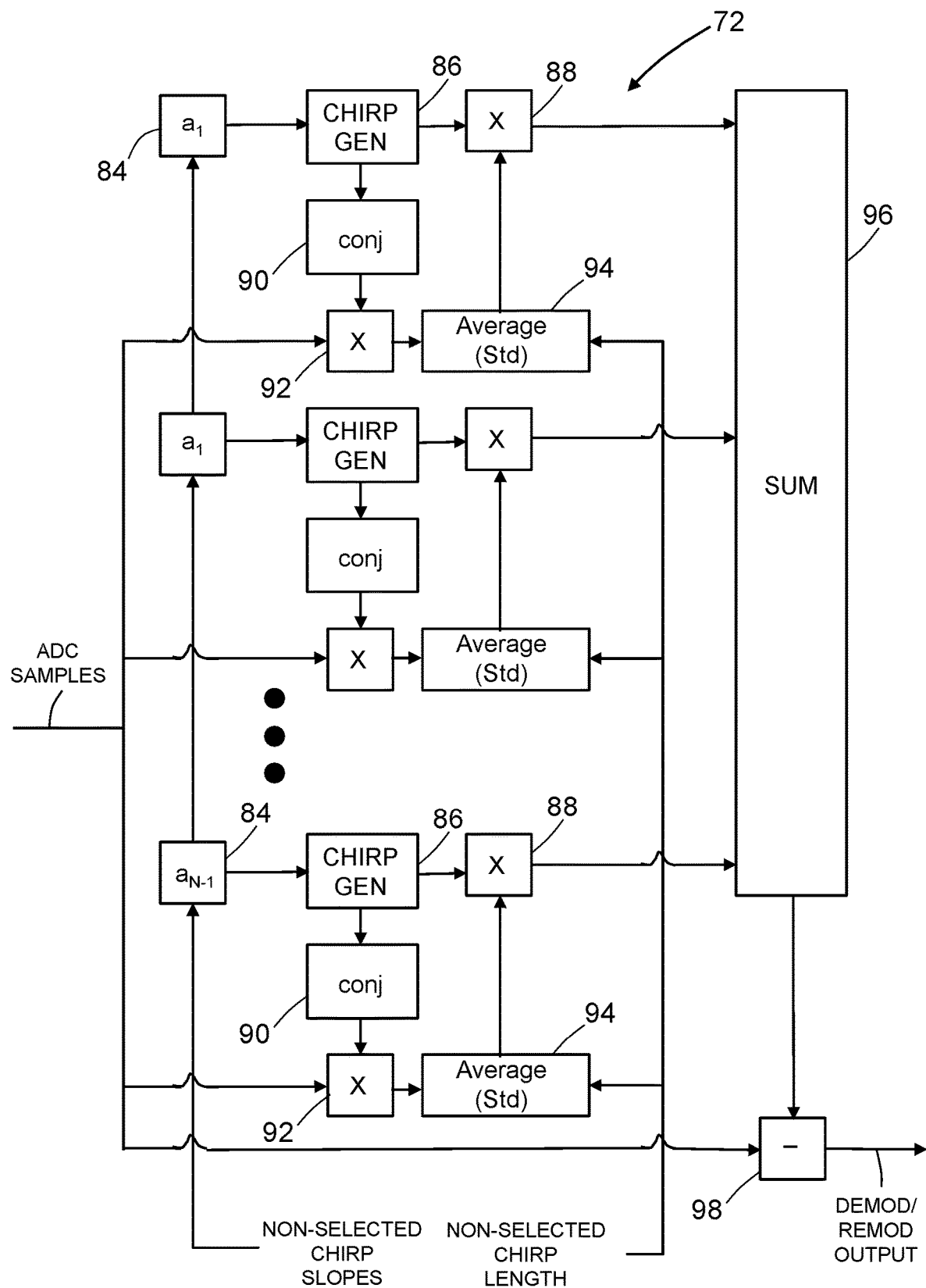
FIG. 20 is a flowchart identifying operations performed by a demod/remod filter in accordance with one embodiment.

FIG. 20 shows the operation of the demod/remod filter 72. Here the non-selected chirp slopes 84 are used to generate chirps (step 86) which are conjugated (step 90) and multiplied in mixer 92 with the digitized samples from the received signal. Then the average amplitude is computed (step 94). (The j-th box labeled "Average (Std)" denotes computing a running average of non-selected chirp lengths corresponding to the non-selected chirp slopes $a_j$ together with a running variance of that same length. The output is updated when the variance is at a minimum.) The chirp generated in step 86 is then multiplied by the average amplitude in mixer 88. These steps are performed in parallel for each non-selected chirp slope $a_j$. The recreated chirps output from the set of mixers 88 are then summed by a summer 96. The summed chirps are then subtracted from the received digitized samples (step 98 in FIG. 20) to produce the output of the demod/remod filter 72 (hereinafter "demod/remod filter output").

(4) Referring again to FIG. 19, the frequency content of the demod/remod filter output is then estimated by a computation module 82 that uses Fast Fourier transforms. The system then applies a low pass (high pass) frequency filter 176 based on the maximum return distance $R_{max}$ and maximum relative velocity $V_{max}$ to pass all frequencies below $$g_{up} \geq \frac{2R_{max}}{v_c} \cdot \frac{B}{T} + \frac{2f_c V_{max}}{v_c}$$

for the up chirp and to pass all frequencies above $$g_{down} \leq -\frac{2R_{max}}{v_c} \cdot \frac{B}{T} + \frac{2f_c V_{max}}{v_c}$$

for the down chirp.

(5) A target return signal processing module 178 then finds each peak in frequency in the resulting filtered set of radar returns for the up and down chirps and estimates both the relative range and velocity of the radar target 102 for each return using standard FMCW processing techniques. Those radar measurements are then reported to the system controller of the combined radar/communications system.

For the purpose of testing, a computer may be programmed to simulate the spectral performance of two platforms, each seeing the other's direct sidelobe or indirect ground return at the same distances for one particular example scenario. One such simulation showed that a 15-dB reduction in peak matched power was related to the relative difference between chirp slopes ΔBW, the symbol time T and the sample rate $f_s$ as $\Delta BW \cdot f_s/2T$. This reduction is reduced even further through the demod/remod filtering step. Using the demod/remod filter, the resulting chirp interference can be largely eliminated.

The technology disclosed in some detail above solves the problem of simultaneous radar operation across multiple platforms using the same RF spectrum. Using this technology, two or more radar systems do not have to occupy different RF bands in order to not interfere with each other. And the radar systems do not have to restrict their performance to a subset of their operational bandwidth, since they can all use the same full bandwidth. The technology disclosed herein also allows simultaneous communications across this network of radar platforms using the same transmitted signal.

A combined radar/communications system configured as described above has the following advantageous features: (1) Simultaneous FMCW operation from multiple dispersed nodes or platforms using the same RF spectrum is enabled. (2) Interplatform interference is reduced through time and frequency synchronization as well as controlling the pulse start times and using demod/remod filtering to reduce cross-radar interference. (3) Benefits are provided from time transfer and position determination through a broadcast signal using the same radar signal. (4) Simultaneous communications can also be supported in this mode. These features may be employed beneficially in many radar sensor networks that benefit from simultaneous FMCW radar operation.

Figure 21:
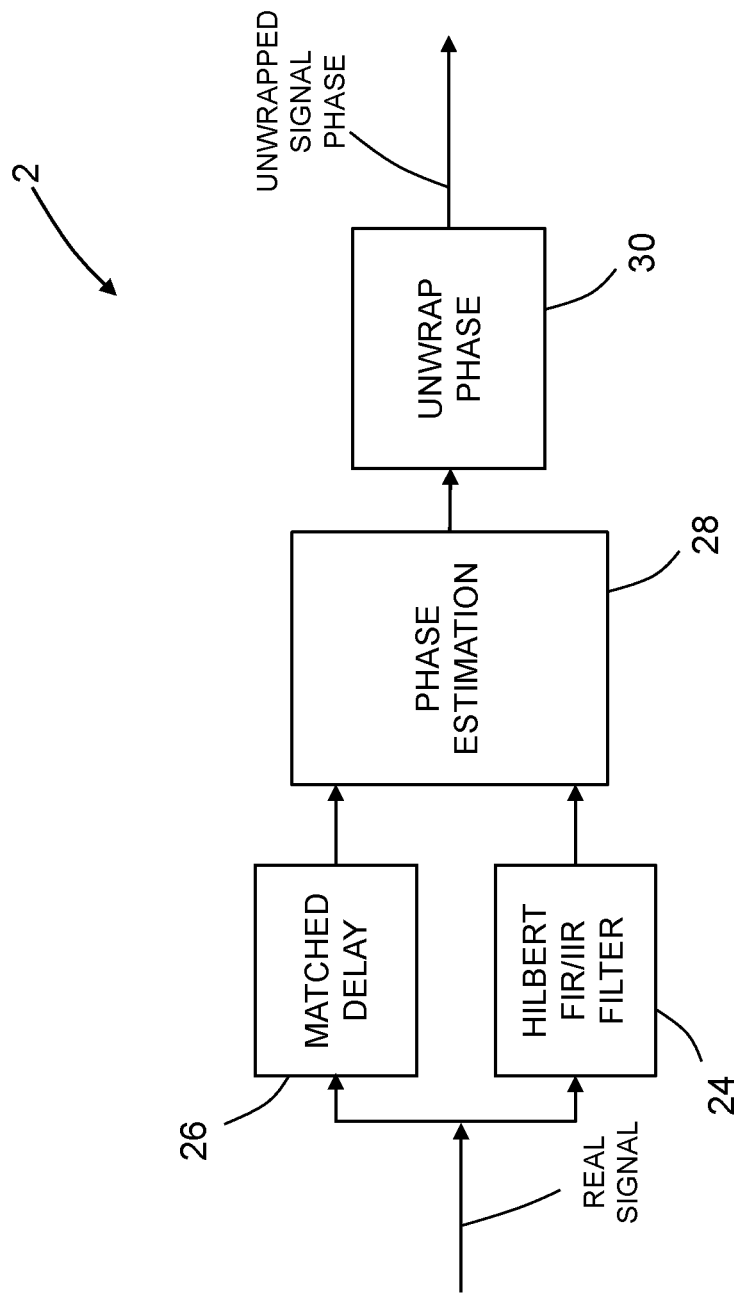
FIG. 21 is a block diagram identifying components of a subsystem for computing the unwrapped phase of a real signal.

The processing of the waveform by the communications receiver (the uppermost processing path in FIG. 4) requires detecting each symbol received, which in the instant case means detecting the symbol frequency slopes and phases for both the first and second symbol chirps. This process is shown in FIG. 21. The process may use any method to compute estimates of chirp slope (a) and initial phase (c) (recall that the parameter b need not be estimated unless an estimate of Doppler frequency is desired), but a streaming method is preferable to reduce processing latency and storage. One such method is described in U.S. patent application Ser. No. 15/652,027. The method in its simple form takes as input a sampled form of a received signal and provides algorithms that do two things: (1) the method detects when linear phase-modulated signals are present using a calculated metric value (the metric is denoted by d in U.S. patent application Ser. No. 15/652,027; and (2) the method estimates three fixed parameters (see parameters a, b, c in Eq. (9) below) in the linear phase-modulated signal. The linear phase-modulated signal is described by the equation:

$$s(t)=e^{2\pi j(at^2+bt+c)} \quad (9)$$

where t varies over time and a, b, c are parameters (hereinafter "coefficients") of a polynomial function that control the chirp slope (a.k.a. chirp rate), initial frequency and initial phase of the chirp signal. One can use parts of the methodology disclosed in U.S. patent application Ser. No. 15/652,027 to estimate the slope coefficient a and the phase coefficient c and in turn reliably detect the CRCW symbols being transmitted. The method of symbol detection for CRCW will be described in some detail below. However, there are other additional aspects to the design of a communications receiver which will not be described in detail because such details are well known to persons skilled in the art. This disclosure will focus on the reception and detection of the symbols being received in a CRCW receiver. The processing steps to estimate a and c are as follows.

First, a mixed and down-converted sampled data signal $\{s_n\}$ comes into the baseband communications signal processing module 138 identified in FIG. 4. Then a phase estimate is done. If the incoming digital signal is complex valued, the phase can be computed as atan2(im, re), where the complex signal sample is of the form (re+i(im)). The function atan2( ) is the arctangent function with two arguments. For any real number (e.g., floating point) arguments x and y not both equal to zero, atan2(y, x) is the angle in radians between the positive x-axis of a plane and the point given by the coordinates (x, y) on it. There are simplifications to calculating phase that are easier to implement in practice than a full calculation of the atan2( ) function. Alternate methods include: CORDIC (for COordinate Rotation Digital Computer, which is a simple and efficient algorithm to calculate hyperbolic and trigonometric functions, typically converging with one digit (or bit) per iteration), lookup tables and interpolation, and Chebyshev approximation. These are not further described herein since they are well known and standard. If, however, the incoming signal is real, the usual method to estimate phase involves using either a quadrature demodulator or a Hilbert filter before calculating the phase. The structure and function of a quadrature demodulator is well known. See, for example, U.S. Pat. Nos. 5,426,669, 6,191,649 and 6,310,513. There are also well-known different ways to form an analytic (complex) signal using a Hilbert filter. FIG. 21 shows one particular method 2 using a parallel delay and Hilbert filter approach before phase estimation. The final step (after phase estimation) is to unwrap the raw phase value.

Referring to FIG. 21, the incoming signal is real. An analytic signal is formed using a Hilbert filter 24 and a matched delay 26 arranged in parallel. The matched delay 26 provides a delay that matches the delay produced by the Hilbert filter 24. The delayed (real) and filtered (imaginary) signals are output in parallel to a phase estimator 28, which estimates the phases of the streaming signals. (Note that a normalized phase between −1 and 1 is used in what follows, rather than −π and π.) The signal phases output by phase estimator 28 are then unwrapped by a phase unwrapper 30. (As used herein, the verb "to unwrap" means to add 2π for each complete cycle of the sinusoidal signal.) Unwrapping of phase can be done in several different standard ways. A common and simple approach is to do the following: given a phase estimate θ and the previous phase sample $\theta_0$, correct the phase estimate θ by adding multiples of ±2π (or ±1 if normalized) when $(\theta - \theta_0)$ is less than −π (normalized −1) (respectively greater than π (normalized +1)).

Next, for each slope length of $m = T_i$ for $i = 0, \ldots, C-1$, the following iteration computes an estimate for a and c at each time step n. Let $Sy_{-1} = 0$ and $Sxy_{-1} = 0$. Then iterating over the range $n = 0, \ldots, C-1$ using the following equations gives final estimates $\hat{a}_{C-1}$ and $\hat{c}_{C-1}$ for parameters a and c in Eq. (9):

$$Sy_n = Sy_{n-1} + \theta_n - \theta_{n-m}$$

$$Sxy_n = Sxy_{n-1} - Sy_{n-1} + m\theta_n$$

$$\hat{a}_n = \hat{a}_{n-1} + A_1(m)(-2Sxy_{n-1} + Sy_{n-1} + m\theta_n) + A_2(m)(-Sy_{n-1} + m\theta_n) + A_3(m)(\theta_n - \theta_{n-m}) \quad (10)$$

$$\hat{c}_n = \hat{c}_{n-1} + C_1(m)(-2Sxy_{n-1} + Sy_{n-1} + m\theta_n) + C_2(m)(-Sy_{n-1} + m\theta_n) + C_3(m)(\theta_n - \theta_{n-m}) \quad (11)$$

Here the six values $A_1(m)$-$A_3(m)$ and $C_1(m)$-$C_3(m)$ are part of a 3×3 matrix M that is only dependent on the estimation window length $m = T_i$ and can be pre-computed for each chirp slope. The 3×3 matrix M is defined as follows:

$$M = \begin{bmatrix} \sum t_i^4 & \sum t_i^3 & \sum t_i^2 \\ \sum t_i^3 & \sum t_i^2 & \sum t_i \\ \sum t_i^2 & \sum t_i & \sum 1 \end{bmatrix} = \begin{bmatrix} \frac{A_1(m)}{C_1(m)} t_i^3 & \frac{A_2(m)}{C_2(m)} t_i^2 & \frac{A_3(m)}{C_3(m)} t_i \end{bmatrix}$$

Here the sums are over M consecutive samples of the phase and $t_i$ denotes the relative times of the M samples and can be defined as $t_i = i \cdot f_s$. This approach comes from a direct application of ordinary least squares or linear regression.

Figure 22:
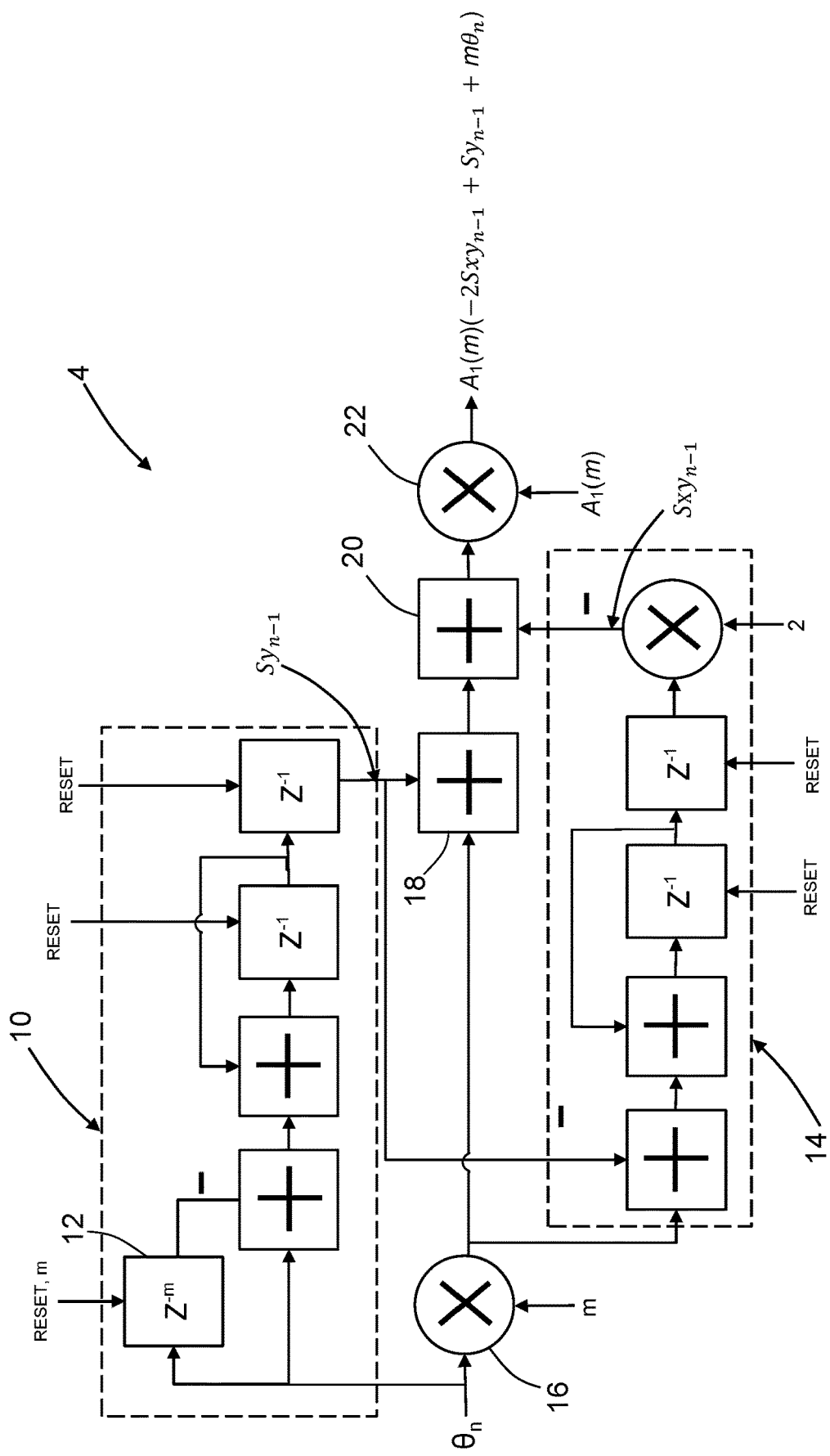
FIGS. 22-24 are diagrams symbolically representing electronic circuitry for respectively digitally computing the values of three terms in an equation for estimating a slope coefficient representing a chirp slope in accordance with one embodiment.
Figure 23:
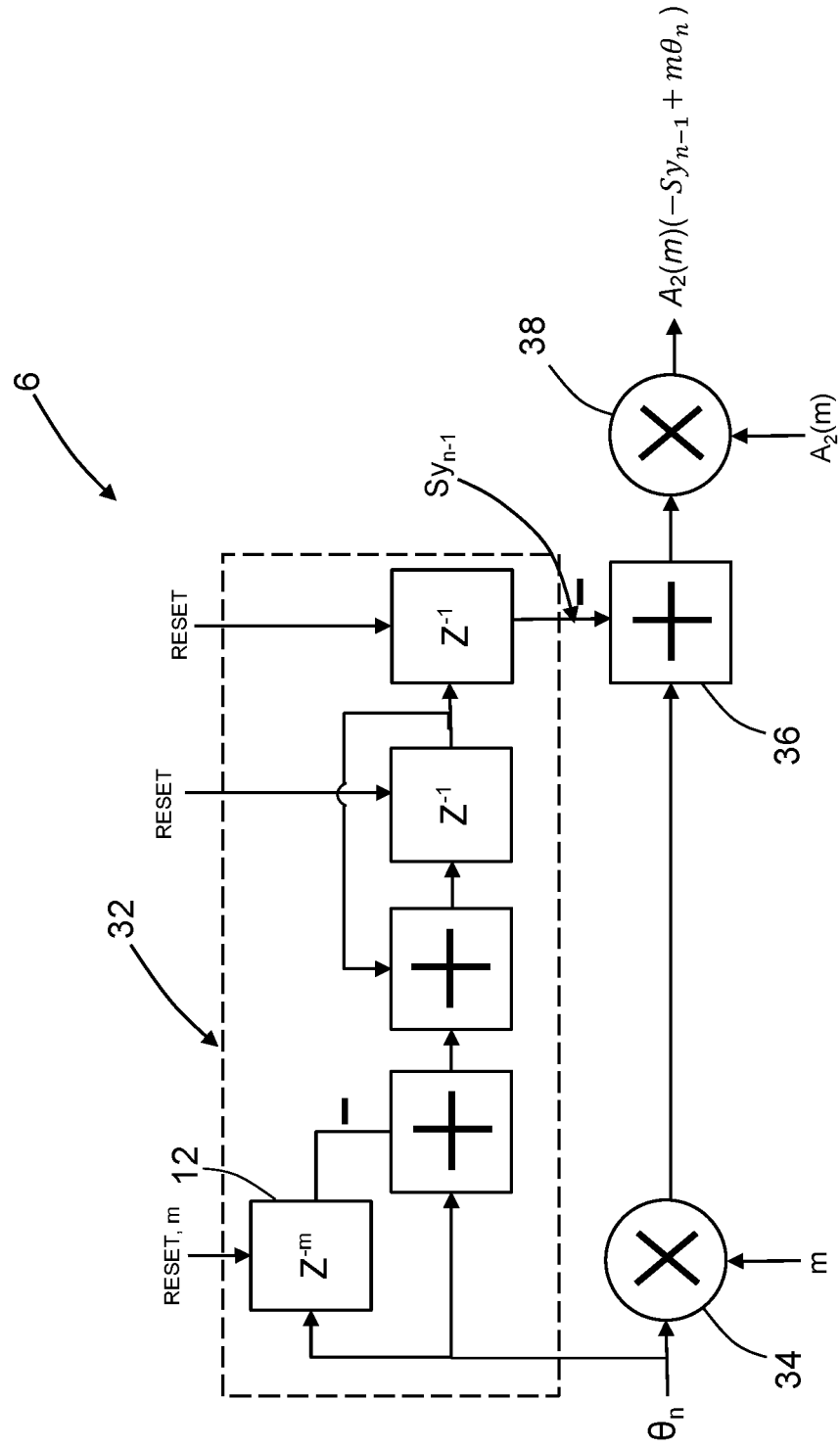
Figure 24:
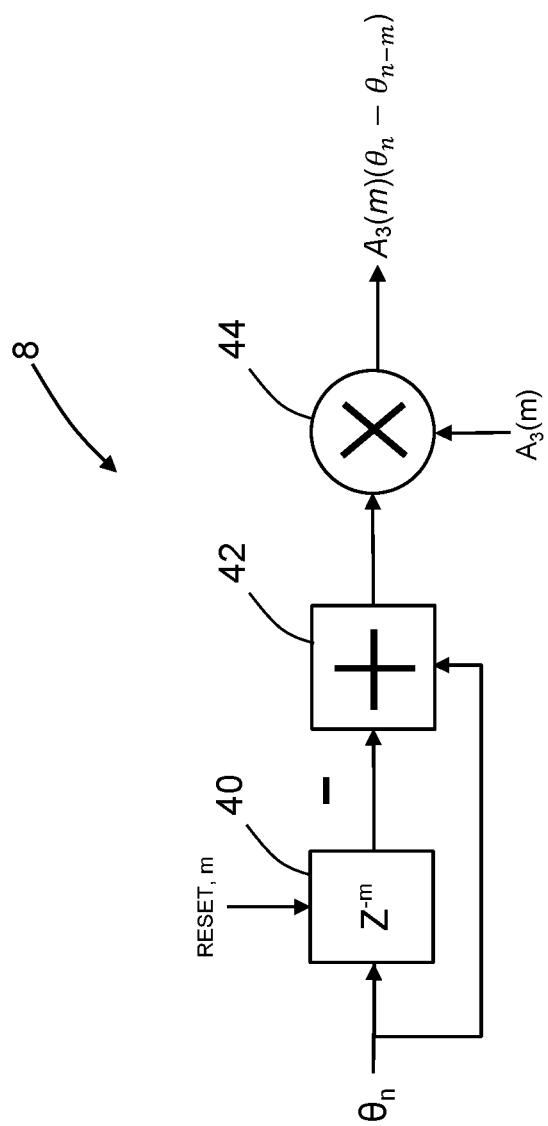

FIGS. 22-24 are diagrams symbolically representing electronic circuitry for respectively computing the values of three terms for estimating the chirp slope of the received signal (namely, the terms $A_1(m)(-2Sxy_{n-1} + Sy_{n-1} + m\theta_n)$, $A_2(m)(-Sy_{n-1} + m\theta_n)$ and $A_3(m)(\theta_n - \theta_{n-m})$ in Eq. (10)) implemented in a digital form that may be instantiated in a field-programmable gate array (FPGA) or an application-specific integrated circuit (ASIC).

FIG. 22 shows an implementation 4 of a method for estimating the first term $A_1(m)(-2Sxy_{n-1} + Sy_{n-1} + m\theta_n)$ in Eq. (10). The notation used in FIG. 22 (and in FIGS. 21 and 22) is as follows: $Z^{-1}$ denotes a register or memory element which serves to delay a value by one clock period; the encircled "+" symbols denote a summer; and the encircled "×" symbols denote a multiplier. The phase estimate $\theta_n$ is inputted to a module 10 that estimates the value of parameter $Sy_{n-1}$. The module 10 includes a delay buffer 12 which can be programmed for different delay values (up to some implementation-dependent maximum) where the delay is set equal to the slope length m. The phase estimate $\theta_n$ is also inputted to multiplier 16, which outputs the term $m\theta_n$ to a module 14 that estimates the value of parameter $-2Sxy_{n-1}$. The summer 18 adds the estimated values output by module 10 and multiplier 16 to form the sum $(Sy_{n-1} + m\theta_n)$. The summer 20 then adds the estimated value output by module 14 to the sum output by summer 18 to form the sum $(-2Sxy_{n-1} + Sy_{n-1} + m\theta_n)$. The multiplier 22 then multiplies the sum output by summer 20 and the value $A_1(m)$ to produce a value for the first term $A_1(m)(-2Sxy_{n-1} + Sy_{n-1} + m\theta_n)$ in Eq. (10).

FIG. 23 shows an implementation 6 of a method for estimating the second term $A_2(m)(-Sy_{n-1} + m\theta_n)$ in Eq. (10). The phase estimate $\theta_n$ is inputted to a module 32 that estimates the value of parameter $Sy_{n-1}$. The phase estimate $\theta_n$ is also inputted to multiplier 34, which outputs the term $m\theta_n$ to a summer 36. The summer 36 adds the estimated values output by module 32 and multiplier 34 to form the sum $(-Sy_{n-1} + m\theta_n)$. The multiplier 38 then multiplies the sum output by summer 36 and the value $A_2(m)$ to produce a value for the second term $A_2(m)(-Sy_{n-1} + m\theta_n)$ in Eq. (10).

FIG. 24 shows an implementation 8 of a method for estimating the third term $A_3(m)(\theta_n - \theta_{n-m})$ in Eq. (10). The phase estimate $\theta_n$ is inputted to a delay buffer 40 that delays the phase estimate by the slope length m. The phase estimate $\theta_n$ is also inputted to a summer 42 which adds the incoming phase estimate to the negative value of the delayed phase estimate output from delay buffer 40 to form the sum $(\theta_n - \theta_{n-m})$. The multiplier 44 then multiplies the sum output by summer 42 and the value $A_3(m)$ to produce a value for the third term $A_3(m)(\theta_n - \theta_{n-m})$ in Eq. (10).

Figure 25:
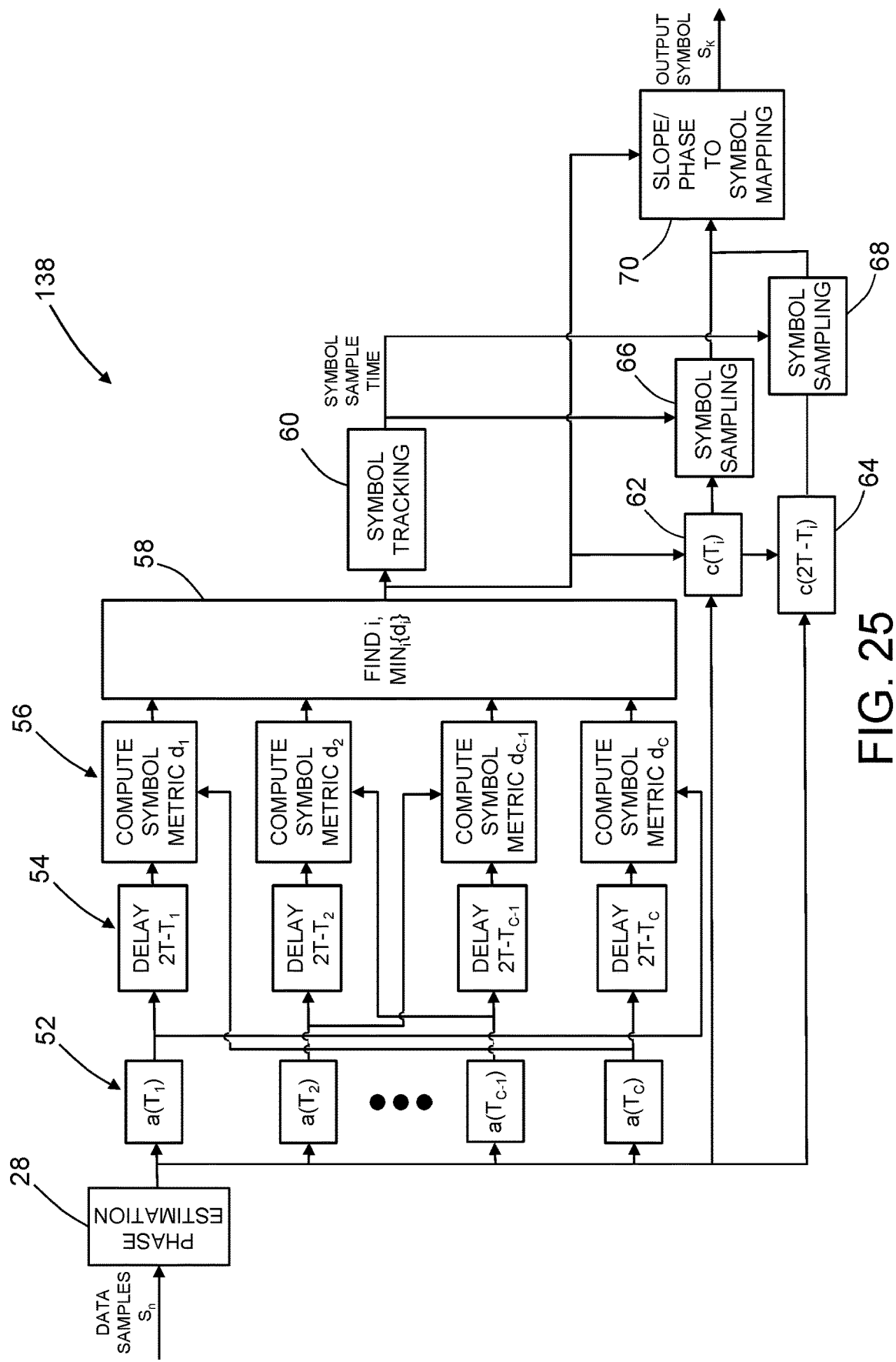
FIG. 25 is a flowchart identifying processing steps for baseband communications processing in accordance with one embodiment.

FIG. 25 is a flowchart identifying steps of a method for baseband communications processing (performed by the baseband communications signal processing module 138 identified in FIG. 4) in accordance with one embodiment. The process partly depicted in FIG. 25 can generate parameter estimates using streaming (or on-the-fly) calculations and therefore is suitable for FPGA or ASIC or other hardware-based implementation. In the following description, the term "block" refers to an electronic circuit embodied in hardware. The baseband communications processing depicted in FIG. 25 works as follows.

Each of the slope coefficient estimation blocks 52 that do the calculations from Eq. (10) are labeled as $a(T_i)$ in FIG. 25 and similarly for the phase coefficient estimation block 62 labeled as $c(T_i)$ for Eq. (11). Only the references to $A_i(m)$ in the implementation figures (FIGS. 22-24) need to be changed to $C_i(m)$ to calculate $c(T_i)$.

Then a set of delay buffers 54, each of length $2T - T_i$, is used to line up the slope estimates for up and down chirps for each symbol i. Finally, symbol metric computation blocks 56 compute a symbol metric $d_i$ for each such symbol slope using the following equation:

$$d_i = \left(a_i - \frac{B}{T_i}\right)^2 + \left(a_{c-i} - \frac{B}{2T - T_i}\right)^2$$

The smallest of the symbol metrics $d_i$ is then chosen in block 58 and that information is passed to both a symbol tracking block 60 and phase coefficient estimation blocks 62 and 64 which estimate phase coefficients c of each of the complementary chirps using Eq. (11). The symbol tracking block 60 identifies the time of the minimum value of the symbol metric of the chosen chirp slope and, using a standard symbol time filter, produces a symbol sample time signal that is used by respective symbol sampling blocks 66 and 68 to sample the phases computed from the phase coefficient estimation blocks 62 and 64. Lastly, the mapping block 70 takes the three identified values $\{a(T_i), c(T_i), c(2T-T_i)\}$ and from these values estimates the three indices of the received symbol by computing i, j and l as follows:

$$\left\{ i = \left\langle \frac{\left(\frac{B}{a(T_i)} - T_{min}\right)}{(C-1)} \right\rangle, \; j = 1 \left\langle \frac{D \cdot (c(T_i) + \pi)}{2\pi} \right\rangle, \; l = \left\langle \frac{D \cdot (c(2T - T_i) + \pi)}{2\pi} \right\rangle \right\}$$

This triple of integers defines the received symbol. Here the angled brackets denote rounding to the nearest integer.

Referring again to FIG. 4, the processing steps performed by the digital modulation symbol generator 136, which converts the communications data to symbols, will now be described in some detail. This processing block takes sequential sets of bits to be transmitted and converts them to digital values characterizing the symbols representing the communications data to be transmitted. It is very similar to how symbols get mapped to (I, Q) constellations before modulation. If the values of C and D are powers of 2, the main steps are as follows:

(1) Take a sequential set of K input bits, split the input bits into three sets of $\log_2 K_C$, $\log_2 K_D$ and $\log_2 K_D$ bits;

(2) Map the first set to a chirp slope of the first chirp of each symbol by interpreting the bits as a number i from 0 to C−1 and then compute $T_i = T_{min} + (T_{max} - T_{min}) \cdot i/C;$ (3) Map the second set to an initial phase of the first chirp of the symbol by interpreting the bits as a number j from 0 to D−1 and then compute $\Theta_j = -\pi + 2\pi(j/D);$ (4) Map the third set to an initial phase of the second chirp of the symbol by interpreting the bits as a number 1 from 0 to D−1 and then compute $\Phi_l = -\pi + 2\pi(l/D).$ These digital values are sent the combined radar/communications waveform generator 106' (see FIG. 4), which produces a modulating signal that is fed to the VCO 107 to produce a final RF chirped signal with the appropriate slope and phases. If the values of C and D are not powers of 2, this mapping can be accomplished through standard arithmetic coding techniques, where the bits to be sent are encoded in base $C \cdot D^2$ and then each digit $\delta$, $0 \leq \delta < C \cdot D^2$, is associated with the symbol time $T_i$ via $T_i = T_{min} + (T_{max} - T_{min}) \cdot \lfloor \delta/D^2 \rfloor / C$ where $\lfloor x \rfloor$ denotes the floor function, the greatest integer less than or equal to x.

The phases can then be found by setting $\delta_r = \text{rem}(\delta, D^2)$ (the remainder of dividing $\delta$ by $D^2$). Then $\Theta_j = -\pi + 2\pi \lfloor \delta_r/D \rfloor /D$ Similarly, set $\delta_s = \text{rem}(\delta_r, D)$ and $\Phi_l = -\pi + 2\pi(\delta_s/D).$ There are a number of variants of the waveform and architecture disclosed in detail above. For examples, this architecture could operate using a direct RF conversion architecture (see FIG. 4) where the analog-to-digital converter can be moved to directly after the low-noise amplifier. The processing that follows the analog-to-digital converter would then be digital instead of analog. This disclosure describes the case where each transmitter uses its own frequency. This prevents interference between two or more such systems. In alternative embodiments, such systems could also multiplex their outputs so that this does not happen. This could be controlled by a higher level protocol. Alternatively, the two systems could use the same frequency and through standard spread spectrum symbol coding, both could operate on the same frequency, but with greater mutual interference. The specific calculations described above with reference to FIG. 25 are based on uniformly spaced chirp times and phases. If this is not the case, the calculations would have to be modified via standard techniques.

A method has been described for combining radar and communications functions using a set of common hardware and common signal processing together with a common waveform family. Linear frequency-modulated symbols are used to send communications at the same time that the symbols are also used to measure range and range rate (or relative velocity) of signal reflections off of multiple targets (as a radar would do). In addition, radar detection and communications reception can be done in a streaming fashion, so as to avoid additional latency. Both range, range rate and symbol values are produced every symbol period T. Thus there is no need for synchronization intervals or periods of inactivity for either the radar or the communications system. This also means that the waveform is ideal for point and shoot networking applications where packets are short in time and data synchronization means inefficiency. The foregoing features provide benefits, including sharing of antennas for both systems when applicable, reducing cost associated with interference (primarily radio frequency interference) of two such systems on a single platform, and reducing cost and complexity so that upgrades of both systems can be accomplished at the same time and integration problems are taken care of in the design process.

Certain systems, apparatus, applications or processes have been described herein as including a number of modules. A module may be a unit of distinct functionality that may be implemented in software, hardware, or combinations thereof, except for those modules which are preferably implemented as hardware or firmware to enable streaming calculations as disclosed herein. When the functionality of a module is performed in any part through software, the module can include a non-transitory tangible computer-readable storage medium.

While systems and methods for enabling time transfer and position determination in a combined radar/communications system and for enabling two or more dispersed platforms to simultaneously operate their respective FMCW radar systems using the same RF spectrum have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

The embodiments disclosed above use one or more processing or computing devices. Such devices typically include a processor, processing device, or controller, such as a general-purpose central processing unit, a microcontroller, a reduced instruction set computer processor, an ASIC, a programmable logic circuit, an FPGA, a digital signal processor, and/or any other circuit or processing device capable of executing the functions described herein. The methods described herein may be encoded as executable instructions embodied in a non-transitory tangible computer-readable storage medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the terms "processor" and "computing device".

The process claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the process claims be construed to exclude any portions of two or more steps being performed concurrently or alternatingly unless the claim language explicitly states a condition that precludes such an interpretation.

The invention claimed is:

1. A distributive collaborative radar network comprising first and second radar systems having synchronized respective clocks, wherein each of the first and second radar systems comprises a respective common radar/communications transmitter comprising a transmission antenna and a combined radar and communications receiver comprising a common reception antenna, a radar receiver connected to the common reception antenna and a communications receiver connected to the common reception antenna, wherein:
the common radar/communications transmitters of the first and second radar systems are each configured to convert respective periodic time and position information into respective timing headers representing successive times and respective position prediction sections representing successive positions which are valid for those respective times in a respective packet of data and then transmit frequency-modulated continuous-wave signals representing the respective packet of data; and
the communications receivers of the first and second radar systems are each configured to extract timing and position information from received frequency-modulated continuous-wave signals and compute a respective local position and respective time offset using the timing and position information,
wherein the common radar/communications transmitter of the first radar system is further configured to transmit frequency-modulated continuous-wave signals having a first chirp slope and the common radar/communications transmitter of the second radar system is further configured to transmit frequency-modulated continuous-wave signals having a second chirp slope, and
wherein the radar receiver of the first radar system is further configured to demodulate received frequency-modulated continuous-wave signals to form return signals and then filter out return signals having the second chirp slope when the second chirp slope is different than the first chirp slope.

2. The distributive collaborative radar network as recited in claim 1, wherein the radar receiver of the second radar system is further configured to demodulate received frequency-modulated continuous-wave signals to form return signals and then filter out return signals having the first chirp slope when the second chirp slope is different than the first chirp slope.

3. The distributive collaborative radar network as recited in claim 1, wherein:
the radar receiver of the first radar system is further configured to filter out return signals derived from frequency-modulated continuous-wave signals received from beyond a maximum return distance; and
the common radar/communications transmitter of the second radar system is further configured to transmit frequency-modulated continuous-wave signals having the second chirp slope with a start time delay equal to at least a time for the frequency-modulated continuous-wave signals having the second chirp slope to travel the maximum return distance of the radar receiver of the first radar system.

4. The distributive collaborative radar network as recited in claim 3, wherein the radar receiver of the first radar system comprises a first analog-to-digital converter that converts analog return signals to digital return signals, and the radar receiver of the second radar system comprises a second analog-to-digital converter that converts analog return signals to digital return signals.

5. The distributive collaborative radar network as recited in claim 4, wherein the radar receiver of the first radar system further comprises a first demod/remod filter that is configured to filter out return signals having the second chirp slope.

6. The distributive collaborative radar network as recited in claim 5, wherein the radar receiver of the second radar system further comprises a second demod/remod filter that is configured to filter out return signals having the first chirp slope.

7. The distributive collaborative radar network as recited in claim 5, wherein the radar receiver of the first radar system further comprises a high-pass filter that receives return signals which have passed through the first demod/remod filter and passes return signals having frequencies above a threshold corresponding to the maximum return distance for up chirps.

8. The distributive collaborative radar network as recited in claim 7, wherein the radar receiver of the first radar system further comprises a low-pass filter that receives return signals which have passed through the first demod/remod filter and passes return signals having frequencies below a threshold corresponding to a maximum return distance for down chirps.

9. The distributive collaborative radar network as recited in claim 8, wherein the radar receiver of the first radar system further comprises a radar signal processing module configured to find a peak in frequency in the return signals which have passed through the high- and low-pass filters for up and down chirps and estimate a range and a velocity of a target object.

10. The distributive collaborative radar network as recited in claim 1, wherein the timing headers and position prediction sections are in a form of supersymbols, each supersymbol being a concatenation of pairs of up chirps and down chirps of equal chirp lengths, the up chirps of the concatenation having the same up phase and the down chirps of the concatenation having the same down phase.

11. The distributive collaborative radar network as recited in claim 1, wherein the data in each packet further includes payload sections made up of multiple symbols and timing header/position prediction slots made up of multiple supersymbols, wherein the payload sections and timing header/position prediction slots alternate in sequence within the packet, and each timing header/position prediction slot includes a respective timing header and a respective position prediction section which is contiguous with the respective timing header.

12. The distributive collaborative radar network as recited in claim 11, wherein:
supersymbols in timing headers of the timing header/position prediction slots of supersymbols transmitted by the common radar/communications transmitter of the first radar system are phase encoded with time information indicating a duration of time for which a prediction of a position of the first radar system was valid; and
supersymbols in position prediction sections of the timing header/position prediction slots transmitted by the common radar/communications transmitter of the first radar system are phase encoded with position information indicating the prediction of the position of the first radar system.

13. A distributive collaborative radar network comprising first and second radar systems having synchronized respective clocks, wherein each of the first and second radar systems comprises a respective common radar/communications transmitter comprising a transmission antenna and a combined radar and communications receiver comprising a common reception antenna, a radar receiver connected to the common reception antenna and a communications receiver connected to the common reception antenna, wherein:
the common radar/communications transmitters of the first and second radar systems are each configured to convert respective periodic time and position information into respective timing headers representing successive times and respective position prediction sections representing successive positions which are valid for those respective times in a respective packet of data and then transmit frequency-modulated continuous-wave signals representing the respective packet of data; and
the communications receiver of the first and second radar systems are each configured to extract timing and position information from received frequency-modulated continuous-wave signals and compute a respective local position and respective time offset using the timing and position information,
wherein the common radar/communications transmitter of the first radar system is further configured to transmit frequency-modulated continuous-wave signals having a first chirp slope;
the radar receiver of the first radar system is further configured to filter out return signals derived from frequency-modulated continuous-wave signals received from beyond a maximum return distance; and
the common radar/communications transmitter of the second radar system is further configured to transmit frequency-modulated continuous-wave signals having a second chirp slope with a start time delay equal to at least a time for the frequency-modulated continuous-wave signals having the second chirp slope to travel the maximum return distance of the radar receiver of the first radar system.

14. The distributive collaborative radar network as recited in claim 13, wherein the radar receiver of the first radar system is further configured to filter out return signals having the second chirp slope and the radar receiver of the second radar system is further configured to filter out return signals having the first chirp slope when the second chirp slope is different than the first chirp slope.

15. The distributive collaborative radar network as recited in claim 14, wherein:
the radar receiver of the first radar system further comprises a first demod/remod filter that is configured to filter out return signals having the second chirp slope; and
the radar receiver of the second radar system further comprises a second demod/remod filter that is configured to filter out return signals having the first chirp slope.

16. The distributive collaborative radar network as recited in claim 15, wherein the radar receiver of the first radar system further comprises:
a high-pass filter that receives digital return signals which have passed through the first demod/remod filter and passes return signals having frequencies above a threshold corresponding to the maximum return distance for up chirps; and
a low-pass filter that receives digital return signals which have passed through the first demod/remod filter and passes return signals having frequencies below a threshold corresponding to a maximum return distance for down chirps.

17. A method for reducing interference between radar systems of a distributive collaborative radar network, comprising:
synchronizing first and second radar systems of a distributive collaborative radar network in time and frequency of transmission;
transmitting frequency-modulated continuous-wave signals comprising symbols and supersymbols from the first and second radar systems, wherein the first radar system transmits frequency-modulated continuous-wave signals having a first chirp slope and the second radar system transmits frequency-modulated continuous-wave signals having a second chirp slope;
receiving at the first radar system frequency-modulated continuous-wave signals;
mixing frequency-modulated continuous-wave signals received by the first radar system with frequency-modulated continuous-wave signals transmitted by the first radar system and outputting return signals;
using a first demod/remod filter in the first radar system to filter out return signals having the second chirp slope when the second chirp slope is different than the first chirp slope and not filter out return signals having the second chirp slope when the second chirp slope is the same as the first chirp slope; and
estimating a range and a velocity of a target object relative to the first radar system based on beat frequencies derived from the return signals not filtered out by the first demod/remod filter.

18. The method as recited in claim 17, further comprising:
receiving at the second radar system frequency-modulated continuous-wave signals;
mixing frequency-modulated continuous-wave signals received by the second radar system with frequency-modulated continuous-wave signals transmitted by the second radar system and outputting return signals;

using a second demod/remod filter in the second radar system to filter out return signals having the first chirp slope when the second chirp slope is different than the first chirp slope and not filter out return signals having the first chirp slope when the second chirp slope is the same as the first chirp slope; and estimating a range and a velocity of a target object relative to the second radar system based on beat frequencies derived from the return signals not filtered out by the second demod/remod filter.

19. The method as recited in claim 17, further comprising using high and low pass filters in the first radar system to filter out return signals derived from frequency-modulated continuous-wave signals received from beyond a maximum return distance, wherein the frequency-modulated continuous-wave signals transmitted by the second radar system have a start time delay equal to at least a time for the frequency-modulated continuous-wave signals having the second chirp slope to travel the maximum return distance of the radar receiver of the first radar system.

20. The method as recited in claim 17, further comprising:

converting respective periodic time and position information of the second radar system into respective timing headers representing successive times and respective position prediction sections representing successive positions of the second radar system which are valid for those respective times in a respective packet of data and then transmit frequency-modulated continuous-wave signals representing the respective packet of data;

extracting timing and position information from frequency-modulated continuous-wave signals received by the first radar system from the second radar system; and computing a respective local position and respective time offset of the first radar system using the timing and position information from the second radar system.

* * * * *